(12) United States Patent
Tsubuku et al.

(10) Patent No.: US 10,559,667 B2
(45) Date of Patent: Feb. 11, 2020

(54) SEMICONDUCTOR DEVICE AND METHOD FOR MEASURING CURRENT OF SEMICONDUCTOR DEVICE

(71) Applicant: Semiconductor Energy Laboratory Co., LTD., Atsugi-shi, Kanagawa-ken (JP)

(72) Inventors: Masashi Tsubuku, Kanagawa (JP); Shunpei Yamazaki, Tokyo (JP); Hidetomo Kobayashi, Kanagawa (JP); Kazuaki Ohshima, Kanagawa (JP); Masashi Fujita, Tokyo (JP); Toshihiko Takeuchi, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 399 days.

(21) Appl. No.: 14/830,817

(22) Filed: Aug. 20, 2015

(65) Prior Publication Data

US 2016/0054362 A1 Feb. 25, 2016

(30) Foreign Application Priority Data

Aug. 25, 2014 (JP) .................................. 2014-170756
Aug. 25, 2014 (JP) .................................. 2014-170757

(51) Int. Cl.
| | |
|---|---|
| *H01L 29/24* | (2006.01) |
| *H01L 29/786* | (2006.01) |
| *H01L 27/12* | (2006.01) |
| *H01L 27/06* | (2006.01) |

(52) U.S. Cl.
CPC .......... *H01L 29/24* (2013.01); *H01L 27/1255* (2013.01); *H01L 29/7869* (2013.01); *H01L 29/78696* (2013.01); *H01L 27/0629* (2013.01)

(58) Field of Classification Search
None
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| | (Continued) | |

FOREIGN PATENT DOCUMENTS

| | | |
|---|---|---|
| EP | 1737044 A | 12/2006 |
| EP | 2226847 A | 9/2010 |
| | (Continued) | |

OTHER PUBLICATIONS

Coates.D et al., "Optical Studies of The Amorphous Liquid-Cholesteric Liquid Crystal Transition:The "Blue Phase"", Physics Letters, Sep. 10, 1973, vol. 45A, No. 2, pp. 115-116.

(Continued)

*Primary Examiner* — Steven B Gauthier
(74) *Attorney, Agent, or Firm* — Nixon Peabody LLP; Jeffrey L. Costellia

(57) ABSTRACT

A semiconductor device in which a transistor has the characteristic of low off-state current is provided. The transistor comprises an oxide semiconductor layer having a channel region whose channel width is smaller than 70 nm. A temporal change in off-state current of the transistor over time can be represented by Formula (a2). In Formula (a2), $I_{OFF}$ represents the off-state current, t represents time during which the transistor is off, $\alpha$ and $\tau$ are constants, $\beta$ is a constant that satisfies $0 < \beta \le 1$, and $C_S$ is a constant that represents load capacitance of a source or a drain.

$$I_{OFF}(t) = C_S \times \frac{\alpha \times \beta}{\tau^\beta} \times t^{\beta-1} \times e^{-\left(\frac{t}{\tau}\right)^\beta} \tag{a2}$$

13 Claims, 39 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,501,848 B2 | 3/2009 | Kim |
| 7,674,650 B2 | 3/2010 | Akimoto et al. |
| 7,732,819 B2 | 6/2010 | Akimoto et al. |
| 7,910,490 B2 | 3/2011 | Akimoto et al. |
| 7,932,521 B2 | 4/2011 | Akimoto et al. |
| 8,274,077 B2 | 9/2012 | Akimoto et al. |
| 8,466,463 B2 | 6/2013 | Akimoto et al. |
| 8,552,712 B2 | 10/2013 | Kato et al. |
| 8,629,069 B2 | 1/2014 | Akimoto et al. |
| 8,669,550 B2 | 3/2014 | Akimoto et al. |
| 8,790,959 B2 | 7/2014 | Akimoto et al. |
| 8,796,069 B2 | 8/2014 | Akimoto et al. |
| 9,057,758 B2 | 6/2015 | Kato et al. |
| 9,099,562 B2 | 8/2015 | Akimoto et al. |
| 2001/0019274 A1 | 9/2001 | Goto |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308805 A1 | 12/2008 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0104851 A1 | 5/2011 | Akimoto et al. |
| 2011/0121290 A1 | 5/2011 | Akimoto et al. |
| 2012/0104385 A1* | 5/2012 | Godo ............... H01L 29/78648 257/43 |
| 2012/0146713 A1* | 6/2012 | Kim ................. H01L 29/41733 327/530 |
| 2013/0187150 A1* | 7/2013 | Yamazaki ......... H01L 29/78696 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-249147 A | 9/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-123861 A | 5/2007 |
| JP | 2008-058313 A | 3/2008 |
| JP | 2011-145290 A | 7/2011 |
| JP | 2011-237418 A | 11/2011 |
| WO | WO-2004/114391 | 12/2004 |

OTHER PUBLICATIONS

Meiboom.S et al., "Theory of The Blue Phase of Cholesteric Liquid Crystals", Phys. Rev. Lett. (Physical Review Letters), May 4, 1981, vol. 46, No. 18, pp. 1216-1219.

(56) References Cited

OTHER PUBLICATIONS

Costello.M et al., "Electron Microscopy of A Cholesteric Liquid Crystal and Its Blue Phase", Phys. A (Physical Review. A), May 1, 1984, vol. 29, No. 5, pp. 2957-2959.
Kimizuka.N et al., "Spinel,YbFe2O4, and Yb2Fe3O7 Types of Structures for Compounds in the In2O3 and Sc2O3—A2O3—Bo Systems [A; Fe, Ga, or Al; B: Mg, Fe, Ni, Cu,or Zn] at Temperatures over 1000° C.", Journal of Solid State Chemistry, 1985, vol. 60, pp. 382-384.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Kitzerow.H et al., "Observation of Blue Phases in Chiral Networks", Liquid Crystals, 1993, vol. 14, No. 3, pp. 911-916.
Kimizuka.N et al., "Syntheses and Single-Crystal Data of Homologous Compounds, In2O3(ZnO)m (m =3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Chern.H et al., "An Analytical Model for The Above-Threshold Characteristics of Polysilicon Thin-Film Transistors", IEEE Transactions on Electron Devices, Jul. 1, 1995, vol. 42, No. 7, pp. 1240-1246.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Kikuchi.H et al., "Polymer-Stabilized Liquid Crystal Blue Phases", Nature Materials, Sep. 2, 2002, vol. 1, pp. 64-68.
Tsuda.K et al., "Ultra Low Power Consumption Technologies for Mobile TFT-LCDs", IDW '02 : Proceedings of The 9th International Display Workshops, Dec. 4, 2002, pp. 295-298.
Nomura.K et al., "Thin-Film Transistor Fabricated in Single-Crystalline Transparent Oxide Semiconductor", Science, May 23, 2003, vol. 300, No. 5623, pp. 1269-1272.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Lee.H et al., "Current Status of, Challenges to, and Perspective View of AM-OLED ", IDW '06 : Proceedings of The 13th International Display Workshops, Dec. 7, 2006, pp. 663-666.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hirao.T et al., "Novel Top-Gate Zinc Oxide Thin-Film Transistors (ZnO TFTs) for AMLCDS", J. Soc. Inf. Display (Journal of The Society for Information Display), 2007, vol. 15, No. 1, pp. 17-22.
Park.S et al., "Challenge to Future Displays: Transparent AM-OLED Driven by Peald Grown ZnO TFT", IMID '07 Digest, 2007, pp. 1249-1252.
Kikuchi.H et al., "62.2:Invited Paper:Fast Electro-Optical Switching in Polymer-Stabilized Liquid Crystalline Blue Phases For Display Application", SID Digest '07 : SID International Symposium Digest of Technical Papers, 2007, vol. 38, pp. 1737-1740.
Miyasaka.M, "SUFTLA Flexible Microelectronics on Their Way to Business", SID Digest '07 : SID International Symposium Digest of Technical Papers, 2007, vol. 38, pp. 1673-1676.
Kurokawa.Y et al., "UHF RFCPUS on Flexible and Glass Substrates for Secure RFID Systems", Journal of Solid-State Circuits , 2008, vol. 43, No. 1, pp. 292-299.
Jeong.J et al., "3.1: Distinguished Paper: 12.1-Inch WXGA AMOLED Display Driven by Indium-Gallium-Zinc Oxide TFTs", SID Digest '08 : SID International Symposium Digest of Technical Papers, May 20, 2008, vol. 39, No. 1, pp. 1-4.
Lee.J et al., "World's Largest (15-Inch) XGA AMLCD Panel Using IgZo Oxide TFT", SID Digest '08 : SID International Symposium Digest of Technical Papers, May 20, 2008, vol. 39, pp. 625-628.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Takahashi.M et al., "Theoretical Analysis of IgZo Transparent Amorphous Oxide Semiconductor", IDW '08 : Proceedings of The 15th International Display Workshops, Dec. 3, 2008, pp. 1637-1640.
Sakata.J et al., "Development of 4.0-In. AMOLED Display With Driver Circuit Using Amorphous In—Ga—Zn—Oxide TFTs", Proceedings of The 16th International Display Workshops, 2009, pp. 689-692.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Ohara.H et al., "21.3:4.0 in. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.

(56) References Cited

OTHER PUBLICATIONS

Hosono.H et al., "Working hypothesis to explore novel wide band gap electrically conducting amorphous oxides and examples", J. Non-Cryst. Solids (Journal of Non-Crystalline Solids), 1996, vol. 198- 200, pp. 165-169.

Orita.M et al., "Mechanism of Electrical Conductivity of Transparent InGaZnO4", Phys. Rev B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistores by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B. (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GiZo (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of The 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of The Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Kitahara.K et al., "Dynamical theory of migration of an adsorbed atom on solid surfaces", J. Chem. Phys. (Journal of Chemical Physics), Oct. 1, 1976, vol. 65, No. 7, pp. 2871-2882.

Bordewijk.P, "Defect-Diffusion Models of Dielectric Relaxation", Chem. Phys. Lett. (Chemical Physics Letters), May 1, 1975, vol. 32, No. 3, pp. 592-596, Elsevier.

Milovanov.A et al., "Stretched exponential relaxation and ac universality in disordered dielectrics", Phys. Rev. B (Physical Review. B), Sep. 4, 2007, vol. 76, pp. 104201-1-104201-8.

Lutz.E, "Fractional Langevin equation", Phys. Rev. E (Physical Review. E), Oct. 18, 2001, vol. 64, pp. 051106-1-051106-4.

Williams.G et al., "Non-Symmetrical Dielectric Relaxation Behaviour Arising from a Simple Empirical Decay Function", Transactions of The Faraday Society, 1970, vol. 66, pp. 80-85.

Furutani.K et al., "Measurement of yA-order Off-state Current of Crystalline IgZo Transistor", The 59rd Spring Meeting of the Japan Society of Applied Physics and Related Societies Preliminary Drafts, Mar. 18, 2012, p. 225.

\* cited by examiner

Electron wave function $\Psi(r, t) = A e^{-i(kr-wt)}$

Electron existence probability $P(r, t) = \Psi^*(r, t) \Psi(r, t) = |\Psi(r, t)|^2$ Electron existence probability ($t = t_1$)

FIG. 24A
FIG. 24B
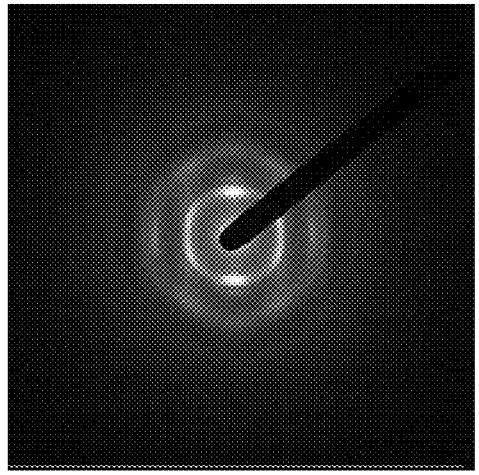
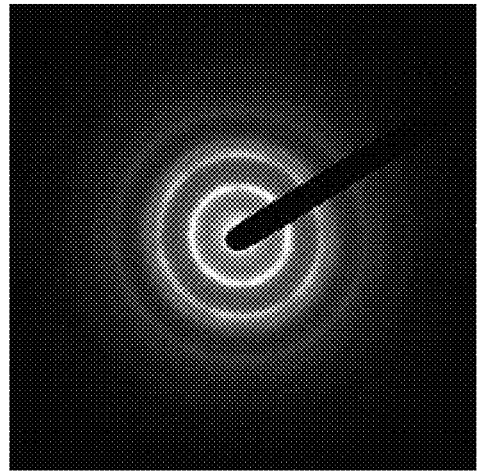

- Ga-Zn-O layer
- Ga-Zn-O layer
- In-O layer
- Ga-Zn-O layer
- Ga-Zn-O layer

● In
○ Ga or Zn
● O 0.67 nm

- Ga-Zn-O layer
- In-O layer
- Ga-Zn-O layer

In  Ga or Zn  O 0.38 nm 0.66 nm

O — Ga or Zn

MC10

SEMICONDUCTOR DEVICE AND METHOD FOR MEASURING CURRENT OF SEMICONDUCTOR DEVICE

BACKGROUND OF THE INVENTION

1. Field of the Invention

One embodiment of the present invention relates to a semiconductor device and a method for measuring a current of the semiconductor device.

The present invention relates to an object, a method, or a manufacturing method. In addition, the present invention relates to a process, a machine, manufacture, or a composition of matter. One embodiment of the present invention relates to a display device, a light-emitting device, a power storage device, a memory device, a driving method thereof, or a manufacturing method thereof.

In this specification and the like, a semiconductor device generally means a device that can function by utilizing semiconductor characteristics. In some cases, a display device, an electro-optical device, a semiconductor circuit, or an electronic device includes a semiconductor device.

2. Description of the Related Art

Attention has been focused on a technique for forming a transistor using a semiconductor thin film formed over a substrate having an insulating surface (also referred to as thin film transistor (TFT)). Such transistors are applied to a wide range of electronic devices such as an integrated circuit (IC) and an image display device (display device). A semiconductor material typified by silicon is widely known as a material for a semiconductor thin film that can be used for a transistor, and an oxide semiconductor has been attracting attention as well.

For example, a technique for manufacturing a transistor using zinc oxide or an In—Ga—Zn oxide semiconductor is disclosed (see Patent Document 1).

In order to manufacture semiconductor devices that need charge retention, such as liquid crystal display devices, it is very important to know the characteristics of transistors in an off state (hereinafter referred to as off-state current), and the like. This is because the parameters of a thin film transistor such as channel length and channel width are determined in accordance with the characteristics of the transistor in an off state.

Patent Document 2 discloses an evaluation method with which current values lower than or equal to $1 \times 10^{-24}$ A can be measured.

REFERENCE

Patent Document

[Patent Document 1] Japanese Published Patent Application No. 2007-123861
[Patent Document 2] Japanese Published Patent Application No. 2011-237418

Non-Patent Document

[Non-Patent Document 1] P. Bordewijk, "Defect-diffusion models of dielectric relaxation," *Chemical Physics Letters*, Vol. 32, Issue 3, 1975, Elsevier, pp. 592-596.

SUMMARY OF THE INVENTION

An object of one embodiment of the present invention is to provide a current measurement method capable of measuring an extremely low current. Another object of one embodiment of the present invention is to provide an inspection method of a semiconductor device utilizing the current measurement method. Another object of one embodiment of the present invention is to provide a semiconductor device employing the current measurement method. Another object of one embodiment of the present invention is to provide a semiconductor device employing the inspection method. Another object of one embodiment of the present invention is to provide a characteristic evaluation circuit. Another object of one embodiment of the present invention is to provide a novel measurement method. Another object of one embodiment of the present invention is to provide a novel semiconductor device.

Note that the descriptions of a plurality of objects do not preclude the existence of each object. One embodiment of the present invention does not necessarily achieve all the objects listed above. Objects other than those listed above are apparent from the description of the specification, drawings, claims, and the like, and such objects can be an object of one embodiment of the present invention.

One embodiment of the present invention is a current measurement method of a transistor. The current measurement method includes a first step in which a charge is written to a first terminal of a capacitor through a transistor under test; a second step in which the transistor under test is turned off to make the first terminal of the capacitor electrically floating; a third step in which data on a correspondence between a potential of the first terminal of the capacitor and measuring time is generated; a fourth step in which fitting of Formula (a1) to the data is performed to determine α, β, and τ in Formula (a1), where $V_{FN}$ represents the potential of the first terminal of the capacitor and t represents the measuring time; and a fifth step in which an off-state current of the transistor under test is calculated by substituting α, β, and τ in Formula (a1) determined in the fourth step into α, β, and τ in Formula (a2), where $I_{OFF}$ represents the off-state current of the transistor under test, $C_S$ represents capacitance of the capacitor, and t represents the measuring time.

[Formula 1]
$$V_{FN}(t) = \alpha \times e^{-\left(\frac{t}{\tau}\right)^{\beta}} \quad (a1)$$

[Formula 2]
$$I_{OFF}(t) = C_S \times \frac{\alpha \times \beta}{\tau^{\beta}} \times t^{\beta-1} \times e^{-\left(\frac{t}{\tau}\right)^{\beta}} \quad (a2)$$

In the above embodiment, a gate of the transistor is electrically connected to the first terminal of the capacitor. A current flowing between a source and a drain of the transistor is measured to measure the potential of the first terminal of the capacitor.

In the above embodiment, the measuring time is preferably greater than or equal to $5 \times 10^2$ seconds and less than or equal to $1 \times 10^5$ seconds.

In the above embodiment, the transistor under test preferably contains an oxide semiconductor in a channel. One embodiment of the present invention is a transistor whose channel width is smaller than 70 nm. A change in off-state current of the transistor over time can be represented by Formula (a2). In Formula (a2), $I_{OFF}$ represents the off-state current, t represents time during which the transistor is off, α and τ are constants, β is a constant that satisfies 0<β≤1, and $C_S$ is a constant that represents load capacitance of a source or a drain.

In the above embodiment, the off-state current at room temperature is less than $1 \times 10^{-20}$ A when t is $1 \times 10^5$ seconds.

In the above embodiment, the transistor preferably contains an oxide semiconductor in a channel.

One embodiment of the present invention is a semiconductor device including a transistor and a capacitor. A first terminal of the transistor is electrically connected to a terminal of the capacitor. A channel width of the transistor is smaller than 70 nm. A change in off-state current of the transistor over time can be represented by Formula (a2). In Formula (a2), $I_{OFF}$ represents the off-state current, t represents time during which the transistor is off, α and τ are constants, β is a constant that satisfies 0<β≤1, and $C_S$ is a constant that represents capacitance of the capacitor.

In the above embodiment, the off-state current at room temperature is preferably less than $1 \times 10^{-20}$ A when t is $1 \times 10^5$ seconds.

In the above embodiment, the transistor preferably contains an oxide semiconductor in a channel.

Note that in this specification, ordinal numbers such as "first", "second", and "third" are used in order to avoid confusion among components, and the terms do not limit the components numerically.

Note that in this specification, terms for describing arrangement, such as "over", "above", "under", and "below", are used for convenience in describing a positional relation between components with reference to drawings. The positional relation between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. The transistor has a channel region between a drain (a drain terminal, a drain region, or a drain electrode) and a source (a source terminal, a source region, or a source electrode), and current can flow through the drain region, the channel region, and the source region. Note that in this specification and the like, a channel region refers to a region through which current mainly flows.

Functions of a source and a drain might be switched when transistors having different polarities are employed or a direction of current flow is changed in circuit operation, for example. Thus, the terms "source" and "drain" can be replaced with each other in this specification.

Note that the terms "film" and "layer" can be interchanged with each other depending on the case or circumstances. For example, the term "conductive layer" can be changed into the term "conductive film" in some cases. In addition, the term "insulating film" can be changed into the term "insulating layer" in some cases.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relation relationship shown in drawings or texts, another connection relationship is included in the drawings or the texts.

Here, each of X and Y denotes an object (e.g., a device, an element, a circuit, a wiring, an electrode, a terminal, a conductive film, or a layer).

Examples of the case where X and Y are directly connected include the case where an element that enables electrical connection between X and Y (e.g., a switch, a transistor, a capacitor, an inductor, a resistor, a diode, a display element, a light-emitting element, or a load) is not connected between X and Y, and the case where X and Y are connected without the element that enables electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a storage circuit; or a control circuit) can be connected between X and Y. Note that for example, in the case where a signal output from X is transmitted to Y even when another circuit is provided between X and Y, X and Y are functionally connected. The case where X and Y are functionally connected includes the case where X and Y are directly connected and X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the explicit description "X and Y are connected."

For example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to part of Z1 and another part of Z1 is directly connected to X while a drain (or a second terminal or the like) of the transistor is directly connected to part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in that order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in that order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are connected in that order." When the connection order in a circuit structure is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path." It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path." Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film functions as the wiring and the electrode. Thus, the term "electrical connection" in this specification also means such a case where one conductive film has functions of a plurality of components.

Unless otherwise specified, off-state current in this specification refers to drain current of a transistor in an off state (also referred to as a non-conductive state or a cutoff state). Unless otherwise specified, the off state of an n-channel transistor means that a difference between gate voltage and source voltage ($V_{gs}$) is lower than the threshold voltage ($V_{th}$), and the off state of a p-channel transistor means that $V_{gs}$ is higher than $V_{th}$. For example, the off-state current of an n-channel transistor sometimes refers to drain current that flows when $V_{gs}$ is lower than $V_{th}$. The off-state current of a transistor depends on $V_{gs}$ in some cases. Thus, "the off-state current of a transistor is lower than or equal to $10^{-21}$ A" means "there is $V_{gs}$ with which the off-state current of a transistor becomes lower than or equal to $10^{-21}$ A" in some cases. Furthermore, "the off-state current of a transistor" means "off-state current in an off state at predetermined $V_{gs}$", "off-state current in an off state at $V_{gs}$ in a predetermined range", "off-state current in an off state at $V_{gs}$ with which sufficiently reduced off-state current is obtained", or the like in some cases.

In this specification, the off-state current of a transistor with channel width W is sometimes represented by a current value per given channel width (e.g., 1 μm). In that case, the off-state current may be expressed in the unit with the dimension of current per length (e.g., A/μm).

The off-state current of a transistor depends on temperature in some cases. Unless otherwise specified, the off-state current in this specification might be an off-state current at room temperature, 60° C., 85° C., 95° C., or 125° C. Alternatively, the off-state current might be an off-state current at temperature required for a semiconductor device or the like including the transistor or temperature at which a semiconductor device or the like including the transistor is used (e.g., temperature in the range of 5° C. to 35° C.).

The off-state current of a transistor depends on voltage $V_{ds}$ between its drain and source in some cases. Unless otherwise specified, the off-state current in this specification might be off-state current at $V_{ds}$ with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current might be an off-state current at $V_{ds}$ required for a semiconductor device or the like including the transistor or $V_{ds}$ used in the semiconductor device or the like including the transistor.

One embodiment of the present invention can provide a current measurement method capable of measuring an extremely low current. One embodiment of the present invention can provide an inspection method of a semiconductor device utilizing the current measurement method. One embodiment of the present invention can provide a semiconductor device employing the current measurement method. One embodiment of the present invention can provide a semiconductor device employing the inspection method. One embodiment of the present invention can provide a characteristic evaluation circuit. One embodiment of the present invention can provide a novel measurement method. One embodiment of the present invention can provide a novel semiconductor device.

Note that the description of these effects does not preclude the existence of other effects. One embodiment of the present invention does not necessarily have all the effects listed above. Other effects will be apparent from and can be derived from the description of the specification, the drawings, the claims, and the like.

BRIEF DESCRIPTION OF THE DRAWINGS

FIGS. 24A and 24B show electron diffraction patterns of a CAAC-OS.

DETAILED DESCRIPTION OF THE INVENTION

Figure 1:
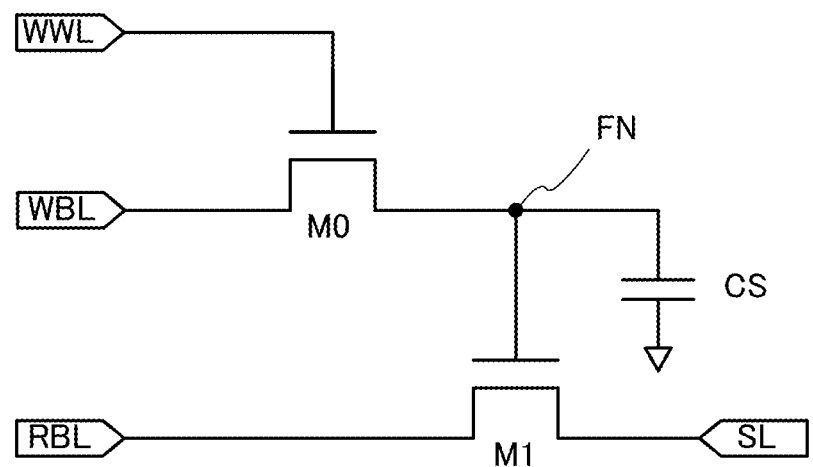
FIG. 1 is a circuit diagram illustrating an example of a measurement system.

Hereinafter, embodiments will be described with reference to drawings.

However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that drawings are schematic views of ideal examples, and the embodiments of the present invention are not limited to the shape or the value illustrated in the drawings.

(Embodiment 1)

In this embodiment, examples of a current measurement method and a current measurement system of one embodiment of the present invention will be described with reference to FIG. 1 and FIG. 2. The configuration of the measurement system can be used as that of a characteristic evaluation circuit. Note that the measurement system described below is just an example.

<<Measurement System>>

A circuit illustrated in FIG. 1 includes a transistor M0, a transistor M1, a capacitor CS, a terminal WWL, a terminal WBL, a terminal RBL, and a terminal SL.

The circuit illustrated in FIG. 1 is a characteristic evaluation circuit used for measuring an off-state current of the transistor M0, which is a transistor under test (device under test: DUT). Note that an off-state current is a current that flows between a source and a drain of a transistor when the transistor is off.

In FIG. 1, a gate of the transistor M0 is electrically connected to the terminal WWL, one of a source and a drain of the transistor M0 is electrically connected to the terminal WBL, and the other of the source and the drain of the transistor M0 is electrically connected to a first terminal of the capacitor CS.

In addition, in FIG. 1, a gate of the transistor M1 is electrically connected to the first terminal of the capacitor CS, one of a source and a drain of the transistor M1 is electrically connected to the terminal RBL, and the other of the source and the drain of the transistor M1 is electrically connected to the terminal SL.

In FIG. 1, a low potential is supplied to a second terminal of the capacitor CS. The low potential may be, for example, a ground potential.

In FIG. 1, a node where the other of the source and the drain of the transistor M0, the gate of the transistor M1, and the first terminal of the capacitor CS are electrically connected to each other is referred to as a node FN. When the transistor M0 is turned off, the node FN becomes electrically floating.

Hereinafter, a method for measuring the off-state current of the transistor M0 will be described. Although the transistor M0 and the transistor M1 will be described as n-channel transistors below, this embodiment is also applicable to the case where the transistor M0 or the transistor M1 is a p-channel transistor.

<<Measurement Method>>

Figure 2:
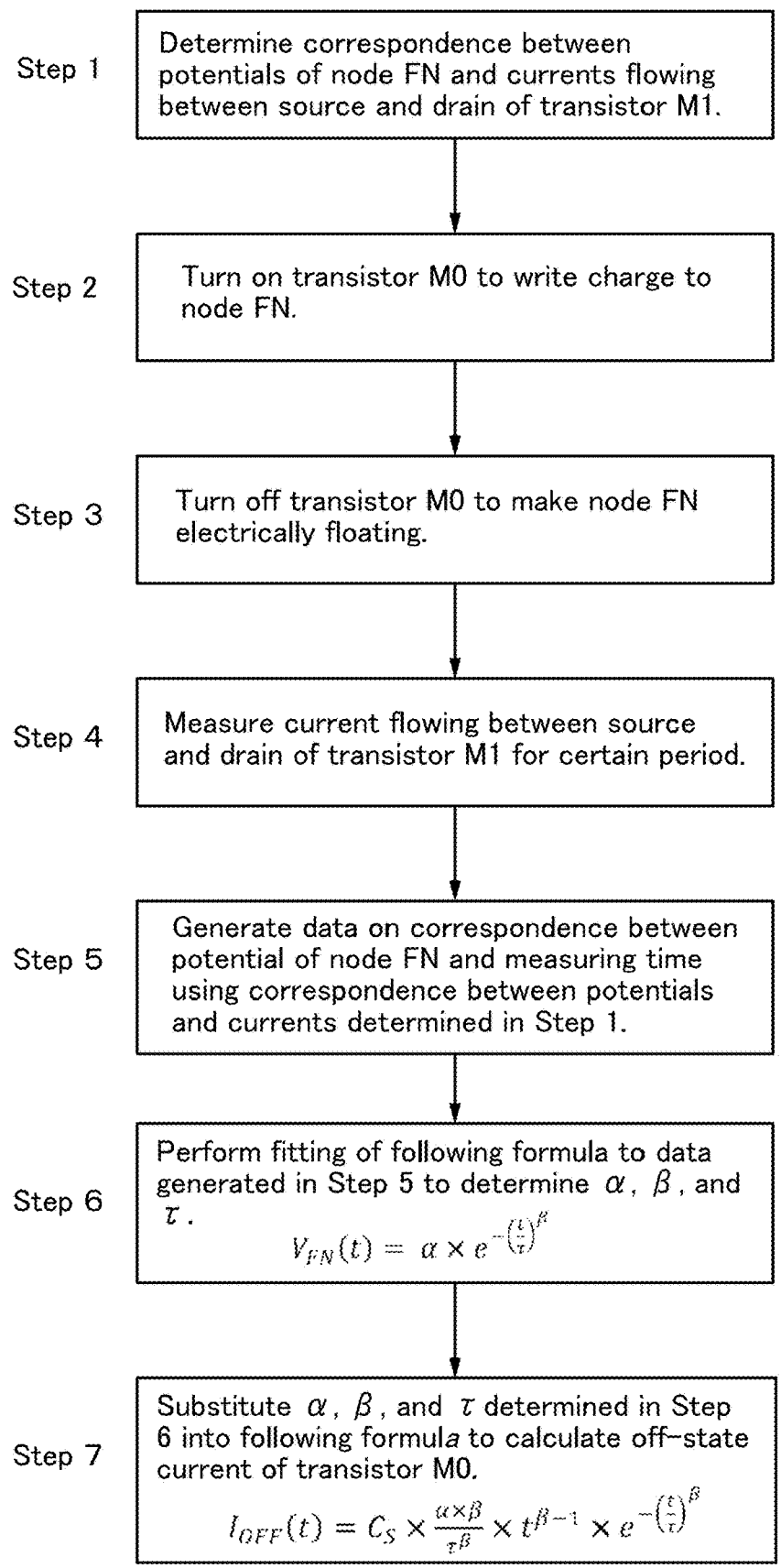
FIG. 2 is a flow chart showing an example of a measurement method.

FIG. 2 is a flow chart showing a method for measuring the off-state current of the transistor M0.

<Step 1>

First, the transistor M0 is turned on so that a potential is written to the node FN, and a current that flows between the source and the drain of the transistor M1 at that time is measured. This is repeated for different potentials to determine the correspondence between the potentials written to the node FN and values of currents flowing in the transistor M1.

To determine the correspondence between potentials and currents, for example, a current that flows between the terminal RBL and the terminal SL is measured while 3 V, 1.1 V, 0 V (ground potential), and 0 V are applied to the terminal WWL, the terminal RBL, the terminal SL, and the second terminal of the capacitor CS, respectively, with potentials applied to the terminal WBL in increments of 0.1 V from 0 V to 1 V.

<Step 2>

The transistor M0 is turned on to write a charge to the node FN. At this time, the transistor M1 is also turned on and a current (on-state current) flows between the source and the drain of the transistor M1. Here, for example, 3 V, 1.1 V, 1.1 V, 0 V, and 0 V are applied to the terminal WWL, the terminal WBL, the terminal RBL, the terminal SL, and the second terminal of the capacitor CS, respectively.

<Step 3>

Next, the transistor M0 is turned off to make the node FN electrically floating. As a result, the charge of the node FN is retained and the transistor M1 is kept on. Here, for example, -1 V, 0 V, 1.1 V, 0 V, and 0 V are applied to the terminal WWL, the terminal WBL, the terminal RBL, the terminal SL, and the second terminal of the capacitor CS, respectively.

<Step 4>

Then, while the transistor M0 is kept off, a current that flows between the source and the drain of the transistor M1 is measured for a certain period to generate data on the correspondence between currents and measuring time. Note that the measuring time is time elapsed after the transistor M0 is turned off in Step 3. The measuring time is set greater than or equal to $5 \times 10^2$ seconds and less than or equal to $1 \times 10^5$ seconds, greater than or equal to $1 \times 10^3$ seconds and less than or equal to $1 \times 10^4$ seconds, or greater than or equal to $1 \times 10^3$ seconds and less than or equal to $5 \times 10^3$ seconds.

<Step 5>

With the use of the correspondence between potentials and currents determined in Step 1, data on the correspondence between a potential $V_{FN}$ of the node FN and Time t is generated. Note that "Time t" in this specification expresses the measuring time.

<Step 6>

A stretched exponential function represented by Formula (1) is fitted to the data obtained in Step 5 to determine parameters α, β, and τ in Formula (1).

[Formula 3]

$$V_{FN}(t) = \alpha \times e^{-\left(\frac{t}{\tau}\right)^\beta} \quad (1)$$

<Step 7>

Lastly, the off-state current of the transistor M0 is calculated with the use of α, β, and τ determined in Step 6.

The derivative of both sides of Formula (1) with respect to time gives Formula (2).

[Formula 4]

$$\frac{dV_{FN}}{dt} = -\frac{\alpha \times \beta}{\tau^\beta} \times t^{\beta-1} \times e^{-\left(\frac{t}{\tau}\right)^\beta} \quad (2)$$

An off-state current $I_{OFF}$ of the transistor M0, capacitance $C_S$ of the capacitor CS, and the potential $V_{FN}$ of the node FN satisfy the following relational expression.

[Formula 5]

$$I_{OFF}(t) = C_S \times \frac{dV_{FN}}{dt} \quad (3)$$

Substitution of Formula (3) into Formula (2) gives the following formula.

[Formula 6]

$$I_{OFF}(t) = C_S \times \frac{\alpha \times \beta}{\tau^\beta} \times t^{\beta-1} \times e^{-\left(\frac{t}{\tau}\right)^\beta} \quad (4)$$

Substitution of α, β, and τ determined in Step 6 into Formula (4) allows the calculation of the off-state current of the transistor M0.

In the above manner, the off-state current of the transistor M0 can be measured using the measurement method shown in FIG. 2.

Figure 29:
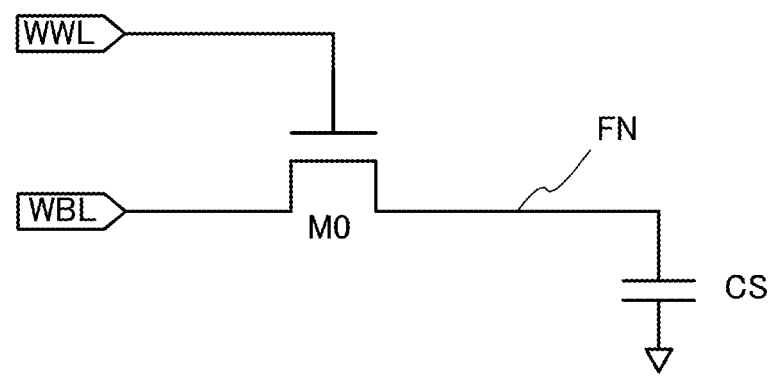
FIG. 29 is a circuit diagram illustrating an example of a measurement system.

Here, a circuit illustrated in FIG. 29 is discussed.

The circuit illustrated in FIG. 29 is a circuit excluding the transistor M1 from the circuit illustrated in FIG. 1.

In the case where a wide band gap semiconductor such as an oxide semiconductor is used for the transistor M0, for example, the off-state current of the transistor M0 is too low to actually measure with measurement equipment.

Also in the case where a minute transistor whose channel width is smaller than 100 nm is used as the transistor M0, for example, the off-state current of the transistor M0 is too low to actually measure with measurement equipment.

To measure the off-state current of the transistor M0 of the circuit illustrated in FIG. 29, a current that flows in the terminal WBL is measured; however, it is difficult to actually measure the current that flows in the terminal WBL when the off-state current of the transistor M0 is extremely low as described above.

Thus, in the case where the off-state current of the transistor M0 is extremely low, a method with which the off-state current of the transistor M0 is measured using the on-state current of the transistor M1 as described with reference to FIG. 1 is very effective.

The extremely low off-state current of the transistor M0 can lead to long-term retention of the charge written to the node FN. This feature enables the circuit illustrated in FIG. 1 (or FIG. 29) to be applied to a memory element such as a nonvolatile memory.

The off-state current of the transistor M0 several months to several years ahead can be estimated using the measurement method shown in FIG. 2. Thus, long-term charge retention characteristics can be estimated when the circuit illustrated in FIG. 1 (or FIG. 29) is applied to a memory element.

Figure 3:
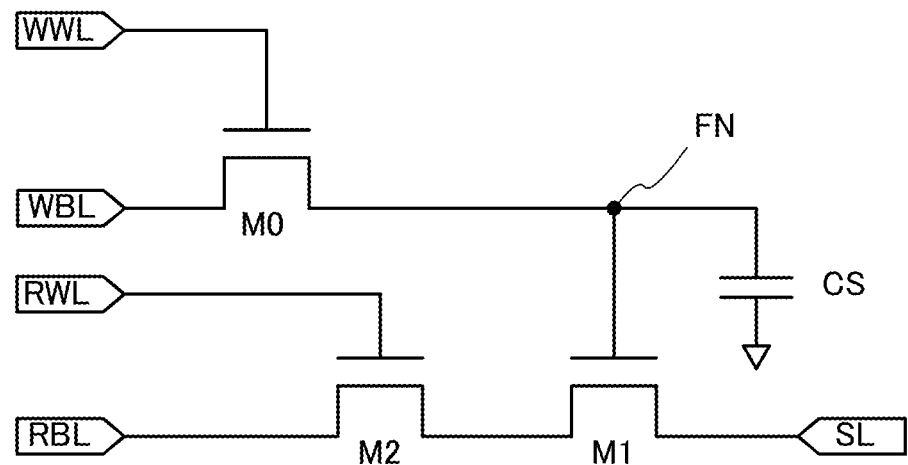
FIG. 3 is a circuit diagram illustrating an example of a measurement system.

The characteristic evaluation circuit illustrated in FIG. 1 may include a transistor M2 as illustrated in FIG. 3. A gate of the transistor M2 is electrically connected to a terminal RWL. The terminal RWL has a function of supplying a signal with which the transistor M2 is turned on or off.

<<Measurement Environment>>

Figure 4:
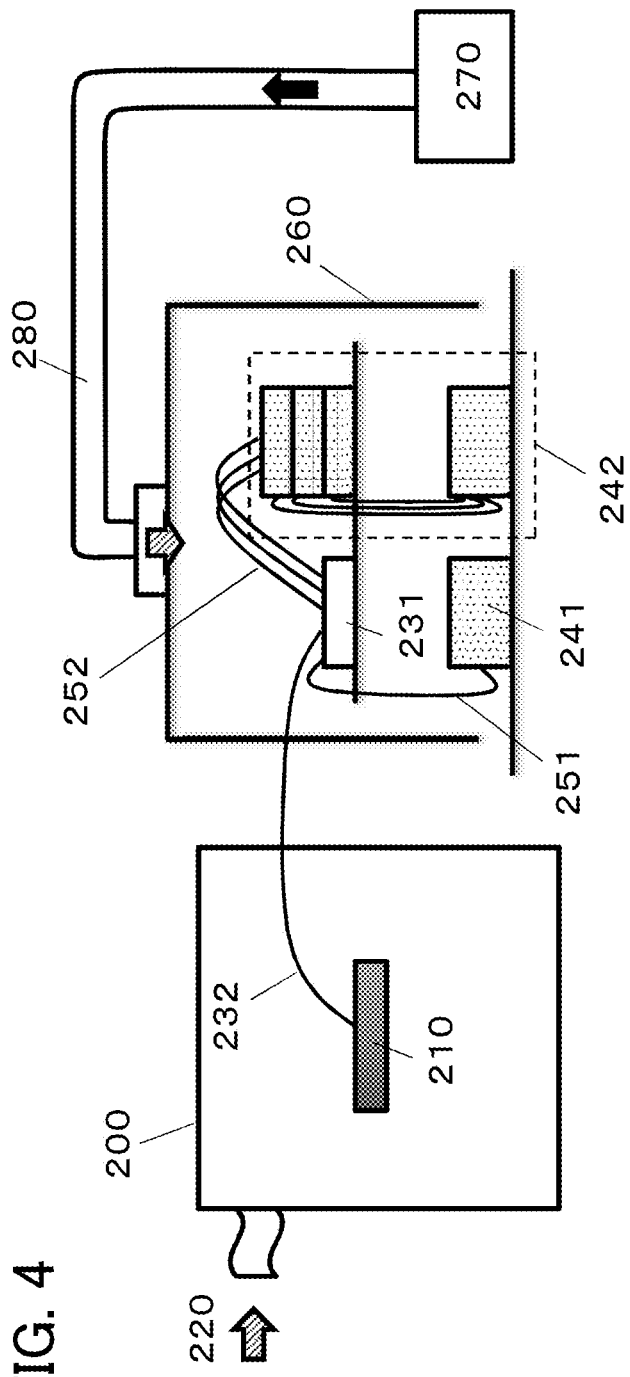
FIG. 4 illustrates an example of a measurement system.

A measurement sample including a characteristic evaluation circuit may be put in an inert oven in which temperature is kept constant, as illustrated in FIG. 4. In addition, a constant-temperature air generator may be used to make the temperature of an atmosphere around measurement equipment constant. The measurement environment is controlled as described above, whereby an adverse effect of noise caused by a temperature change can be reduced.

Specifically, a sample 210 is put in an inert oven 200 and the temperature of the sample 210 is kept constant. The humidity in the inert oven 200 can be reduced by supplying dry air 220 to the inert oven 200 at that time, which provides a low-humidity measurement environment. The sample 210 is connected to a transit portion 231 with a flat cable 232. The transit portion 231 is connected to measurement equipment 241 and measurement equipment 242 with a coaxial cable 251 and a coaxial cable 252, respectively. The measurement equipment 242 sends a signal for transmitting data of the sample 210 to the transit portion 231. The data of the sample 210 is supplied from the transit portion 231 to the measurement equipment 241. Note that a measurement system (including the sample and the measurement equipment) is preferably kept at a constant temperature. In order to keep the measurement system at a constant temperature, for example, the measurement system is covered by a heat insulator 260, a plastic corrugated cardboard, or the like, and constant-temperature air is supplied using a constant-temperature air generator 270 and a duct cable 280. It is preferable that the measurement system not be entirely covered by the heat insulator 260, the plastic corrugated cardboard, or the like so that a small amount of constant-temperature air can flow off to the outside.

<<Stretched Exponential Function>>

Next, the stretched exponential function represented by Formula (1) will be described.

Figure 5:
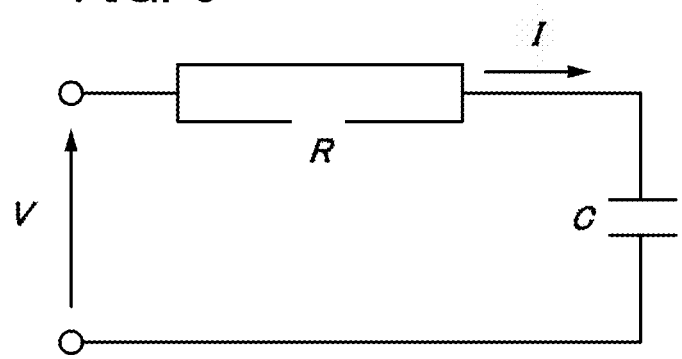
FIG. 5 is a circuit diagram of an RC circuit.

A circuit consisting of a resistor R and a capacitor C (RC circuit) as illustrated in FIG. 5 is described, for example. A current I flowing in this circuit can be represented by Formula (5).

[Formula 7]

$$I(t) = \frac{V}{r} \times e^{-\frac{t}{CR}} \quad (5)$$

A current that can be measured by measurement equipment, such as the current I represented by Formula (5), is regarded as the flow of a large number of electrons, and the behavior of the electrons can be explained by the classical theory, for example.

In contrast, a current that is too low to measure by measurement equipment is regarded as the flow of an extremely small number of electrons. In some cases, such an extremely low current is regarded as the flow of several to several tens of electrons.

To explain the flow of such an extremely small number of electrons, it is preferable to use the quantum theory or the statistical mechanics.

Figure 6:
FIG. 6 illustrates wave nature of electrons.
Figure 6:
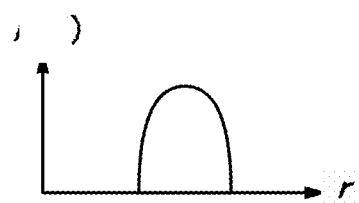

In the quantum theory, for example, a state of an electron is represented by the wave function $\Psi$, and the position r of an electron is represented by the existence probability P (see FIG. 6).

In the case where the extremely low current flows in the RC circuit in FIG. 5, the behavior of electrons needs to be explained by the quantum theory. For this reason, it is assumed that traps exist in the resistor R in accordance with a certain function and electrons are trapped by the traps. The assumed traps will be described below with reference to FIG. 7.

Figure 7:
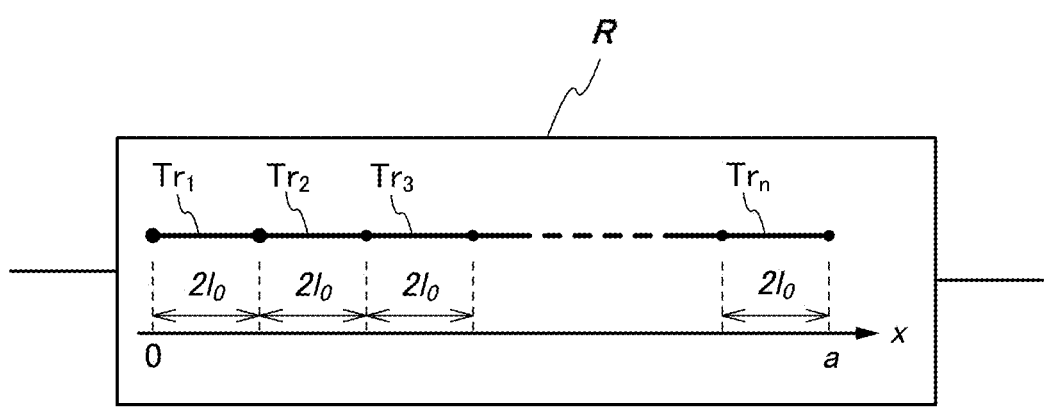
FIG. 7 illustrates electron traps assumed to be in a resistor.

In FIG. 7, n traps (n is an integer greater than or equal to 1) represented by traps $Tr_1$ to $Tr_n$ exist in the resistor R. The traps $Tr_1$ to $Tr_n$ are distributed one-dimensionally with a length x in the range from 0 to a. It is assumed that each trap has a length of $2l_0$.

Electrons are assumed to be trapped by the traps in the resistor R in accordance with the existence probability $P_1(t)$. Note that the existence probability $P_1(t)$ has a physical meaning of the probability of an electron being trapped by the trap $Tr_1$ during Time t.

It is assumed that the traps $Tr_1$ to $Tr_n$ in the resistor R can be represented by the distribution function $\rho(x)=1/a$. The formula at Time $t_1$ is as follows. Note that $x_0$ in Formula (6) represents the coordinate of the position where an electron is trapped.

[Formula 8]

$$P_1(t_1) = \int_{x=0}^{a} dx \rho(x) P_1(t_1, x-x_0) \quad (6)$$

A diffusion constant D of an electron is introduced. With the use of the

Chandrasekhar equation of diffusion probability (see Non-patent Document 1), the integration in Formula (6) can be developed as follows.

[Formula 9]

$$P_1(t_1) = \frac{1}{a}\left(\frac{D}{\pi t_1}\right)^{\frac{1}{2}} \{2 - \exp(-x_0^2/4Dt_1) - \exp[-(a-x_0)^2/4Dt_1]\} \quad (7)$$

In Formula (7), $x_0$ and $(a-x_0)$ are sufficiently larger than $Dt_1$. Thus, the existence probability $P_1(t_1)$ at Time $t_1$ can be represented by the following formula.

[Formula 10]

$$P_1(t_1) = \frac{2}{a}\left(\frac{D}{\pi t_1}\right)^{1/2} \quad (8)$$

The integration of Formula (8) with respect to time gives Formula (9). Formula (9) represents the existence probability of electrons trapped during Time t.

[Formula 11]

$$P_1(t) = \frac{4}{a}\left(\frac{Dt}{\pi}\right)^{1/2} \quad (9)$$

The probability of an electron moving in the resistor R without being trapped by the trap $Tr_1$ is represented by $[1-P_1(t)]$. Accordingly, the probability of an electron moving in the resistor R without being trapped by any trap is represented by Formula (10).

[Formula 12]

$$1 - P(t) = [1 - P_1(t)]^n = \left[1 - \frac{4}{a}\left(\frac{Dt}{\pi}\right)^{1/2}\right]^n \quad (10)$$

The limit of n is described. As apparent from FIG. 7, $a = n \times 2l_0$ is satisfied; thus, Formula (11) is obtained.

[Formula 13]

$$\lim_{n\to\infty}[1 - P(t)] = \lim_{n\to\infty}\left[1 - \frac{2}{n i_0}\left(\frac{Dt}{\pi}\right)^{1/2}\right]^n \quad (11)$$

The generic form of the exponential function with respect to the limit gives Formula (12).

[Formula 14]

$$\lim_{n\to\infty}\left(1 + \frac{x}{n}\right)^n = e^x \quad (12)$$

Formula (11) and Formula (12) give Formula (13).

[Formula 15]

$$1 - P(t) = A_0 \times \exp\left[-\left(\frac{t}{\tau}\right)^{1/2}\right] \quad (13)$$

Formula (13) represents the probability of an electron passing through the resistor R without being trapped by traps. Note that Formula (13) is the stretched exponential function in the case where β in Formula (1) is ½.

The behavior of electrons is explained by the quantum theory as described above, whereby the stretched exponential function that is used for the calculation of the off-state current of the transistor M0 can be obtained. This means that an extremely low current such as the off-state current can be explained by the quantum theory or the statistical mechanics and is preferably calculated using the stretched exponential function in Formula (4).

The structures, methods, and the like described in this embodiment can be used as appropriate in combination with any of the structures, methods, and the like described in other embodiments.

(Embodiment 2)

In this embodiment, an example of a semiconductor device applicable to the measurement system illustrated in FIG. 1 will be described.

<<Cross-sectional View of Semiconductor Device>>

Figure 8A:
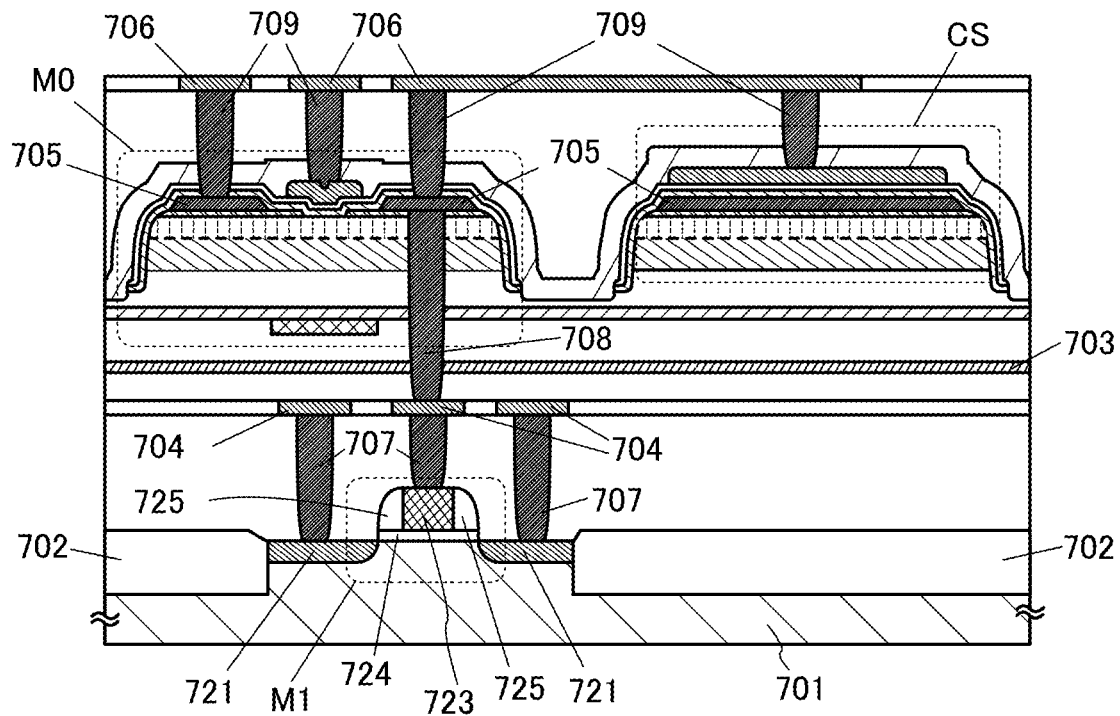
FIGS. 8A to 8C are cross-sectional views illustrating a structure example of a semiconductor device.

FIG. 8A is a cross-sectional view of a semiconductor device of one embodiment of the present invention. The semiconductor device illustrated in FIG. 8A includes a substrate 701, the transistor M0, the transistor M1, the capacitor CS, an element isolation layer 702, an insulating film 703, a conductive film 704, a conductive film 705, a conductive film 706, a plug 707, a plug 708, and a plug 709. The transistor M1 includes impurity regions 721 serving as source/drain regions, a gate electrode 723, a gate insulating film 724, and a sidewall insulating layer 725.

The semiconductor device illustrated in FIG. 8A includes the transistor M1 containing a first semiconductor material in a lower portion and the transistor M0 containing a second semiconductor material in an upper portion. FIG. 8A illustrates cross-sectional views of the transistor M0 and the transistor M1 in a channel length direction.

The first and second semiconductor materials preferably have different band gaps. For example, the first semiconductor material can be a semiconductor material other than an oxide semiconductor (examples of such a semiconductor material include silicon, germanium, silicon germanium, silicon carbide, and gallium arsenide), and the second semiconductor material can be an oxide semiconductor. A transistor using single crystal silicon as the first semiconductor material can operate at high speed easily. In contrast, a transistor including an oxide semiconductor as the second semiconductor material has a low off-state current.

The details of the transistor M0 will be described in Embodiment 3.

The transistor M1 may be either an n-channel transistor or a p-channel transistor; an appropriate transistor is used depending on a circuit. Furthermore, the specific structure of the semiconductor device, such as the material or the structure used for the semiconductor device, is not necessarily limited to those described here except for the use of the transistor of one embodiment of the present invention which includes an oxide semiconductor.

The transistor M1 may be provided with an impurity region serving as a lightly doped drain (LDD) region or an extension region under the sidewall insulating layer 725. In particular, when the transistor M1 is an n-channel transistor, the LDD region or the extension region is preferably provided in order to suppress the deterioration due to hot carriers.

As the transistor M1, a transistor containing silicide (salicide) or a transistor that does not include the sidewall insulating layer 725 may be used. When a structure that contains silicide (salicide) is used, the resistance of the source region and the drain region can be further lowered and the speed of the semiconductor device can be increased. Furthermore, the semiconductor device can operate at a low voltage; thus, power consumption of the semiconductor device can be reduced.

Since the two kinds of transistors are stacked, the area occupied by the circuit can be reduced, allowing a plurality of circuits to be highly integrated.

The capacitor CS and the transistor M0 can be formed in the same process. Although the capacitor CS and the transistor M0 are provided in the same tier in FIG. 8A, the capacitor CS may be provided in the same tier as the transistor M1. Alternatively, the capacitor CS may be provided in a tier between the transistor M1 and the transistor M0, or in a tier over the transistor M1 and the transistor M0.

As the substrate 701, a single crystal semiconductor substrate or a polycrystalline semiconductor substrate made of silicon or silicon carbide, a compound semiconductor substrate made of silicon germanium, a silicon on insulator (SOI) substrate, or the like may be used. A transistor formed using a semiconductor substrate can easily operate at high speed. In the case of using a p-type single crystal silicon substrate as the substrate 701, an impurity element imparting n-type conductivity may be added to part of the substrate 701 to form an n-well, and a p-type transistor can be formed in a region where the n-well is formed. As the impurity element imparting n-type conductivity, phosphorus (P), arsenic (As), or the like can be used. As the impurity element imparting p-type conductivity, boron (B) or the like may be used.

Alternatively, the substrate 701 may be a metal substrate or an insulating substrate provided with a semiconductor film. Examples of the metal substrate are a stainless steel substrate, a substrate including stainless steel foil, a tungsten substrate, and a substrate including tungsten foil. Examples of the insulating substrate are a glass substrate, a quartz substrate, a plastic substrate, a flexible substrate, an attachment film, paper including a fibrous material, and a base film. Examples of the glass substrate are a barium borosilicate glass substrate, an aluminoborosilicate glass substrate, and a soda lime glass substrate. Examples of the flexible substrate are flexible synthetic resin substrates such as substrates of plastics typified by polyethylene terephthalate (PET), polyethylene naphthalate (PEN), and polyether sulfone (PES) and an acrylic substrate. Examples of the attachment film are attachment films formed using polypropylene, polyester, polyvinyl fluoride, polyvinyl chloride, and the like. Examples of the base film are base films formed using polyester, polyamide, polyimide, aramid, epoxy, an inorganic vapor deposition film, and paper.

Alternatively, a semiconductor element may be formed using one substrate and then be transferred to another substrate. Examples of a substrate to which a semiconductor element is transferred include, in addition to the above-described substrates, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, and a rubber substrate. With the use of these substrates can reduce the weight or the thickness of a semiconductor device.

The transistor M1 is isolated from other transistors formed on the substrate 701 by the element isolation layer 702. The element isolation layer 702 can be formed using an insulator containing one or more materials selected from aluminum oxide, aluminum oxynitride, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like.

Here, in the case where a silicon-based semiconductor material is used for the transistor M1 provided in a lower tier, hydrogen in an insulating layer provided in the vicinity of the semiconductor layer of the transistor M1 terminates dangling bonds of silicon; accordingly, the reliability of the transistor M1 can be improved. Meanwhile, in the case where an oxide semiconductor is used for the transistor M0 provided in an upper tier, hydrogen in an insulating layer provided in the vicinity of the semiconductor layer of the transistor M0 becomes a factor of generating carriers in the oxide semiconductor; thus, the reliability of the transistor M0 might be decreased. Therefore, in the case where the transistor M0 formed using an oxide semiconductor is provided over the transistor M1 formed using a silicon-based semiconductor material, it is particularly effective that the insulating film 703 having a function of preventing diffusion of hydrogen is provided between the transistors M0 and M1. The insulating film 703 makes hydrogen remain in the lower tier, thereby improving the reliability of the transistor M1. In addition, since the insulating film 703 suppresses diffusion of hydrogen from the lower tier to the upper tier, the reliability of the transistor M0 can also be improved.

The insulating film 703 can be formed using, for example, aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

The conductive films 704 to 706 preferably have a single-layer structure or a stacked-layer structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), and cobalt (Co), an alloy of such a low-resistance material, or a compound containing such a material as its main component. It is particularly preferable to use a high-melting-point material which has both heat resistance and conductivity, such as tungsten or molybdenum. In addition, the plugs are preferably formed using a low-resistance conductive material such as aluminum or copper. The plugs are further preferably formed using a Cu—Mn alloy, in which case manganese oxide formed at the interface with an insulator containing oxygen has a function of preventing Cu diffusion.

The plugs 707 to 709 preferably have a single-layer structure or a stacked-layer structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), and cobalt (Co), an alloy of such a low-resistance material, or a compound containing such a material as its main component. It is particularly preferable to use a high-melting-point material which has both heat resistance and conductivity, such as tungsten or molybdenum. In addition, the wirings are preferably formed using a low-resistance conductive material such as aluminum or copper. The wirings are further preferably formed using a Cu—Mn alloy, in which case manganese oxide formed at the interface with an insulator containing oxygen has a function of preventing Cu diffusion.

In FIG. 8A, regions without reference numerals and hatch patterns represent regions formed of an insulator. The regions can be formed using an insulator containing at least one of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like. Alternatively, for the regions, an organic resin such as a polyimide resin, a polyamide resin, an acrylic resin, a siloxane resin, an epoxy resin, or a phenol resin can be used.

Figure 8B:
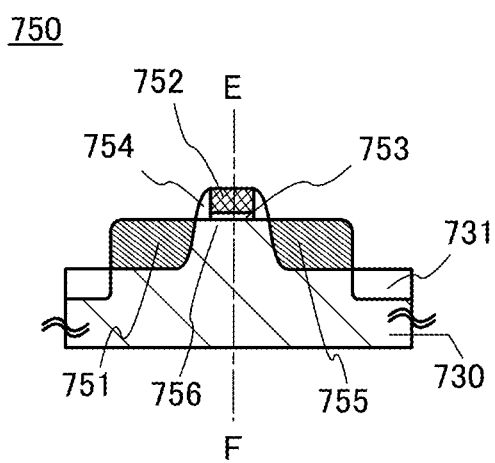
Figure 8C:
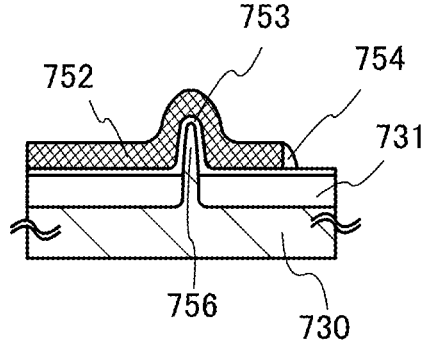

A transistor 750 illustrated in FIGS. 8B and 8C may be used as the transistor M1. FIG. 8C illustrates a cross section along dashed-dotted line E-F in FIG. 8B. The transistor 750 formed over a semiconductor substrate 730 includes a semiconductor layer 756 where a channel is formed, an impurity region 751, an impurity region 755, a gate insulating film 753, a gate electrode 752, a sidewall insulating layer 754, and an element isolation layer 731. The semiconductor layer 756 has a protrusion, and the gate insulating film 753 and the gate electrode 752 are provided along top and side surfaces of the protrusion. Such a transistor is also referred to as a FIN transistor because it utilizes a protrusion of a semiconductor substrate. Note that an insulating film serving as a mask for forming the protrusion may be provided in contact with the top of the protrusion. Although the case where the protrusion is formed by processing a portion of the semiconductor substrate 730 is described here, a semiconductor layer having a protruding shape may be formed by processing an SOI substrate.

Although channel regions of the transistors M0 and M1 in FIG. 8A contain different semiconductor materials, the channel regions of the transistors M0 and M1 may contain the same semiconductor material. For example, the channel regions of the transistors M0 and M1 may both contain an oxide semiconductor.

The structures, methods, and the like described in this embodiment can be used as appropriate in combination with any of the structures, methods, and the like described in other embodiments.

(Embodiment 3)

In this embodiment, examples of a transistor that can be used as the transistor M0 described in Embodiments 1 and 2 are described.

<<Structure Example 1 of Transistor>>

Figure 9A:
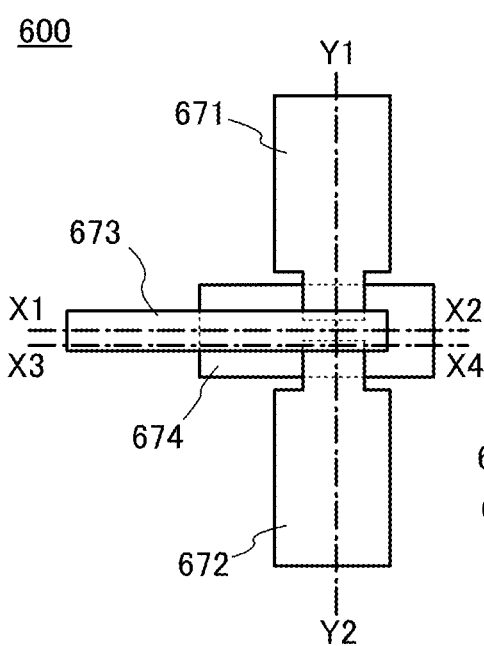
FIGS. 9A to 9D are a top view and cross-sectional views illustrating a structure example of a transistor.
Figure 9B:
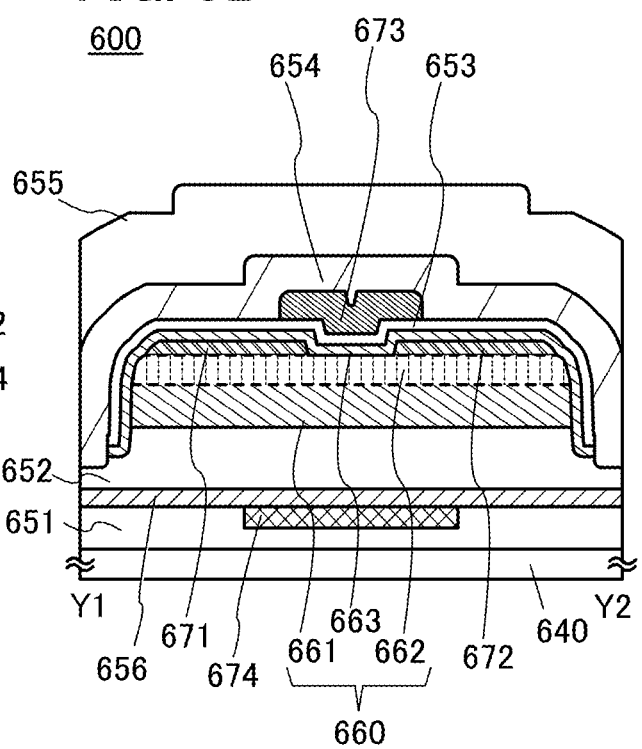
Figure 9C:
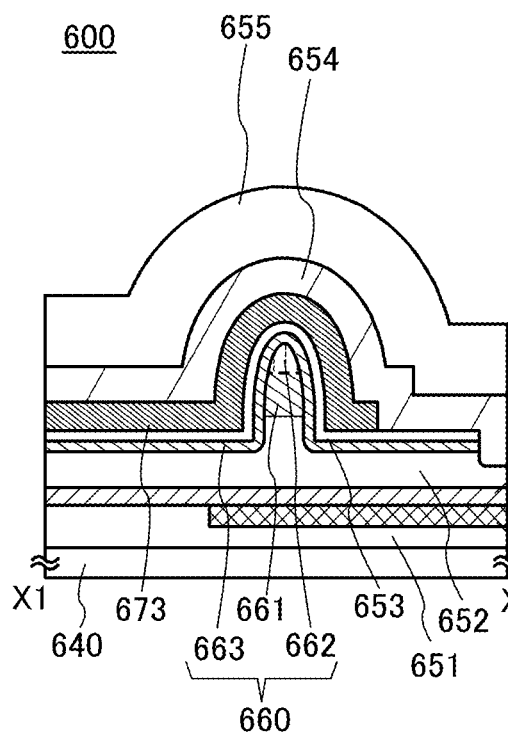
Figure 9D:
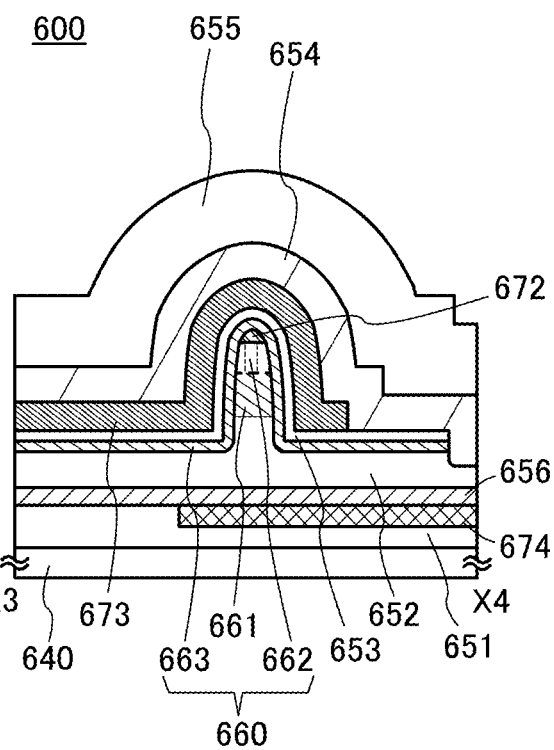

FIGS. 9A to 9D are a top view and cross-sectional views of a transistor 600. FIG. 9A is the top view. FIG. 9B illustrates a cross section along dashed-dotted line Y1-Y2 in FIG. 9A. FIG. 9C illustrates a cross section along dashed-dotted line X1-X2 in FIG. 9A. FIG. 9D illustrates a cross section along dashed-dotted line X30-X4 in FIG. 9A. In FIGS. 9A to 9D, some components are scaled up or down or omitted for easy understanding. In some cases, the direction of the dashed-dotted line Y1-Y2 is referred to as a channel length direction and the direction of the dashed-dotted line X1-X2 is referred to as a channel width direction.

Note that the channel length refers to, for example, a distance between a source (source region or source electrode) and a drain (drain region or drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not limited to one value in some cases. Therefore, in this specification, the channel with is any one of values, the maximum value, the minimum value, or the average value in a region where a channel is formed.

Note that depending on transistor structures, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, the values may be different from those calculated using an effective channel width in some cases.

The transistor 600 includes a substrate 640; an insulating film 651 over the substrate 640; a conductive film 674 over the insulating film 651; an insulating film 656 over the insulating film 651 and the conductive film 674; an insulating film 652 over the insulating film 656; a semiconductor 661 and a semiconductor 662 stacked over the insulating film 652 in this order; a conductive film 671 and a conductive film 672 in contact with a top surface of the semiconductor 662; a semiconductor 663 in contact with the semiconductor 661, the semiconductor 662, the conductive film 671, and the conductive film 672; an insulating film 653 and a conductive film 673 over the semiconductor 663; an insulating film 654 over the conductive film 673 and the insulating film 653; and an insulating film 655 over the insulating film 654. Note that the semiconductors 661, 662, and 663 are collectively referred to as a semiconductor 660.

The conductive film 671 has a function as a source electrode of the transistor 600. The conductive film 672 has a function as a drain electrode of the transistor 600.

The conductive film 673 has a function as a first gate electrode of the transistor 600.

The insulating film 653 has a function as a first gate insulating film of the transistor 600.

The conductive film 674 has a function as a second gate electrode of the transistor 600.

The insulating films 656 and 652 have a function as a second gate insulating film of the transistor 600.

Potentials applied to the conductive films 673 and 674 may be the same or different from each other. Note that the conductive film 674 is unnecessary in some cases.

As illustrated in FIG. 9C, a side surface of the semiconductor 662 is surrounded by the conductive film 673. With such a structure, the semiconductor 662 can be electrically surrounded by an electric field of the conductive film 673 (a transistor structure in which a semiconductor is electrically surrounded by an electric field of a conductive film (gate electrode) is referred to as a surrounded channel (s-channel) structure). Therefore, a channel is formed in the entire semiconductor 662 (bulk) in some cases. In the s-channel structure, a large amount of current can flow between a source and a drain of a transistor, so that a high current in an on state (on-state current) can be achieved. The s-channel structure enables a transistor to operate at high frequency.

The s-channel structure, because of its high on-state current, is suitable for a semiconductor device such as large-scale integration (LSI) which requires a miniaturized transistor. A semiconductor device including the miniaturized transistor can have a high integration degree and high density. The transistor preferably has, for example, a region where a channel length is greater than or equal to 10 nm and less than 1 μm, further preferably greater than or equal to 10 nm and less than 100 nm, still further preferably greater than or equal to 10 nm and less than 70 nm, yet still further preferably greater than or equal to 10 nm and less than 60 nm, and yet still further preferably greater than or equal to 10 nm and less than 30 nm. In addition, the transistor preferably has, for example, a region where a channel width is greater than or equal to 10 nm and less than 1 μm, further preferably greater than or equal to 10 nm and less than 100 nm, still further preferably greater than or equal to 10 nm and less than 70 nm, yet still further preferably greater than or equal to 10 nm and less than 60 nm, and yet still further preferably greater than or equal to 10 nm and less than 30 nm.

Furthermore, the s-channel structure is suitable for a transistor that needs to operate at high frequency because of its high on-state current. A semiconductor device including the transistor can operate at high frequency.

In addition, the s-channel structure is suitable for a power control transistor because of its high on-state current. To employ the s-channel structure in the power control transistor that requires a high withstand voltage and high current, the channel length and the channel width are preferably long. For example, the transistor preferably has a region where the channel length is longer than or equal to 1 μm, further preferably longer than or equal to 10 μm, and still further preferably longer than or equal to 100 μm. In addition, the transistor preferably has a region where the channel width is longer than or equal to 1 μm, further preferably longer than or equal to 10 μm, and still further preferably longer than or equal to 100 μm. Here, the transistor has a region where the channel length is smaller than 1 cm and a region where the channel width is smaller than 1 cm.

The insulating film 651 has a function of electrically isolating the substrate 640 and the conductive film 674 from each other.

The insulating film 652 preferably includes an oxide. In particular, the insulating film 652 preferably includes an oxide material from which part of oxygen is released by heating. The insulating film 652 preferably includes an oxide containing oxygen in excess of that in the stoichiometric composition. Part of oxygen is released by heating from the oxide film containing oxygen in excess of that in the stoichiometric composition. Oxygen released from the insulating film 652 is supplied to the semiconductor 660 that is an oxide semiconductor, so that oxygen vacancies in the oxide semiconductor can be reduced. Consequently, changes in the electrical characteristics of the transistor can be reduced and the reliability of the transistor can be improved.

The oxide film containing oxygen in excess of that in the stoichiometric composition is an oxide film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis, for example. Note that the temperature of the film surface in the TDS analysis is preferably higher than or equal to 100° C. and lower than or equal to 700° C., or higher than or equal to 100° C. and lower than or equal to 500° C.

The insulating film 656 has a function of preventing oxygen contained in the insulating film 652 from decreasing by bonding to metal contained in the conductive film 674.

The insulating film 654 has a function of blocking oxygen, hydrogen, water, alkali metal, alkaline earth metal, and the like. Providing the insulating film 654 can prevent outward diffusion of oxygen from the semiconductor 660 and entry of hydrogen, water, or the like into the semiconductor 660 from the outside.

<Semiconductor>

Next, semiconductors which can be used as the semiconductors 661 to 663 or the like will be described below.

In the transistor 600, it is preferable that the current flowing between a source and drain in an off state (off-state current) be low. Here, the term "low off-state current" means that normalized off-state current per micrometer of channel width at room temperature with a source-drain voltage of 10 V is lower than or equal to $10 \times 10^{-21}$ A. An example of a transistor with such a low off-state current is a transistor including an oxide semiconductor as a semiconductor.

The semiconductor 662 is, for example, an oxide semiconductor containing indium (In). The semiconductor 662 has a high carrier mobility (electron mobility) when containing, for example, indium. The semiconductor 662 preferably contains an element M. The element M is preferably aluminum (Al), gallium (Ga), yttrium (Y), tin (Sn), or the like. Other elements which can be used as the element M include boron (B), silicon (Si), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), and tungsten (W). Note that two or more of the above elements may be used in combination as the element M. The element M is an element having high bonding energy with oxygen, for example. The element M is an element whose bonding energy with oxygen is higher than that of indium. The element M is an element that can increase the energy gap of the oxide semiconductor, for example. Furthermore, the semiconductor 662 preferably contains zinc (Zn). When the oxide semiconductor contains zinc, the oxide semiconductor is easily crystallized in some cases.

Note that the semiconductor 662 is not limited to the oxide semiconductor containing indium. The semiconductor 662 may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For the semiconductor 662, an oxide with a wide energy gap may be used. For example, the energy gap of the semiconductor 662 is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

The semiconductor 662 preferably includes a CAAC-OS film which will be described later.

For example, the semiconductor 661 and the semiconductor 663 include one or more, or two or more elements other than oxygen included in the semiconductor 662. Since the semiconductor 661 and the semiconductor 663 each include one or more, or two or more elements other than oxygen included in the semiconductor 662, an interface state is less likely to be formed at the interface between the semiconductor 661 and the semiconductor 662 and the interface between the semiconductor 662 and the semiconductor 663.

Note that in the case of using an In-M-Zn oxide as the semiconductor 661, when the summation of In and M is assumed to be 100 atomic %, the proportions of In and M are preferably set to be less than 50 atomic % and greater than 50 atomic %, respectively, more preferably less than 25 atomic % and greater than 75 atomic %, respectively. In the case where the semiconductor 661 is formed by a sputtering method, a sputtering target with the above composition, for example, a sputtering target containing In, M, and Zn at an atomic ratio of 1:3:2, is preferably used.

In the case where an In-M-Zn oxide is used for the semiconductor 662 and the summation of In and M is assumed to be 100 atomic %, the proportions of In and M are preferably set to be greater than 25 atomic % and less than 75 atomic %, respectively, and more preferably greater than 34 atomic % and less than 66 atomic %, respectively. In the case where the semiconductor 662 is formed by a sputtering method, a sputtering target with the above composition, for example, a sputtering target containing In, M, and Zn at an atomic ratio of 1:1:1, 1:1:1.2, 2:1:3, 3:1:2, or 4:2:4.1, is preferably used. In particular, when a sputtering target containing In, Ga, and Zn at an atomic ratio of 4:2:4.1 is used, the semiconductor 662 may contain In, Ga, and Zn at an atomic ratio of around 4:2:3.

In the case of using an In-M-Zn oxide as the semiconductor 663, when the summation of In and M is assumed to be 100 atomic %, the proportions of In and M are preferably set to be less than 50 atomic % and greater than 50 atomic %, respectively, more preferably less than 25 atomic % and greater than 75 atomic %, respectively. Note that the semiconductor 663 and the semiconductor 661 may be formed using the same type of oxide. Note that the semiconductor 661 and/or the semiconductor 663 do/does not necessarily contain indium in some cases. For example, the semiconductor 661 and/or the semiconductor 663 may be gallium oxide.

Figure 10A:
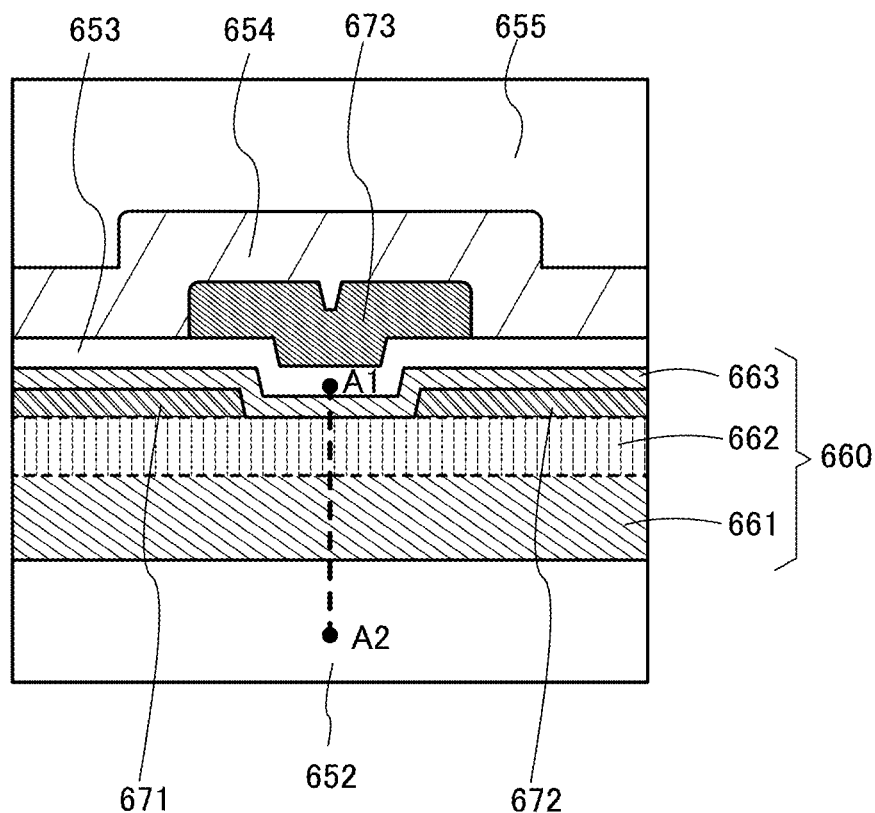
FIGS. 10A and 10B are a cross-sectional view of a transistor and an energy band diagram of the transistor.
Figure 10B:
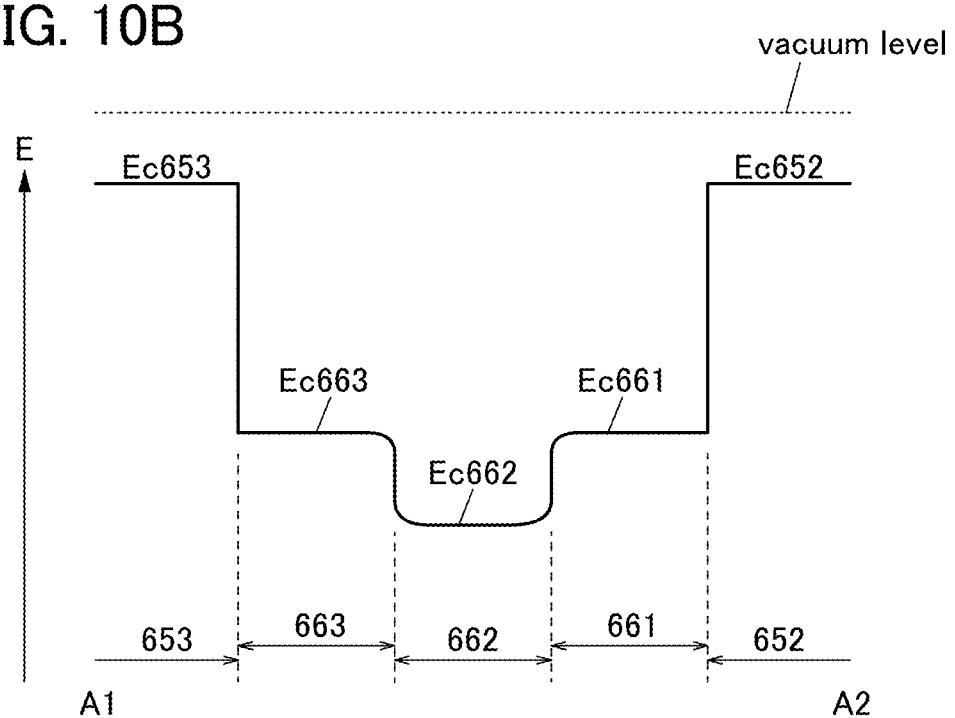

Next, a function and an effect of the semiconductor 660 in which the semiconductor 661, the semiconductor 662, and the semiconductor 663 are stacked will be described using an energy band diagram in FIG. 10B. FIG. 10A is an enlarged view of the channel portion of the transistor 600 illustrated in FIG. 9B. FIG. 10B shows an energy band diagram of a portion along chain line A1-A2 in FIG. 10A. In other words, FIG. 10B illustrates the energy band diagram of a channel formation region of the transistor 600.

In FIG. 10B, Ec652, Ec661, Ec662, Ec663, and Ec653 indicate the energy of the conduction band minimum of the insulating film 652, the semiconductor 661, the semiconductor 662, the semiconductor 663, and the insulating film 653, respectively.

Here, a difference in energy between the vacuum level and the conduction band minimum (the difference is also referred to as electron affinity) corresponds to a value obtained by subtracting an energy gap from a difference in energy between the vacuum level and the valence band maximum (the difference is also referred to as ionization potential). The energy gap can be measured using a spectroscopic ellipsometer. The energy difference between the vacuum level and the valence band maximum can be measured using an ultraviolet photoelectron spectroscopy (UPS) device.

Since the insulating film 652 and the insulating film 653 are insulators, Ec652 and Ec653 are closer to the vacuum level than Ec661, Ec662, and Ec663. That is, the insulating film 652 and the insulating film 653 have a smaller electron affinity than the semiconductor 661, the semiconductor 662, and the semiconductor 663.

As the semiconductor 662, an oxide having an electron affinity higher than those of the semiconductors 661 and 663 is used. For example, as the semiconductor 662, an oxide having an electron affinity higher than those of the semiconductors 661 and 663 by 0.07 eV or higher and 1.3 eV or lower, preferably 0.1 eV or higher and 0.7 eV or lower, more preferably 0.15 eV or higher and 0.4 eV or lower is used. Note that the electron affinity refers to an energy difference between the vacuum level and the conduction band minimum.

An indium gallium oxide has a small electron affinity and a high oxygen-blocking property. Therefore, the semiconductor 663 preferably includes an indium gallium oxide. The gallium atomic ratio [Ga/(In+Ga)] is, for example, higher than or equal to 70%, preferably higher than or equal to 80%, more preferably higher than or equal to 90%.

At this time, when a gate voltage is applied, a channel is formed in the semiconductor 662 having the highest electron affinity among the semiconductors 661 to 663.

Here, in some cases, there is a mixed region of the semiconductor 661 and the semiconductor 662 between the semiconductor 661 and the semiconductor 662. Furthermore, in some cases, there is a mixed region of the semiconductor 662 and the semiconductor 663 between the semiconductor 662 and the semiconductor 663. The mixed region has a low interface state density. For that reason, the stack of the semiconductor 661, the semiconductor 662, and the semiconductor 663 has a band structure where energy at each interface and in the vicinity of the interface is changed continuously (also referred to as a band structure with a continuous junction).

At this time, electrons move mainly in the semiconductor 662, not in the semiconductor 661 and the semiconductor 663. As described above, when the interface state density at the interface between the semiconductor 661 and the semiconductor 662 and the interface state density at the interface between the semiconductor 662 and the semiconductor 663 are decreased, electron movement in the semiconductor 662 is less likely to be inhibited and the on-sate current of the transistor can be increased.

As factors of inhibiting electron movement are decreased, the on-state current of the transistor can be increased. For example, in the case where there is no factor of inhibiting electron movement, electrons are assumed to be efficiently moved. Electron movement is inhibited, for example, in the case where physical unevenness in a channel formation region is large.

To increase the on-state current of the transistor, for example, root mean square (RMS) roughness with a measurement area of 1 µm×1 µm of a top surface or a bottom surface of the semiconductor 662 (a formation surface; here, the semiconductor 661) is less than 1 nm, preferably less than 0.6 nm, more preferably less than 0.5 nm, still more preferably less than 0.4 nm. The average surface roughness (also referred to as Ra) with the measurement area of 1 µm×1 µm is less than 1 nm, preferably less than 0.6 nm, more preferably less than 0.5 nm, still more preferably less than 0.4 nm. The maximum difference (P–V) with the measurement area of 1 µm×1 µm is less than 10 nm, preferably less than 9 nm, more preferably less than 8 nm, still more preferably less than 7 nm. Note that RMS roughness, Ra, and P–V can be measured using a scanning probe microscope SPA-500 manufactured by SII Nano Technology Inc.

The electron movement is also inhibited, for example, in the case where the density of defect states is high in a region where a channel is formed.

For example, in the case where the semiconductor 662 contains oxygen vacancies (also denoted by $V_O$), donor levels are formed by entry of hydrogen into sites of oxygen vacancies in some cases. A state in which hydrogen enters sites of oxygen vacancies is denoted by $V_OH$ in the following description in some cases. $V_OH$ is a factor of decreasing the on-state current of the transistor because $V_OH$ scatters electrons. Note that sites of oxygen vacancies become more stable by entry of oxygen than by entry of hydrogen. Thus, by decreasing oxygen vacancies in the semiconductor 662, the on-state current of the transistor can be increased in some cases.

For example, the hydrogen concentration at a certain depth in the semiconductor 662 or in a certain region of the semiconductor 662, which is measured by secondary ion mass spectrometry (SIMS), is higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, and still further preferably higher than or equal to $1\times10^{16}$ atoms/cm$^3$ and lower than or equal to $5\times10^{18}$ atoms/cm$^3$.

To decrease oxygen vacancies in the semiconductor 662, for example, there is a method in which excess oxygen in the insulating film 652 is moved to the semiconductor 662 through the semiconductor 661. In this case, the semiconductor 661 is preferably a layer having oxygen permeability (a layer through which oxygen can permeate).

In the case where the transistor has an s-channel structure, a channel is formed in the whole of the semiconductor 662. Therefore, as the semiconductor 662 has a larger thickness, a channel region becomes larger. In other words, the thicker the semiconductor 662 is, the higher the on-state current of the transistor is.

Moreover, the thickness of the semiconductor 663 is preferably as small as possible to increase the on-state current of the transistor. For example, the semiconductor 663 has a region with a thickness of less than 10 nm, preferably less than or equal to 5 nm, more preferably less than or equal to 3 nm. Meanwhile, the semiconductor 663 has a function of blocking entry of elements other than oxygen (such as hydrogen and silicon) included in the adjacent insulator into the semiconductor 662 where a channel is formed. For this reason, it is preferable that the semiconductor 663 have a certain thickness. For example, the semiconductor 663 has a region with a thickness of greater than or equal to 0.3 nm, preferably greater than or equal to 1 nm, more preferably greater than or equal to 2 nm. The semiconductor 663 preferably has an oxygen blocking property to suppress outward diffusion of oxygen released from the insulating film 652 and the like.

To improve reliability, preferably, the thickness of the semiconductor 661 is large and the thickness of the semiconductor 663 is small. For example, the semiconductor 661 has a region with a thickness of greater than or equal to 10 nm, preferably greater than or equal to 20 nm, more preferably greater than or equal to 40 nm, still more preferably greater than or equal to 60 nm. When the thickness of the semiconductor 661 is made large, the distance from an interface between the adjacent insulator and the semiconductor 661 to the semiconductor 662 in which a channel is formed can be large. However, to prevent the productivity of the semiconductor device from being decreased, the semiconductor 661 has a region with a thickness of, for example, less than or equal to 200 nm, preferably less than or equal to 120 nm, more preferably less than or equal to 80 nm.

For example, a region with a silicon concentration of higher than or equal to $1\times10^{16}$ atoms/cm$^3$ and lower than $1\times10^{19}$ atoms/cm$^3$, preferably higher than or equal to $1\times10^{16}$ atoms/cm$^3$ and lower than $5\times10^{18}$ atoms/cm$^3$, and further preferably higher than or equal to $1\times10^{16}$ atoms/cm$^3$ and lower than $2\times10^{18}$ atoms/cm$^3$ which is measured by SIMS analysis is provided between the semiconductor 662 and the semiconductor 661. A region with a silicon concentration of higher than or equal to $1\times10^{16}$ atoms/cm$^3$ and lower than $1\times10^{19}$ atoms/cm$^3$, preferably higher than or equal to $1\times10^{16}$ atoms/cm$^3$ and lower than $5\times10^{18}$ atoms/cm$^3$, and further preferably higher than or equal to $1\times10^{16}$ atoms/cm$^3$ and lower than $2\times10^{18}$ atoms/cm$^3$ which is measured by SIMS is provided between the semiconductor 662 and the semiconductor 663.

It is preferable to reduce the concentration of hydrogen in the semiconductor 661 and the semiconductor 663 in order to reduce the concentration of hydrogen in the semiconductor 662. The semiconductor 661 and the semiconductor 663 each have a region in which the concentration of hydrogen measured by SIMS is higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, and still further preferably higher than or equal to $1\times10^{16}$ atoms/cm$^3$ and lower than or equal to $5\times10^{18}$ atoms/cm$^3$. It is preferable to reduce the concentration of nitrogen in the semiconductor 661 and the semiconductor 663 in order to reduce the concentration of nitrogen in the semiconductor 662. The semiconductor 661 and the semiconductor 663 each have a region in which the concentration of nitrogen measured by SIMS is higher than or equal to $1\times10^{16}$ atoms/cm$^3$ and lower than $5\times10^{19}$ atoms/cm$^3$, preferably higher than or equal to $1\times10^{16}$ atoms/cm$^3$ and lower than or equal to $5\times10^{18}$ atoms/cm$^3$, further preferably higher than or equal to $1\times10^{16}$ atoms/cm$^3$ and lower than or equal to $1\times10^{18}$ atoms/cm$^3$, and still further preferably higher than or equal to $1\times10^{16}$ atoms/cm$^3$ and lower than or equal to $5\times10^{17}$ atoms/cm$^3$.

The above three-layer structure is an example. For example, a two-layer structure without the semiconductor 661 or the semiconductor 663 may be employed. A four-layer structure in which any one of the semiconductors described as examples of the semiconductor 661, the semiconductor 662, and the semiconductor 663 is provided under or over the semiconductor 661 or under or over the semiconductor 663 may be employed. An n-layer structure (n is an integer of 5 or more) in which any one of the semiconductors described as examples of the semiconductor 661, the semiconductor 662, and the semiconductor 663 is provided at two or more of the following positions: over the semiconductor 661, under the semiconductor 661, over the semiconductor 663, and under the semiconductor 663.

<<Method for Manufacturing Transistor>>

A method for manufacturing the transistor 600 illustrated in FIGS. 9A to 9D will be described below with reference to FIGS. 11A to 11E and FIGS. 12A to 12D. Note that cross-sectional views of the transistor in the channel length direction (cross-sectional views along dashed-dotted line Y1-Y2 in FIG. 9A) are shown on the left side of FIGS. 11A to 11E and FIGS. 12A to 12D, and cross-sectional views of the transistor in the channel width direction (cross-sectional views along dashed-dotted line X1-X2 in FIG. 9A) are shown on the right side of FIGS. 11A to 11E and FIGS. 12A to 12D.

Figure 11A:
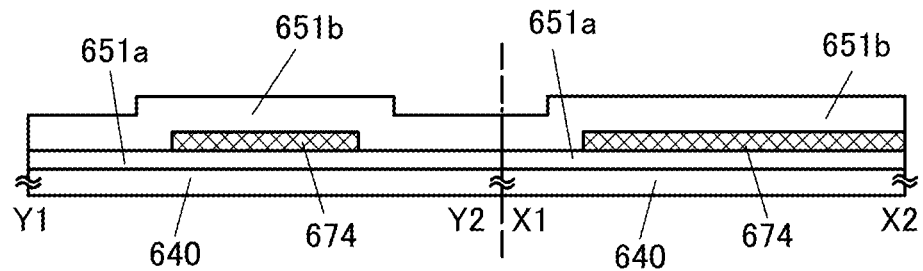
FIGS. 11A to 11E are cross-sectional views illustrating a method for manufacturing a transistor.

First, an insulating film 651a is formed over the substrate 640. Then, the conductive film 674 is formed, followed by an insulating film 651b (FIG. 11A).

As the substrate 640, for example, an insulator substrate, a semiconductor substrate, or a conductor substrate may be used. As the insulator substrate, for example, a glass substrate, a quartz substrate, a sapphire substrate, a stabilized zirconia substrate (e.g., an yttria-stabilized zirconia substrate), or a resin substrate is used. As the semiconductor substrate, for example, a single material semiconductor substrate made of silicon, germanium, or the like; a compound semiconductor substrate made of silicon carbide, silicon germanium, gallium arsenide, indium phosphide, zinc oxide, or gallium oxide; or the like is used. A semiconductor substrate in which an insulator region is provided in the above semiconductor substrate, e.g., a silicon on insulator (SOI) substrate may also be used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like may also be used. Alternatively, any of these substrates over which an element is provided may be used.

As the element provided over the substrate, a capacitor, a resistor, a switching element, a light-emitting element, a memory element, or the like is used.

Alternatively, a flexible substrate may be used as the substrate 640. As a method for providing a transistor over a flexible substrate, there is a method in which the transistor is formed over a non-flexible substrate and then the transistor is separated and transferred to the substrate 640 which is a flexible substrate. In that case, a separation layer is preferably provided between the non-flexible substrate and the transistor. As the substrate 640, a sheet, a film, or a foil containing a fiber may be used. The substrate 640 may have elasticity. The substrate 640 may have a property of returning to its original shape when bending or pulling is stopped. Alternatively, the substrate 640 may have a property of not returning to its original shape. The thickness of the substrate 640 is, for example, greater than or equal to 5 μm and less than or equal to 700 μm, preferably greater than or equal to 10 μm and less than or equal to 500 μm, more preferably greater than or equal to 15 μm and less than or equal to 300 μm. When the substrate 640 has a small thickness, the weight of the semiconductor device can be reduced. When the substrate 640 has a small thickness, even in the case of using glass or the like, the substrate 640 may have elasticity or a property of returning to its original shape when bending or pulling is stopped. Therefore, an impact applied to the semiconductor device over the substrate 640, which is caused by dropping or the like, can be reduced. That is, a durable semiconductor device can be provided.

For the substrate 640 which is a flexible substrate, for example, metal, an alloy, resin, glass, or fiber thereof can be used. The flexible substrate 640 preferably has a lower coefficient of linear expansion because deformation due to an environment is suppressed. The flexible substrate 640 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used for the flexible substrate 640 because of its low coefficient of linear expansion.

As a material for the insulating films 651a and 651b, a material containing silicon oxide, silicon nitride, silicon oxynitride, or silicon nitride oxide is preferably used. Alternatively, a metal oxide such as aluminum oxide, aluminum oxynitride, gallium oxide, gallium oxynitride, yttrium oxide, yttrium oxynitride, hafnium oxide, or hafnium oxynitride can be used. Note that in this specification, "oxynitride" refers to a material that contains oxygen at a higher proportion than nitrogen, and a "nitride oxide" refers to a material that contains nitrogen at a higher proportion than oxygen.

The insulating films 651a and 651b may be formed using silicon oxide with high step coverage which is formed by reacting tetraethyl orthosilicate (TEOS), silane, or the like with oxygen, nitrous oxide, or the like.

The insulating films 651a and 651b may be formed by a sputtering method, a chemical vapor deposition (CVD) method (including a thermal CVD method, a metal organic CVD (MOCVD) method, a plasma enhanced CVD (PECVD) method, and the like), a molecular beam epitaxy (MBE) method, an atomic layer deposition (ALD) method, a pulsed laser deposition (PLD) method, or the like. In particular, it is preferable that the insulating films be formed by a CVD method and further preferably a plasma CVD method, because coverage can be further improved. It is preferable to use a thermal CVD method, an MOCVD method, or an ALD method in order to reduce plasma damage.

In the case of using a semiconductor substrate as the substrate 640, the insulating film 651a may be formed using a thermal oxide film.

The conductive film 674 preferably has a single-layer structure or a stacked-layer structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the conductive films are preferably formed using a low-resistance conductive material such as aluminum or copper. The conductive films are further preferably formed using a Cu—Mn alloy, in which case manganese oxide formed at the interface with an insulator containing oxygen has a function of preventing Cu diffusion.

The conductive film 674 can be formed by a sputtering method, a CVD method (including a thermal CVD method, an MOCVD method, a PECVD method, and the like), an MBE method, an ALD method, a PLD method, or the like.

Figure 11B:
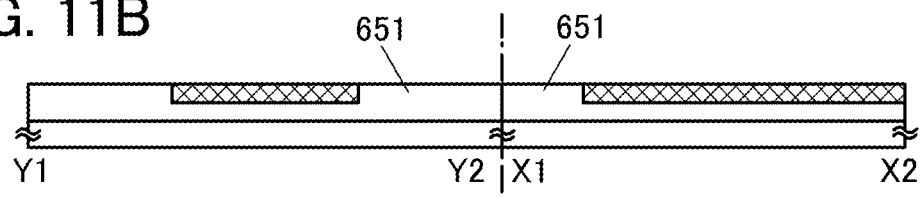

Next, a surface of the insulating film 651*b* is subjected to planarization by a chemical mechanical polishing (CMP) method (see FIG. 11B).

As the insulating film 651*b*, a planarization film may be used. At this time, a CMP method or the like is not necessarily used for planarization. The planarization film can be formed by, for example, an atmospheric pressure CVD method, a coating method, or the like. An example of a film which can be formed by an atmospheric pressure CVD method is a film of boron phosphorus silicate glass (BPSG). Furthermore, an example of a film which can be formed by a coating method is a film of hydrogen silsesquioxane (HSQ).

Hereinafter, the insulating films 651*a* and 651*b* are collectively referred to as the insulating film 651.

Figure 11C:
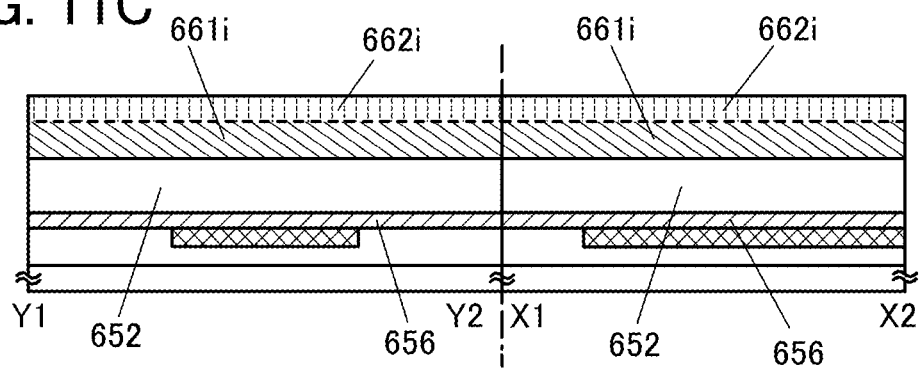
Figure 11D:
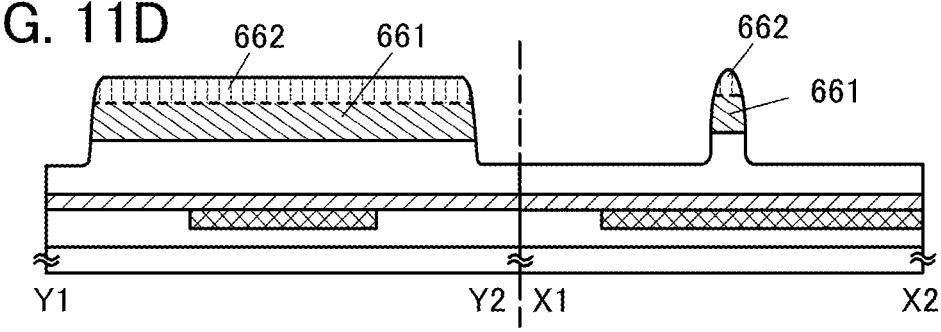
Figure 11E:
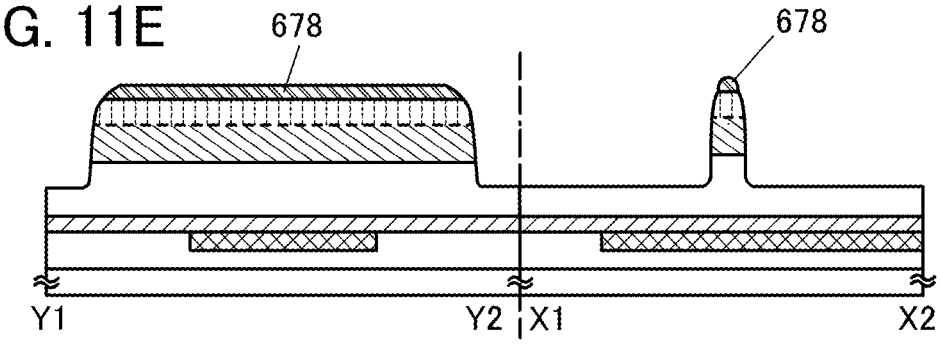

Next, the insulating film 656, the insulating film 652, a semiconductor 661*i*, and a semiconductor 662*i* are formed (see FIG. 11C).

The insulating films 656 and 652 may be formed by a sputtering method, a CVD method (including a thermal CVD method, an MOCVD method, a PECVD method, and the like), an MBE method, an ALD method, a PLD method, or the like.

The insulating film 656 preferably has a blocking effect against oxygen, hydrogen, water, alkali metal, alkaline earth metal, and the like. The insulating film 656 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like, may be provided. As the above oxide insulating film, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

The insulating film 652 preferably contains an oxide that can supply oxygen to the semiconductor 660. For example, for the insulating film 652, a material containing silicon oxide or silicon oxynitride is preferably used. Alternatively, a metal oxide such as aluminum oxide, aluminum oxynitride, gallium oxide, gallium oxynitride, yttrium oxide, yttrium oxynitride, hafnium oxide, or hafnium oxynitride can be used.

To make the insulating film 652 contain excess oxygen, the insulating film 652 may be formed in an oxygen atmosphere, for example. Alternatively, a region containing excess oxygen may be formed by introducing oxygen into the insulating film 652 that has been formed. Both the methods may be combined.

For example, oxygen (at least including any of oxygen radicals, oxygen atoms, and oxygen ions) is introduced into the insulating film 652 which has been formed, whereby a region containing excess oxygen is formed. Oxygen can be introduced by an ion implantation method, an ion doping method, a plasma immersion ion implantation method, plasma treatment, or the like.

A gas containing oxygen can be used for oxygen introducing treatment. As the gas containing oxygen, oxygen, nitrous oxide, nitrogen dioxide, carbon dioxide, carbon monoxide, and the like can be used. Furthermore, a rare gas may be included in the gas containing oxygen for the oxygen introduction treatment. Moreover, hydrogen or the like may be included.

After the insulating film 652 is formed, the insulating film 652 may be subjected to planarization treatment using a CMP method or the like to improve the planarity the top surface thereof.

The semiconductors 661*i* and 662*i* are preferably formed successively without contact with the air. The semiconductors 661*i* and 662*i* are formed by a sputtering method, a CVD method (including a thermal CVD method, an MOCVD method, a PECVD method, and the like), an MBE method, a PLD method, an ALD method, or the like.

The description of the semiconductors 661 and 662 in FIGS. 9A to 9D can be referred to for a material that can be used for the semiconductors 661*i* and 662*i*.

Note that in the case where In—Ga—Zn oxide layers formed by an MOCVD method are used as the semiconductors 661*i* and 662*i*, trimethylindium, trimethylgallium, dimethylzinc, and the like may be used as source gases. The source gases are not limited to the above combination, and triethylindium or the like may be used instead of trimethylindium. Alternatively, triethylgallium or the like may be used instead of trimethylgallium. Further alternatively, diethylzinc or the like may be used instead of dimethylzinc.

Here, after the semiconductor 661*i* is formed, oxygen may be introduced into the semiconductor 661*i*. For example, oxygen (at least including any of oxygen radicals, oxygen atoms, and oxygen ions) is introduced into the semiconductor 661*i* which has been formed, whereby a region containing excess oxygen is formed. Oxygen can be introduced by an ion implantation method, an ion doping method, a plasma immersion ion implantation method, plasma treatment, or the like.

A gas containing oxygen can be used for oxygen introducing treatment. As the gas containing oxygen, oxygen, nitrous oxide, nitrogen dioxide, carbon dioxide, carbon monoxide, and the like can be used. Furthermore, a rare gas may be included in the gas containing oxygen for the oxygen introduction treatment. Moreover, hydrogen or the like may be included.

After the semiconductors 661*i* and 662*i* are formed, heat treatment is preferably performed. The heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the heat treatment may be performed in such a manner that heat treatment is performed in an inert gas atmosphere, and then another heat treatment is performed in an atmosphere containing an oxidizing gas at 10 ppm or more, in order to compensate for released oxygen. The heat treatment may be performed directly after the formation of oxide semiconductor films or may be performed after the oxide semiconductor films are processed into the island-shaped semiconductors 661 and 662. Through the heat treatment, oxygen can be supplied to the semiconductors from the insulating film 652 and the oxide film; thus, oxygen vacancies in the semiconductors can be reduced.

Then, a resist mask is formed by a method similar to that described above, and an unnecessary portion is removed by etching. Then, the resist mask is removed. In this manner, a stacked-layer structure including the island-shaped semiconductors 661 and 662 can be formed (see FIG. 11D). Note that, in some cases, part of the insulating film 652 is etched in the etching of the semiconductor films to reduce the thickness of a portion of the insulating film 652 which is not covered with the semiconductors 661 and 662. For this reason, the insulating film 652 is preferably formed to have a large thickness so as not to be removed by the etching.

Note that there is a possibility that the resist is totally removed depending on the etching conditions of the semiconductor films; therefore, what is called a hard mask formed of a material with high resistance to etching, such as an inorganic film or a metal film, may be used. Here, for example, a conductive film is used as a hard mask 678, and the semiconductor film is processed using the hard mask 678 to form the semiconductors 661 and 662 (see FIG. 11E).

The hard mask 678 preferably has a single-layer structure or a stacked-layer structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the conductive films are preferably formed using a low-resistance conductive material such as aluminum or copper. The conductive films are further preferably formed using a Cu—Mn alloy, in which case manganese oxide formed at the interface with an insulator containing oxygen has a function of preventing Cu diffusion.

The hard mask 678 is preferably formed using a conductive oxide including noble metal, such as iridium oxide, ruthenium oxide, or strontium ruthenate. Such a conductive oxide hardly takes oxygen from an oxide semiconductor even when it is in contact with the oxide semiconductor and hardly generates oxygen vacancies in the oxide semiconductor.

The hard mask 678 can be formed by a sputtering method, a CVD method (including a thermal CVD method, an MOCVD method, a PECVD method, and the like), an MBE method, an ALD method, a PLD method, or the like.

Figure 12A:
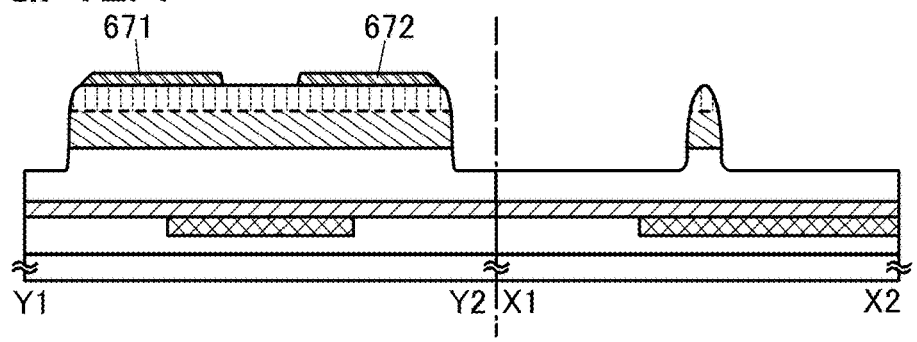
FIGS. 12A to 12D are cross-sectional views illustrating a method for manufacturing a transistor.
Figure 12B:
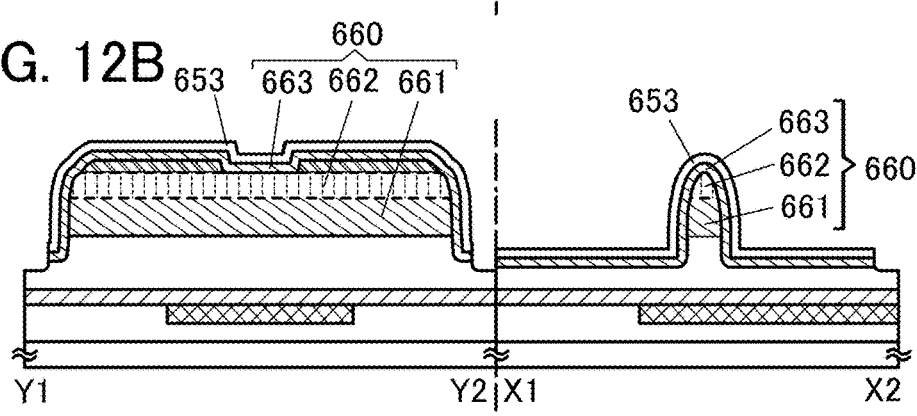

Next, a resist mask is formed, and the hard mask 678 is processed into the conductive films 671 and 672 by etching (see FIG. 12A). Note that in some cases, upper portions of the semiconductor 662 and the insulating film 652 are partly etched in etching of the hard mask 678, so that a portion not overlapping with the conductive film 671 or 672 is thinned. For this reason, the semiconductor 662 is preferably formed to have a large thickness in advance in consideration of the etching depth.

Then, the semiconductor 663 and the insulating film 653 are formed. After that, a resist mask is formed, the semiconductor 663 and the insulating film 653 are processed by etching, and the resist mask is removed (see FIG. 12B).

Figure 12C:
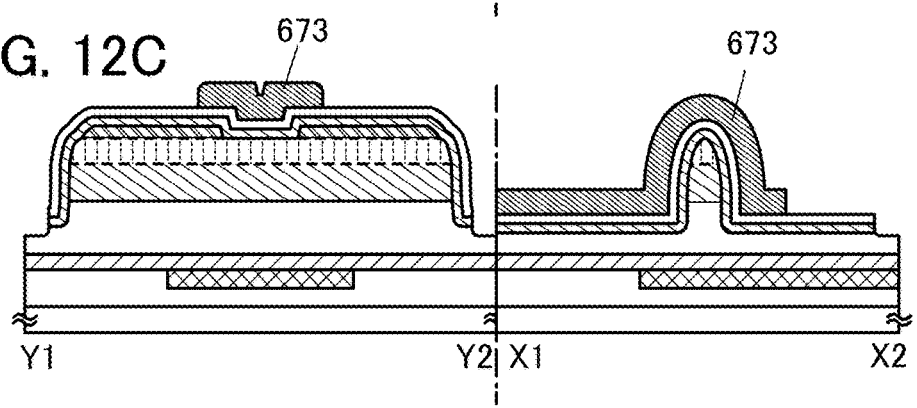
Figure 12D:
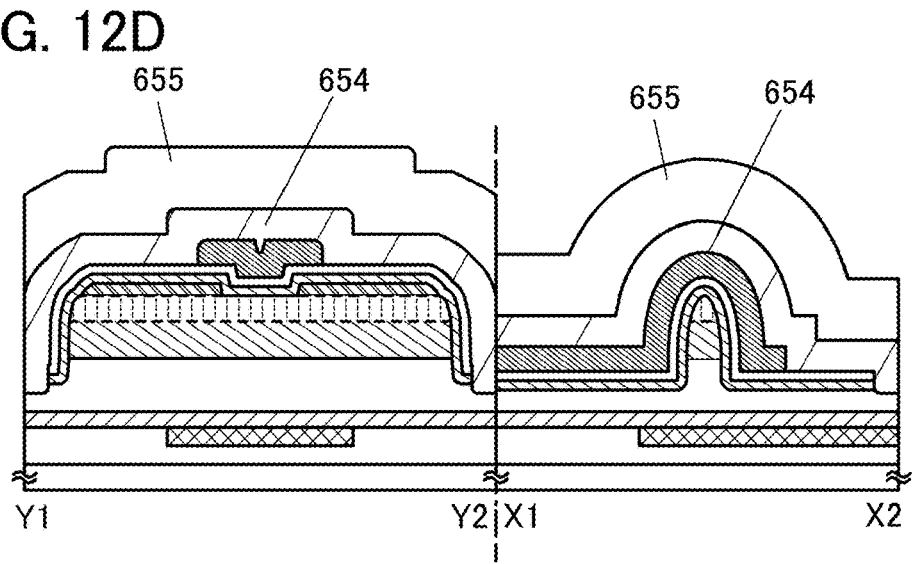

Next, the conductive film 673 is deposited, a resist mask is formed, the conductive film 673 is processed by etching, and the resist mask is removed, whereby a gate electrode is formed (see FIG. 12C).

The semiconductor 663, the insulating film 653, and the conductive film 673 may be formed by a sputtering method, a CVD method (including a thermal CVD method, an MOCVD method, a PECVD method, and the like), an MBE method, a PLD method, an ALD method, or the like. In particular, it is preferable to use a CVD method and further preferably a plasma CVD method, because coverage can be further improved. It is preferable to use a thermal CVD method, an MOCVD method, or an ALD method in order to reduce plasma damage.

The semiconductor 663 and the insulating film 653 may be etched after the conductive film 673 is formed. The etching may be performed with a resist mask, for example. Alternatively, the insulating film 653 and the semiconductor 663 may be etched using the conductive film 673 as a mask.

After the semiconductor 663 is formed, oxygen may be introduced into the semiconductor 663. For example, oxygen (at least including any of oxygen radicals, oxygen atoms, and oxygen ions) is introduced into the semiconductor 663 which has been formed, whereby a region containing excess oxygen is formed. Oxygen can be introduced by an ion implantation method, an ion doping method, a plasma immersion ion implantation method, plasma treatment, or the like.

A gas containing oxygen can be used for oxygen introducing treatment. As the gas containing oxygen, oxygen, nitrous oxide, nitrogen dioxide, carbon dioxide, carbon monoxide, and the like can be used. Furthermore, a rare gas may be included in the gas containing oxygen for the oxygen introduction treatment. Moreover, hydrogen or the like may be included.

The description of the semiconductor 663 in FIGS. 9A to 9D can be referred to for a material that can be used for the semiconductor 663.

The insulating film 653 can be formed using an insulating film containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating film 653 may be a stack including any of the above materials. The insulating film 653 may contain lanthanum (La), nitrogen, or zirconium (Zr) as an impurity.

An example of a stacked-layer structure of the insulating film 653 is described. The insulating film 653 contains oxygen, nitrogen, silicon, or hafnium, for example. Specifically, the insulating film 653 preferably includes hafnium oxide and silicon oxide or silicon oxynitride.

Hafnium oxide has a higher dielectric constant than silicon oxide and silicon oxynitride. Therefore, the thickness of the insulating film 653 can be made large as compared with the case where silicon oxide is used; as a result, a leakage current due to a tunnel current can be low. That is, it is possible to provide a transistor with a low off-state current.

Next, the insulating film 654 is formed. The insulating film 654 has a blocking effect against oxygen, hydrogen, water, alkali metal, alkaline earth metal, and the like. The insulating film 654 can be formed by a sputtering method, a CVD method (including a thermal CVD method, an MOCVD method, a PECVD method, and the like), an MBE method, an ALD method, a PLD method, or the like, for example. In particular, it is preferable that the insulating film be formed by a CVD method and further preferably a plasma CVD method, because coverage can be further improved. It is preferable to use a thermal CVD method, an MOCVD method, or an ALD method in order to reduce plasma damage.

The insulating film 654 preferably has a blocking effect against oxygen, hydrogen, water, alkali metal, alkaline earth metal, and the like. The insulating film 654 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like, may be provided. As the oxide insulating film, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

An aluminum oxide film is preferably used as the insulating film 654 because it is highly effective in preventing transmission of both oxygen and impurities such as hydrogen and moisture. In addition, oxygen contained in the aluminum oxide film can be diffused into the semiconductor 660.

After the insulating film 654 is formed, heat treatment is preferably performed. Through this heat treatment, oxygen can be supplied to the semiconductor 660 from the insulating film 652 or the like; thus, oxygen vacancies in the semiconductor 660 can be reduced. Because oxygen released from the insulating film 652 is blocked by the insulating film 656 and the insulating film 654 at this time, the oxygen can be effectively confined. Thus, the amount of oxygen supplied to the semiconductor 660 can be increased, so that oxygen vacancies in the semiconductor 660 can be effectively reduced.

Next, the insulating film 655 is formed. The insulating film 655 can be formed by a sputtering method, a CVD method (including a thermal CVD method, an MOCVD method, a PECVD method, and the like), an MBE method, an ALD method, a PLD method, or the like. In particular, it is preferable that the insulating film be formed by a CVD method and further preferably a plasma CVD method, because coverage can be improved. It is preferable to use a thermal CVD method, an MOCVD method, or an ALD method in order to reduce plasma damage. In the case where the insulating film 655 is formed using an organic insulating material such as an organic resin, a coating method such as a spin coating method may be used. After the insulating film 655 is formed, a top surface thereof is preferably subjected to planarization treatment.

The insulating film 655 can be formed using an insulator containing at least one of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like. Alternatively, for the insulating film 655, an organic resin such as a polyimide resin, a polyamide resin, an acrylic resin, a siloxane resin, an epoxy resin, or a phenol resin can be used. The insulating film 655 may be a stack including any of the above materials.

<<Structure Example 2 of Transistor>>

Figure 13:
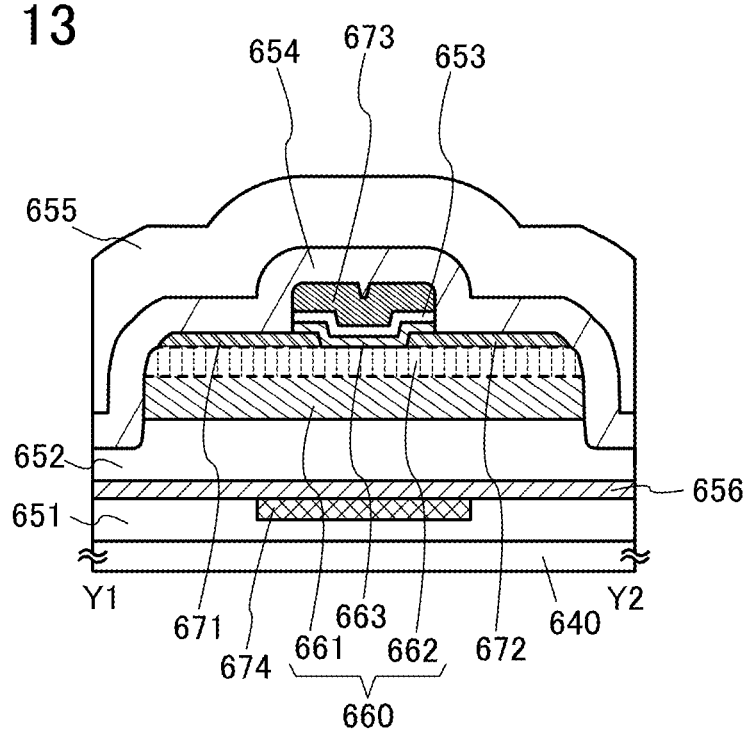
FIG. 13 is a cross-sectional view illustrating a structure example of a transistor.

In the transistor 600 illustrated in FIGS. 9A to 9D, the semiconductor 663 and the insulating film 653 may be etched at the same time when the conductive film 673 is formed by etching. FIG. 13 illustrates an example of such a case.

FIG. 13 illustrates the case where the semiconductor 663 and the insulating film 653 in FIG. 9B are provided only under the conductive film 673.

<<Structure Example 3 of Transistor>>

Figure 14:
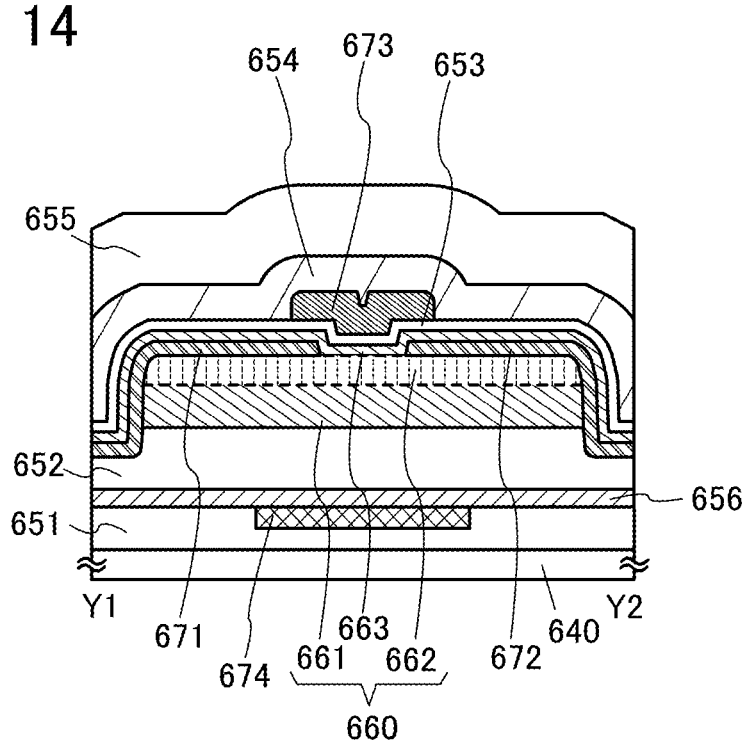
FIG. 14 is a cross-sectional view illustrating a structure example of a transistor.

In the transistor 600 illustrated in FIGS. 9A to 9D, the conductive films 671 and 672 may be in contact with side surfaces of the semiconductors 661 and 662. FIG. 14 illustrates an example of such a case.

FIG. 14 illustrates the case where the conductive films 671 and 672 in FIG. 9B are in contact with the side surfaces of the semiconductors 661 and 662.

<<Structure Example 4 of Transistor>>

Figure 15:
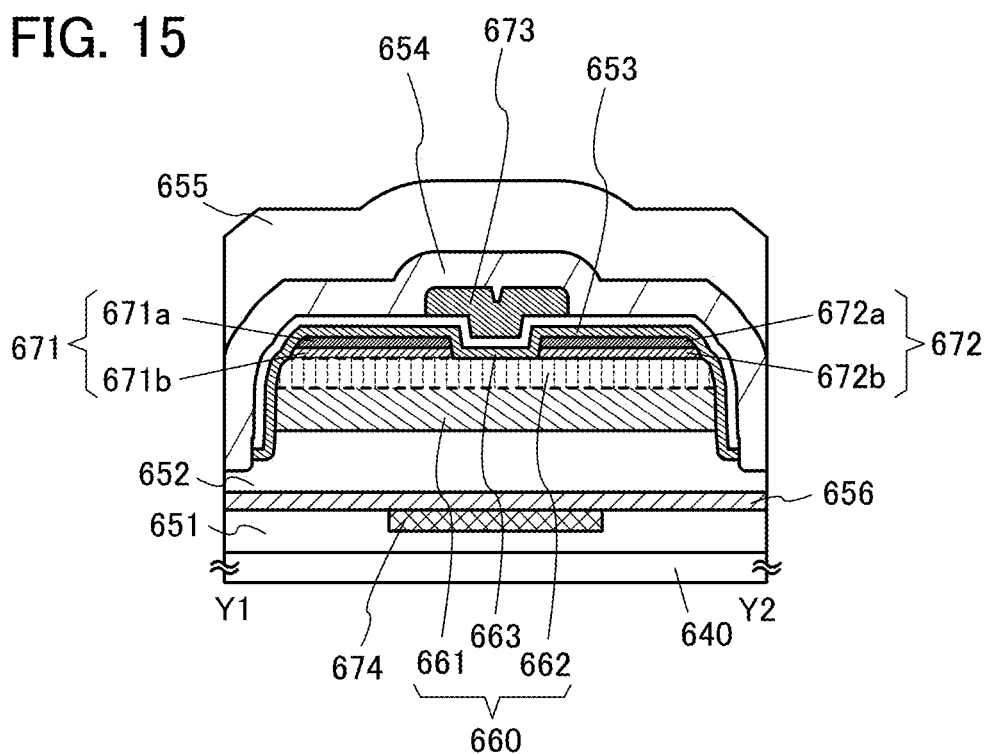
FIG. 15 is a cross-sectional view illustrating a structure example of a transistor.

In the transistor 600 illustrated in FIGS. 9A to 9D, the conductive film 671 may be a stack including a conductive film 671a and a conductive film 671b. Furthermore, the conductive film 672 may be a stack including a conductive film 672a and a conductive film 672b. FIG. 15 illustrates an example of such a case.

FIG. 15 illustrates the case where the conductive film 671 and the conductive film 672 in FIG. 9B are a stack including the conductive films 671a and 671b and a stack including the conductive films 672a and 672b, respectively.

The conductive films 671b and 672b may be formed using a transparent conductor, an oxide semiconductor, a nitride semiconductor, or an oxynitride semiconductor, for example. The conductive films 671b and 672b may be formed using, for example, a film containing indium, tin, and oxygen, a film containing indium and zinc, a film containing indium, tungsten, and zinc, a film containing tin and zinc, a film containing zinc and gallium, a film containing zinc and aluminum, a film containing zinc and fluorine, a film containing zinc and boron, a film containing tin and antimony, a film containing tin and fluorine, a film containing titanium and niobium, or the like. Alternatively, any of these films may contain hydrogen, carbon, nitrogen, silicon, germanium, or argon.

The conductive films 671b and 672b may have a property of transmitting visible light. Alternatively, the conductive films 671b and 672b may have a property of not transmitting visible light, ultraviolet light, infrared light, or X-rays by reflecting or absorbing it. In some cases, such a property can suppress a change in electrical characteristics of the transistor due to stray light.

The conductive films 671b and 672b may preferably be formed using a layer which does not form a Schottky barrier with the semiconductor 662 or the like. Accordingly, on-state characteristics of the transistor can be improved.

Each of the conductive films 671a and 672a may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. For example, an alloy film or a compound film may be used, and a conductor containing aluminum, a conductor containing copper and titanium, a conductor containing copper and manganese, a conductor containing indium, tin, and oxygen, a conductor containing titanium and nitrogen, or the like may be used.

Note that the conductive films 671b and 672b may preferably be formed using a film having a resistance higher than that of the conductive films 671a and 672a. The conductive films 671b and 672b may preferably be formed using a film having a resistance lower than that of the channel of the transistor. For example, the conductive films 671b and 672b may have a resistivity higher than or equal to 0.1 $\Omega$cm and lower than or equal to 100 $\Omega$cm, higher than or equal to 0.5 $\Omega$cm and lower than or equal to 50 $\Omega$cm, or higher than or equal to 1 $\Omega$cm and lower than or equal to 10 $\Omega$cm. The conductive films 671b and 672b having a resistivity within the above range can reduce electric field concentration in a boundary portion between the channel and the drain. Therefore, a change in electrical characteristics of the transistor can be suppressed. In addition, a punch-through current generated by an electric field from the drain can be reduced. Thus, a transistor with a small channel length can have favorable saturation characteristics. Note that in a circuit configuration where the source and the drain do not interchange, only one of the conductive films 671*b* and 672*b* (e.g., the film on the drain side) may preferably be provided.

<<Structure Example 5 of Transistor>>

Figure 16A:
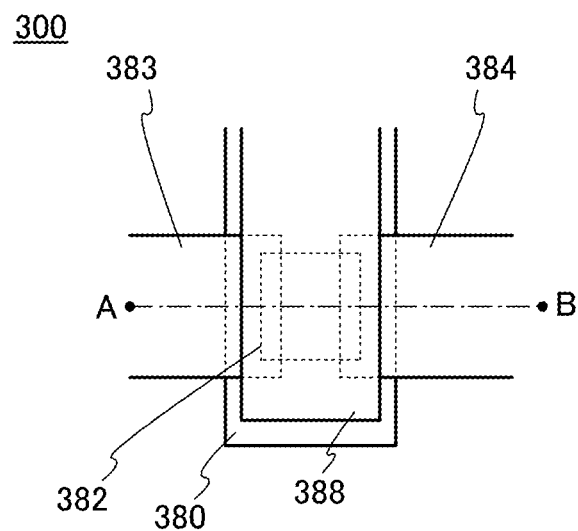
FIGS. 16A and 16B are a top view and a cross-sectional view illustrating a structure example of a transistor.
Figure 16B:
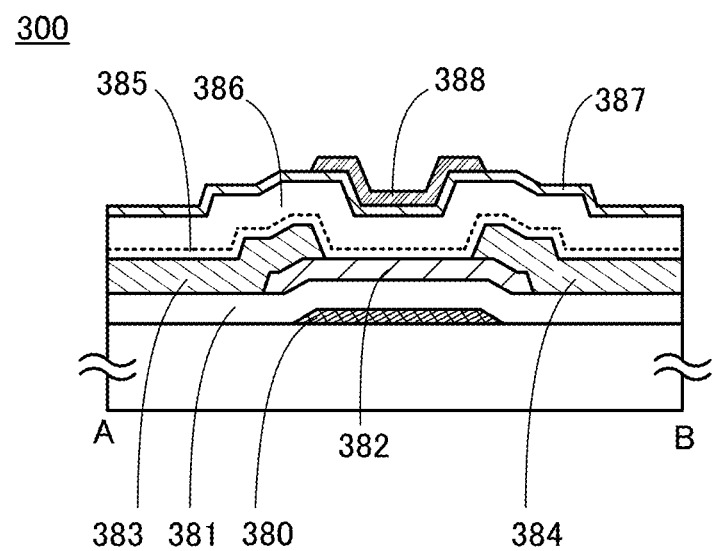

FIGS. 16A and 16B are a top view and a cross-sectional view of a transistor 300. FIG. 16A is the top view. FIG. 16B illustrates a cross section along dashed-dotted line A-B in FIG. 16A. In FIGS. 16A and 16B, some components are scaled up or down or omitted for easy understanding. The direction of the dashed-dotted line A-B can be referred to as a channel length direction.

The transistor 300 illustrated in FIG. 16B includes a conductive film 380 serving as a first gate, a conductive film 388 serving as a second gate, a semiconductor 382, a conductive film 383 and a conductive film 384 serving as a source and a drain, an insulating film 381, an insulating film 385, an insulating film 386, and an insulating film 387.

The conductive film 380 is on an insulating surface. The conductive film 380 overlaps with the semiconductor 382 with the insulating film 381 provided therebetween. The conductive film 388 overlaps with the semiconductor 382 with the insulating films 385, 386, and 387 provided therebetween. The conductive films 383 and 384 are connected to the semiconductor 382.

The descriptions of the conductive films 673 and 674 in FIGS. 9A to 9D can be referred to for the details of the conductive films 380 and 388.

The conductive films 380 and 388 may be supplied with different potentials, or may be supplied with the same potential at the same time. The conductive film 388 serving as a second gate electrode in the transistor 300 leads to stabilization of threshold voltage. Note that the conductive film 388 is unnecessary in some cases.

The description of the semiconductor 662 in FIGS. 9A to 9D can be referred to for the details of the semiconductor 382. The semiconductor 382 may be a single layer or a stack including a plurality of semiconductor layers.

The descriptions of the conductive films 671 and 672 in FIGS. 9A to 9D can be referred to for the details of the conductive films 383 and 384.

The description of the insulating film 653 in FIGS. 9A to 9D can be referred to for the details of the insulating film 381.

The insulating films 385 to 387 are sequentially stacked over the semiconductor 382 and the conductive films 383 and 384 in FIG. 16B; however, an insulating film provided over the semiconductor 382 and the conductive films 383 and 384 may be a single layer or a stack including a plurality of insulating films.

In the case of using an oxide semiconductor as the semiconductor 382, the insulating film 386 preferably contains oxygen at a proportion higher than or equal to the stoichiometric composition and has a function of supplying part of oxygen to the semiconductor 382 by heating. Note that in the case where the semiconductor 382 is damaged at the time of formation of the insulating film 386 when the insulating film 386 is directly formed on the semiconductor 382, the insulating film 385 is preferably provided between the semiconductor 382 and the insulating film 386, as illustrated in FIG. 16B. The insulating film 385 preferably causes little damage to the semiconductor 382 when the insulating film 385 is formed compared with the case of the insulating film 386 and has a function of passing oxygen. If damage to the semiconductor 382 can be reduced and the insulating film 386 can be formed directly on the semiconductor 382, the insulating film 385 is not necessarily provided.

For the insulating films 386 and 385, a material containing silicon oxide or silicon oxynitride is preferably used, for example. Alternatively, a metal oxide such as aluminum oxide, aluminum oxynitride, gallium oxide, gallium oxynitride, yttrium oxide, yttrium oxynitride, hafnium oxide, or hafnium oxynitride can be used.

The insulating film 387 preferably has an effect of blocking diffusion of oxygen, hydrogen, and water. Alternatively, the insulating film 387 preferably has an effect of blocking diffusion of hydrogen and water.

As an insulating film has higher density and becomes denser or has a fewer dangling bonds and becomes more chemically stable, the insulating film has a higher blocking effect. An insulating film that has an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. An insulating film that has an effect of blocking diffusion of hydrogen and water can be formed using, for example, silicon nitride or silicon nitride oxide.

In the case where the insulating film 387 has an effect of blocking diffusion of water, hydrogen, and the like, impurities such as water and hydrogen that exist in a resin in a panel or exist outside the panel can be prevented from entering the semiconductor 382. Since an oxide semiconductor is used for the semiconductor 382, part of water or hydrogen entering the oxide semiconductor serves as an electron donor (donor). Thus, the use of the insulating film 387 having the blocking effect can prevent a shift in threshold voltage of the transistor 300 due to generation of donors.

In addition, since an oxide semiconductor is used for the semiconductor 382, when the insulating film 387 has an effect of blocking diffusion of oxygen, diffusion of oxygen from the oxide semiconductor to the outside can be prevented. Accordingly, oxygen vacancies in the oxide semiconductor that serve as donors are reduced, so that a shift in threshold voltage of the transistor 300 due to generation of donors can be prevented.

The structures, methods, and the like described in this embodiment can be used as appropriate in combination with any of the structures, methods, and the like described in other embodiments.

(Embodiment 4)

In this embodiment, examples of a memory device to which the transistor M0 described in Embodiments 1 and 2 can be applied will be described.

Figure 17A:
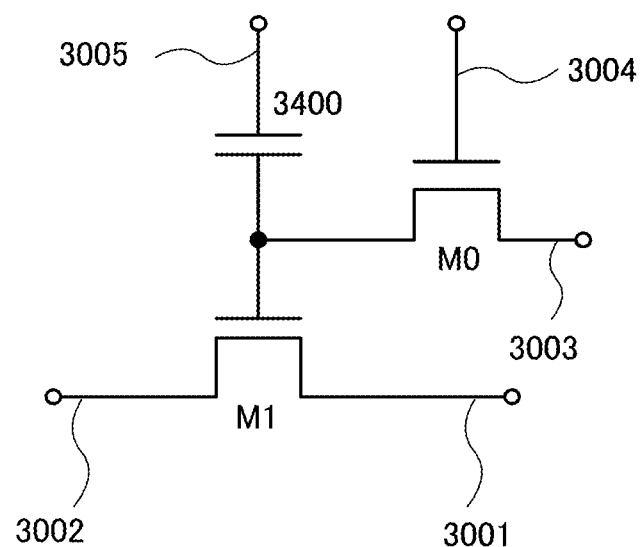
FIGS. 17A and 17B are circuit diagrams each illustrating an example of a memory device.

A semiconductor device illustrated in FIG. 17A includes the transistor M1, the transistor M0, and a capacitor 3400.

A channel region of the transistor M0 preferably contains an oxide semiconductor. Since the off-state current of the transistor M0 is low, stored data can be retained for a long period. In other words, power consumption can be sufficiently reduced because a semiconductor memory device in which refresh operation is unnecessary or the frequency of refresh operation is extremely low can be provided.

In FIG. 17A, a first wiring 3001 is electrically connected to the source of the transistor M1. A second wiring 3002 is electrically connected to the drain of the transistor M1. A third wiring 3003 is electrically connected to one of the source and the drain of the transistor M0. A fourth wiring 3004 is electrically connected to the gate of the transistor M0. The gate of the transistor M1 and the other of the source and the drain of the transistor M0 are electrically connected to a first terminal of the capacitor 3400. A fifth wiring 3005 is electrically connected to a second terminal of the capacitor 3400.

The semiconductor device in FIG. 17A has a feature that the potential of the gate of the transistor M1 can be retained, and thus enables writing, retaining, and reading of data as follows.

Writing and retaining of data are described. First, the potential of the fourth wiring 3004 is set to a potential at which the transistor M0 is turned on, so that the transistor M0 is turned on. Accordingly, the potential of the third wiring 3003 is supplied to the gate of the transistor M1 and the capacitor 3400. That is, a predetermined charge is supplied to the gate of the transistor M1 (writing). Here, one of two kinds of charges providing different potential levels (hereinafter referred to as a low-level charge and a high-level charge) is supplied. After that, the potential of the fourth wiring 3004 is set to a potential at which the transistor M0 is turned off, so that the transistor M0 is turned off. Thus, the charge supplied to the gate of the transistor M1 is held (retaining)

Since the off-state current of the transistor M0 is extremely low, the charge of the gate of the transistor M1 is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate of the transistor M1. This is because in the case of using an n-channel transistor as the transistor M1, an apparent threshold voltage $V_{th\_H}$ at the time when the high-level charge is given to the gate of the transistor M1 is lower than an apparent threshold voltage $V_{th\_L}$ at the time when the low-level charge is given to the gate of the transistor M1. Here, an apparent threshold voltage refers to the potential of the fifth wiring 3005 which is needed to turn on the transistor M1. Thus, the potential of the fifth wiring 3005 is set to a potential $V_0$ which is between $V_{th\_H}$ and $V_{th\_L}$, whereby charge supplied to the gate of the transistor M1 can be determined. For example, in the case where the high-level charge is supplied to the gate of the transistor M1 in writing and the potential of the fifth wiring 3005 is $V_0(>V_{th\_H})$, the transistor M1 is turned on. In the case where the low-level charge is supplied to the gate of the transistor M1 in writing, even when the potential of the fifth wiring 3005 is $V_0(<V_{th\_L})$, the transistor M1 remains off. Thus, the data retained in the gate of the transistor M1 can be read by determining the potential of the second wiring 3002.

Note that in the case where memory cells are arrayed, it is necessary that data of a desired memory cell be read. In the case where such reading is not performed, the fifth wiring 3005 may be supplied with a potential at which the transistor M1 is turned off regardless of the state of the gate, that is, a potential lower than $V_{th\_H}$. Alternatively, the fifth wiring 3005 may be supplied with a potential at which the transistor M1 is turned on regardless of the state of the gate, that is, a potential higher than $V_{th\_L}$.

Figure 17B:
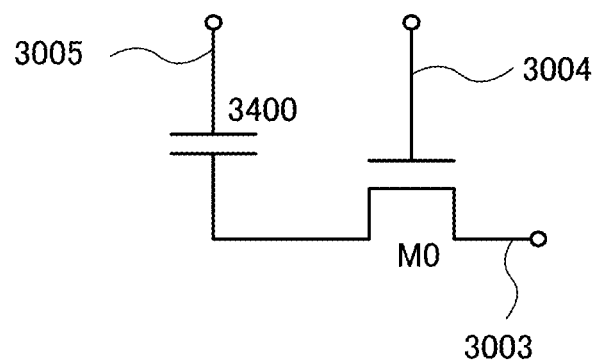

The semiconductor device illustrated in FIG. 17B is different from the semiconductor device illustrated in FIG. 17A in that the transistor M1 is not provided. Also in this case, writing and retaining operation of data can be performed in a manner similar to the above.

Next, reading of data in the semiconductor device in FIG. 17B is described. When the transistor M0 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in potential of the third wiring 3003 varies depending on the potential of the first terminal of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the first terminal of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the first terminal of the capacitor 3400 is $V_1$ and $V_0 (V_1 > V_0)$, the potential of the third wiring 3003 in the case of retaining the potential $V_1 (=(C_B \times V_{B0} + C \times V_1)/(C_B + C))$ is higher than the potential of the third wiring 3003 in the case of retaining the potential $V_0 (=(C_B \times V_{B0} + C \times V_0)/(C_B + C))$.

Then, by comparing the potential of the third wiring 3003 with a predetermined potential, data can be read.

When including a transistor in which a channel formation region is formed using an oxide semiconductor and which has an extremely low off-state current, the semiconductor device described in this embodiment can retain stored data for an extremely long time. In other words, power consumption can be sufficiently reduced because refresh operation becomes unnecessary or the frequency of refresh operation can be extremely low. Moreover, stored data can be retained for a long time even when power is not supplied (note that a potential is preferably fixed).

Furthermore, in the semiconductor device described in this embodiment, a high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating film is not caused at all. That is, the semiconductor device of the disclosed invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

The memory device described in this embodiment can also be used in an LSI such as a central processing unit (CPU), a digital signal processor (DSP), a custom LSI, or a programmable logic device (PLD), and a radio frequency (RF) tag, for example.

The structures, methods, and the like described in this embodiment can be used as appropriate in combination with any of the structures, methods, and the like described in other embodiments.

(Embodiment 5)

In this embodiment, a central processing unit (CPU) including the memory device described in Embodiment 4 will be described.

Figure 18:
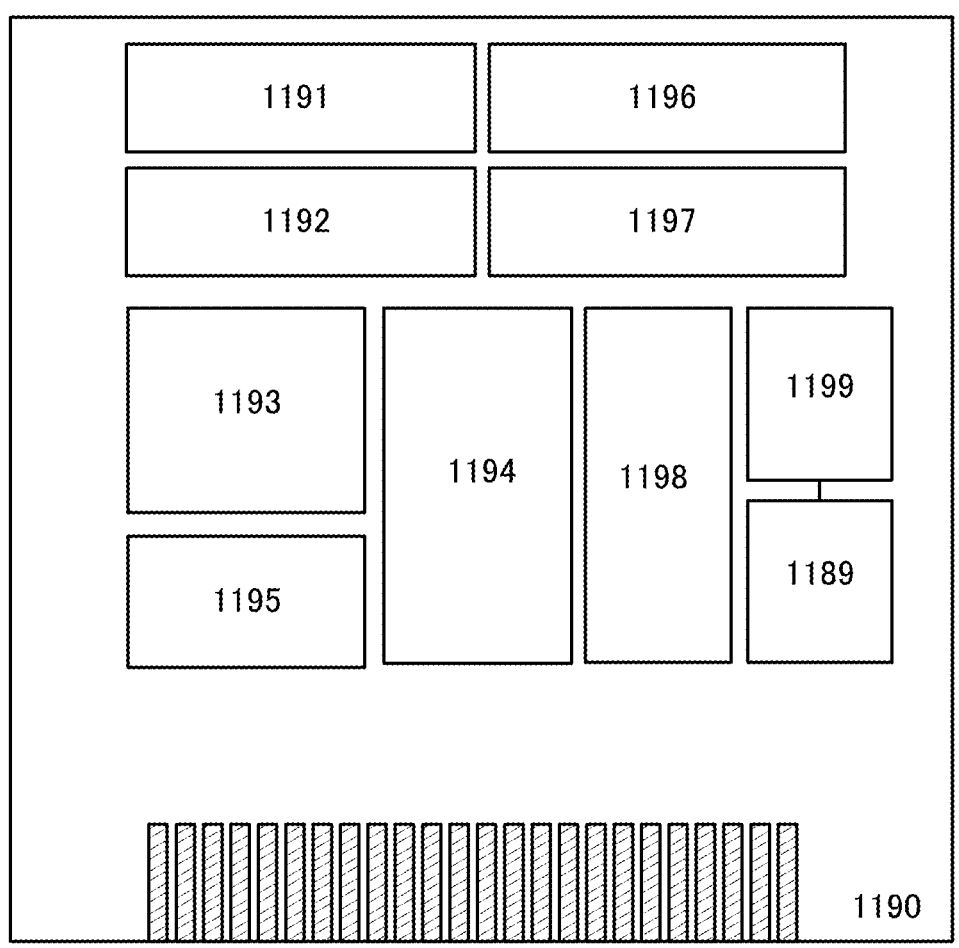
FIG. 18 is a block diagram illustrating an example of a CPU.

FIG. 18 is a block diagram illustrating a configuration example of a CPU at least partly including any of the transistors described in the above embodiments as a component.

The CPU illustrated in FIG. 18 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 18 is just an example in which the configuration is simplified, and an actual CPU may have a variety of configurations depending on the application. For example, the CPU may have the following configuration: a structure including the CPU illustrated in FIG. 18 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 18, a memory cell is provided in the register 1196. For the memory cell of the register 1196, any of the transistors described in Embodiment 1 or the memory devices described in Embodiment 2 can be used.

In the CPU illustrated in FIG. 18, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of the power supply voltage to the memory cell in the register 1196 can be stopped.

The structures, methods, and the like described in this embodiment can be used as appropriate in combination with any of the structures, methods, and the like described in other embodiments.

(Embodiment 6)

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are cellular phones, game machines including portable game machines, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 19A to 19F illustrate specific examples of these electronic devices.

Figure 19A:
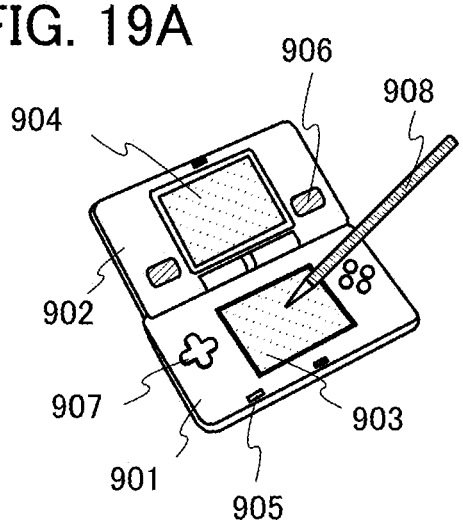
FIGS. 19A to 19F each illustrate an example of an electronic device.

FIG. 19A illustrates a portable game machine, which includes a housing 901, a housing 902, a display portion 903, a display portion 904, a microphone 905, a speaker 906, an operation key 907, a stylus 908, and the like. Although the portable game machine in FIG. 19A has the two display portions 903 and 904, the number of display portions included in a portable game machine is not limited to this.

Figure 19B:
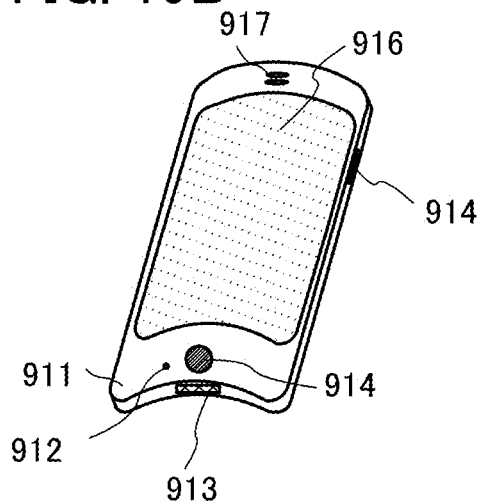

FIG. 19B illustrates a cellular phone, which is provided with a housing 911, a display portion 916, operation buttons 914, an external connection port 913, a speaker 917, a microphone 912, and the like. When the display portion 916 of the cellular phone illustrated in FIG. 19B is touched with a finger or the like, data can be input. Further, operations such as making a call and inputting a character can be performed by touch on the display portion 916 with a finger or the like. The power can be turned on or off with the operation button 914. In addition, types of images displayed on the display portion 916 can be switched; for example, switching images from a mail creation screen to a main menu screen is performed with the operation button 914.

Figure 19C:
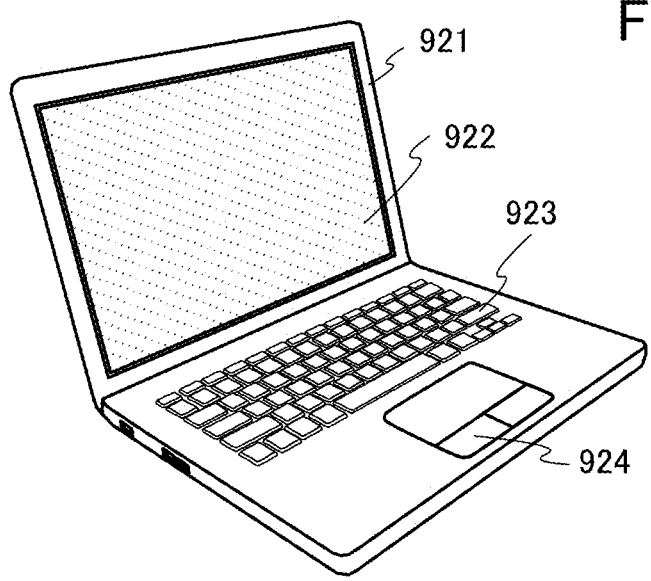

FIG. 19C illustrates a notebook personal computer, which includes a housing 921, a display portion 922, a keyboard 923, a pointing device 924, and the like.

Figure 19D:
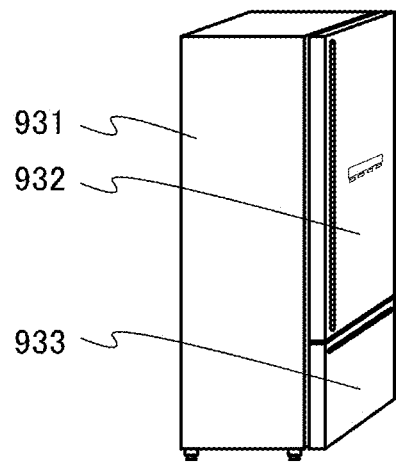

FIG. 19D illustrates an electric refrigerator-freezer, which includes a housing 931, a refrigerator door 932, a freezer door 933, and the like.

Figure 19E:
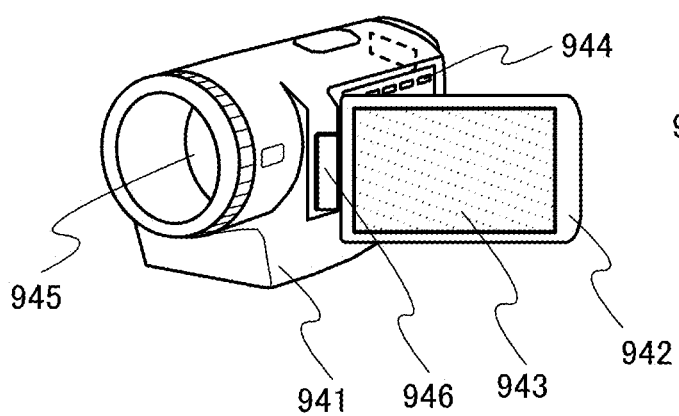

FIG. 19E illustrates a video camera, which includes a housing 941, a housing 942, a display portion 943, operation keys 944, a lens 945, a joint 946, and the like. The operation keys 944 and the lens 945 are provided in the housing 941, and the display portion 943 is provided in the housing 942. The housing 941 and the housing 942 are connected to each other with the joint 946, and the angle between the housing 941 and the housing 942 can be changed with the joint 946. Images displayed on the display portion 943 may be switched in accordance with the angle at the joint 946 between the housing 941 and the housing 942.

Figure 19F:
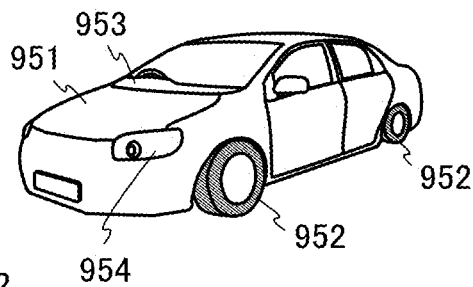
Figure 20A:
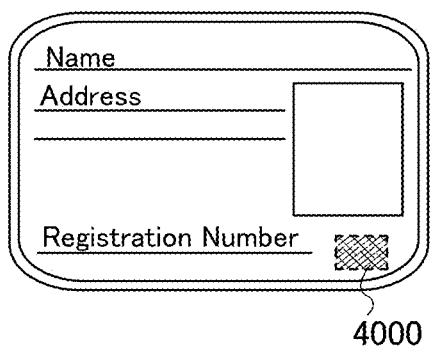
FIGS. 20A to 20F each illustrate an example of an RF tag.
Figure 20B:
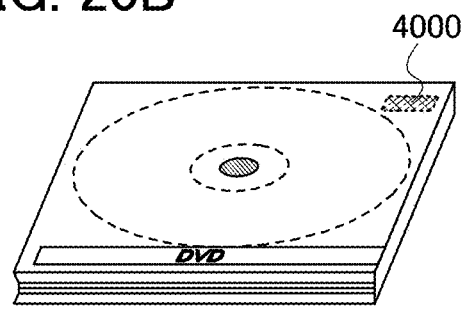
Figure 20C:
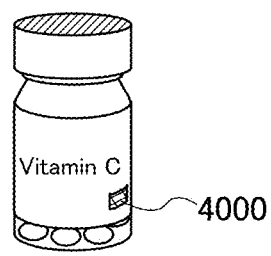
Figure 20D:
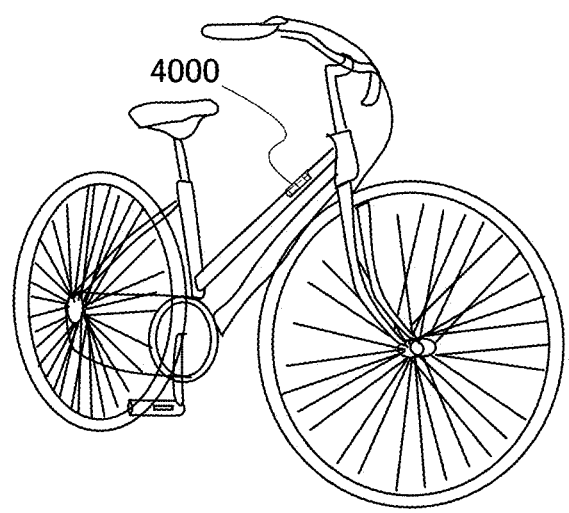
Figure 20E:
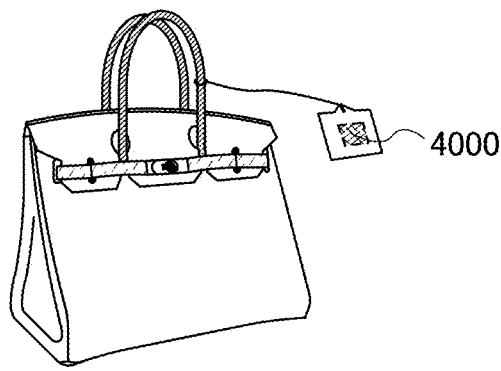
Figure 20F:
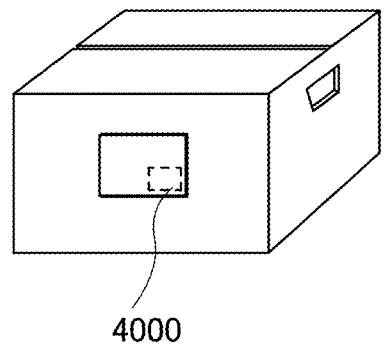

FIG. 19F illustrates a car, which includes a car body 951, wheels 952, a dashboard 953, lights 954, and the like.

Note that this embodiment can be combined with any of the other embodiments and examples in this specification as appropriate.

(Embodiment 7)

In this embodiment, application examples of an RF tag that can be formed using the semiconductor device of one embodiment of the present invention will be described with reference to FIGS. 20A to 20F. The RF tag is widely used and can be provided for, for example, products such as bills, coins, securities, bearer bonds, documents (e.g., driver's licenses or resident's cards, see FIG. 20A), recording media (e.g., DVDs or video tapes, see FIG. 20B), packaging containers (e.g., wrapping paper or bottles, see FIG. 20C), vehicles (e.g., bicycles, see FIG. 20D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 20E and 20F).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic devices, or the like. Vehicles can also have higher security against theft or the like by being provided with the RF tag of one embodiment of the present invention.

As described above, by using the RF tag of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF tag can be preferably used for application in which data is not frequently written or read.

Next, an example of use of a display device which can include the semiconductor device of one embodiment of the present invention will be described. In one example, a display device includes a pixel. The pixel includes a transistor and a display element, for example. Alternatively, the display device includes a driver circuit for driving the pixel. The driver circuit includes a transistor, for example. As these transistors, any of the transistors described in the other embodiments can be employed, for example.

In this specification and the like, for example, a display element, a display device which is a device including a display element, a light-emitting element, and a light-emitting device which is a device including a light-emitting element can employ a variety of modes or can include a variety of elements. The display element, the display device, the light-emitting element, or the light-emitting device includes at least one of an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on a current), an electron emitter, a liquid crystal element, electronic ink, an electrophoretic element, a grating light valve (GLV), a plasma display panel (PDP), a display element using a micro electro mechanical system (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, a display element including a carbon nanotube, and the like. Other than the above, a display medium whose contrast, luminance, reflectance, transmittance, or the like is changed by electrical or magnetic effect may be included. Examples of a display device including an EL element include an EL display. Examples of a display device including an electron emitter include a field emission display (FED) and an SED-type flat panel display (SED: surface-conduction electron-emitter display). Examples of a display device including a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, Electronic Liquid Powder (registered trademark), or an electrophoretic element include electronic paper. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

Note that this embodiment can be combined with any of the other embodiments and examples in this specification as appropriate.

(Embodiment 8)

In this embodiment, a structure of an oxide semiconductor film applicable to the semiconductor 662 will be described.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

<<Structure of Oxide Semiconductor>>

The structure of an oxide semiconductor will be described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS will be described.

The CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 21A:
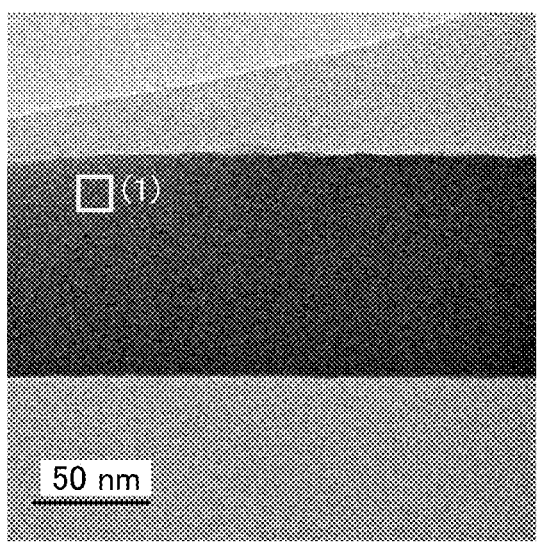
FIGS. 21A to 21D are Cs-corrected high-resolution TEM images of a cross section of a CAAC-OS and a schematic cross-sectional view of the CAAC-OS.

A CAAC-OS observed with TEM will be described below. FIG. 21A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 21B:
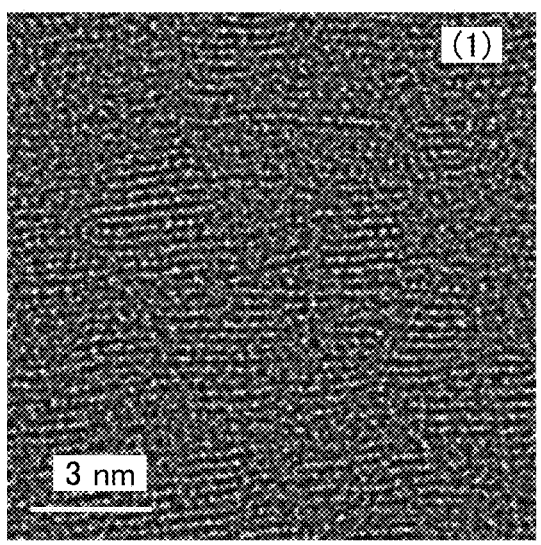

FIG. 21B is an enlarged Cs-corrected high-resolution TEM image of a region (1) in FIG. 21A. FIG. 21B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 21C:
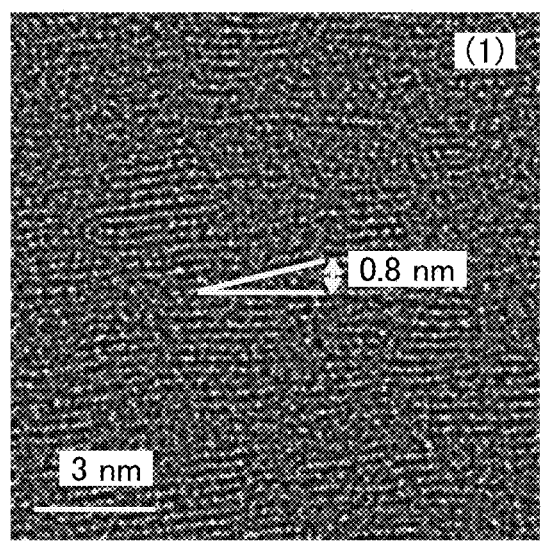

As shown in FIG. 21B, the CAAC-OS has a characteristic atomic arrangement. The characteristic atomic arrangement is denoted by an auxiliary line in FIG. 21C. FIGS. 21B and 21C prove that the size of a pellet is greater than or equal to 1 nm or greater than or equal to 3 nm, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 21D:
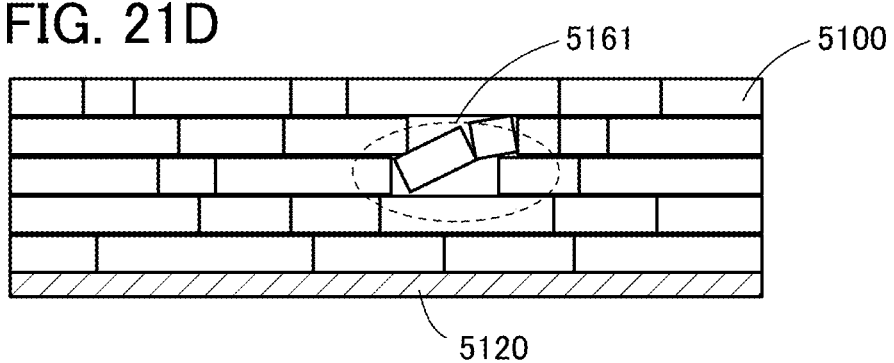

Here, according to the Cs-corrected high-resolution TEM images, the schematic arrangement of pellets 5100 of a CAAC-OS over a substrate 5120 is illustrated by such a structure in which bricks or blocks are stacked (see FIG. 21D). The part in which the pellets are tilted as observed in FIG. 21C corresponds to a region 5161 shown in FIG. 21D.

Figure 22A:
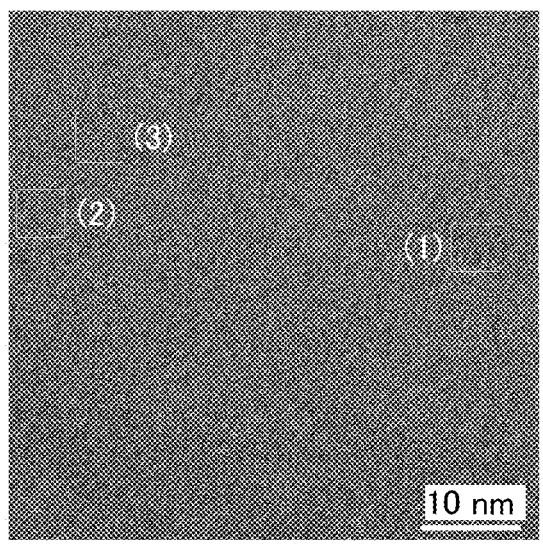
FIGS. 22A to 22D are Cs-corrected high-resolution TEM images of a plane of a CAAC-OS.
Figure 22B:
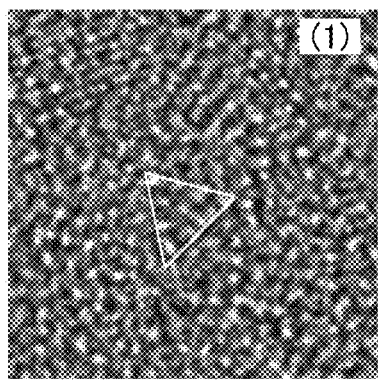
Figure 22C:
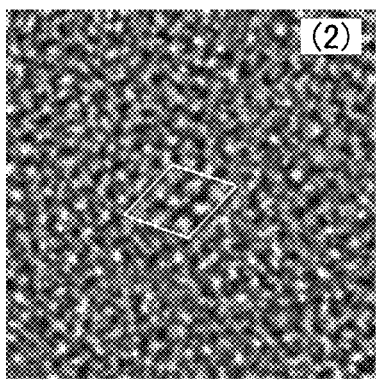
Figure 22D:
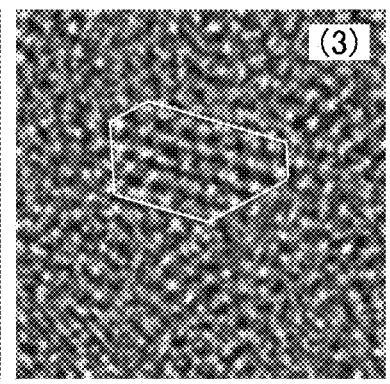

FIG. 22A shows a Cs-corrected high-resolution TEM image of a plane of the CAAC-OS observed from a direction substantially perpendicular to the sample surface. FIGS. 22B, 22C, and 22D are enlarged Cs-corrected high-resolution TEM images of regions (1), (2), and (3) in FIG. 22A, respectively. FIGS. 22B, 22C, and 22D indicate that metal atoms are arranged in a triangular, quadrangular, or hexagonal configuration in a pellet. However, there is no regularity of arrangement of metal atoms between different pellets.

Figure 23A:
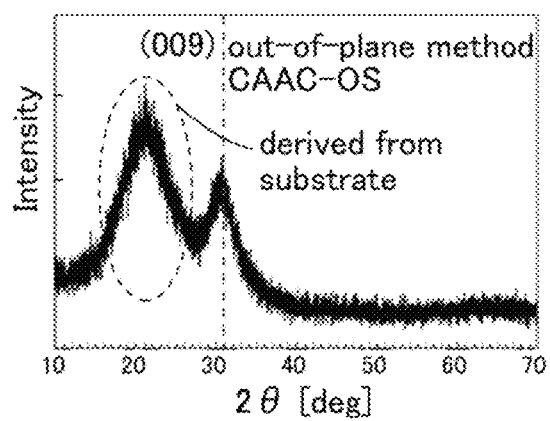
FIGS. 23A to 23C show results of structural analysis of a CAAC-OS and a single crystal oxide semiconductor by XRD.

Next, a CAAC-OS analyzed by X-ray diffraction (XRD) will be described. For example, when the structure of a CAAC-OS including an $InGaZnO_4$ crystal is analyzed by an out-of-plane method, a peak appears at a diffraction angle ($2\theta$) of around 31° as shown in FIG. 23A. This peak is attributed to the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when $2\theta$ is around 36°, in addition to the peak at $2\theta$ of around 31°. The peak at $2\theta$ of around 36° indicates that a crystal having no c-axis alignment is included in part of the CAAC-OS. It is preferable that in the CAAC-OS analyzed by an out-of-plane method, a peak appear when $2\theta$ is around 31° and that a peak not appear when $2\theta$ is around 36°.

Figure 23B:
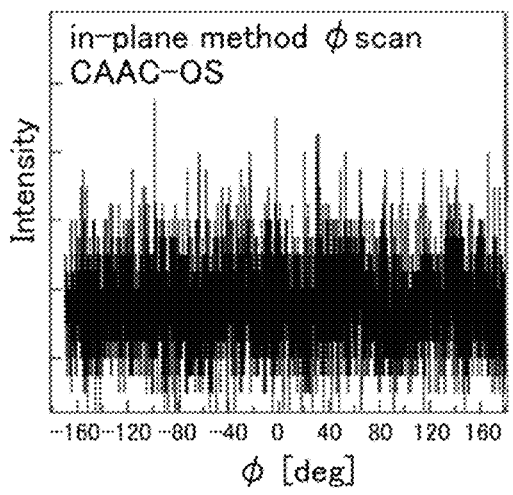
Figure 23C:
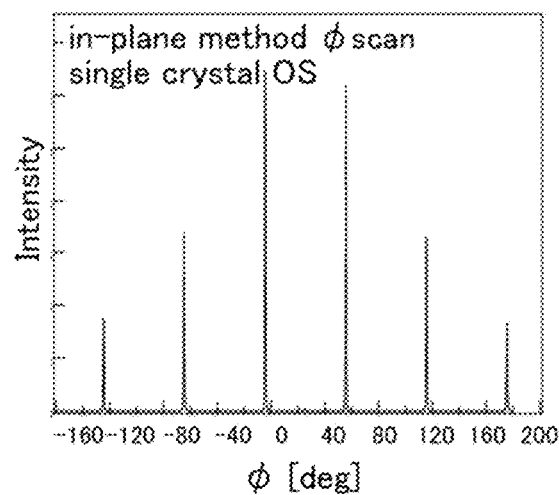

On the other hand, in structural analysis of the CAAC-OS by an in-plane method in which an X-ray beam is incident on a sample in a direction substantially perpendicular to the c-axis, a peak appears when $2\theta$ is around 56°. This peak is attributed to the (110) plane of the $InGaZnO_4$ crystal. In the case of the CAAC-OS, when analysis ($\phi$ scan) is performed with $2\theta$ fixed at around 56° and with the sample rotated using a normal vector of the sample surface as an axis ($\phi$ axis), as shown in FIG. 23B, a peak is not clearly observed. In contrast, in the case of a single crystal oxide semiconductor of $InGaZnO_4$, when $\phi$ scan is performed with $2\theta$ fixed at around 56°, as shown in FIG. 23C, six peaks which are attributed to crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction will be described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 24A can be obtained. In this diffraction pattern, spots attributed to the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 24B shows a diffraction pattern obtained in such a manner that an electron beam with a probe diameter of 300 nm is incident on the same sample in a direction perpendicular to the sample surface. As shown in FIG. 24B, a ring-like diffraction pattern is observed. Thus, the electron diffraction also indicates that the a-axes and b-axes of the pellets included in the CAAC-OS do not have regular alignment. The first ring in FIG. 24B is considered to be attributed to the (010) plane, the (100) plane, and the like of the InGaZnO$_4$ crystal. The second ring in FIG. 24B is considered to be attributed to the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, an oxygen vacancy in the oxide semiconductor might serve as a carrier trap or serve as a carrier generation source when hydrogen is captured therein.

The CAAC-OS having small amounts of impurities and oxygen vacancies is an oxide semiconductor with low carrier density. Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS will be described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, bright regions in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure intermediate between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 25:
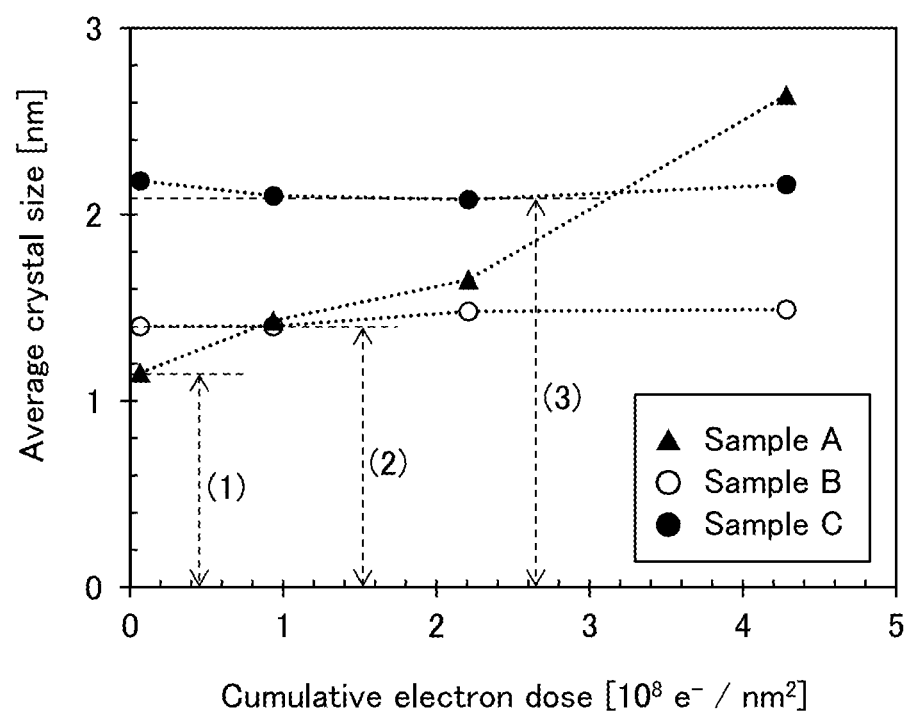
FIG. 25 shows changes in crystal parts of In—Ga—Zn oxides induced by electron irradiation.

FIG. 25 shows change in the average size of crystal parts (at 22 points to 45 points) in each sample. Note that the crystal part size corresponds to the length of a lattice fringe. FIG. 25 indicates that the crystal part size in the a-like OS increases with an increase in the cumulative electron dose. Specifically, as shown by (1) in FIG. 25, a crystal part of approximately 1.2 nm (also referred to as an initial nucleus) at the start of TEM observation grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$.

Specifically, as shown by (2) and (3) in FIG. 25, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

<Deposition Model>

Examples of deposition models of a CAAC-OS and an nc-OS are described below.

Figure 26A:
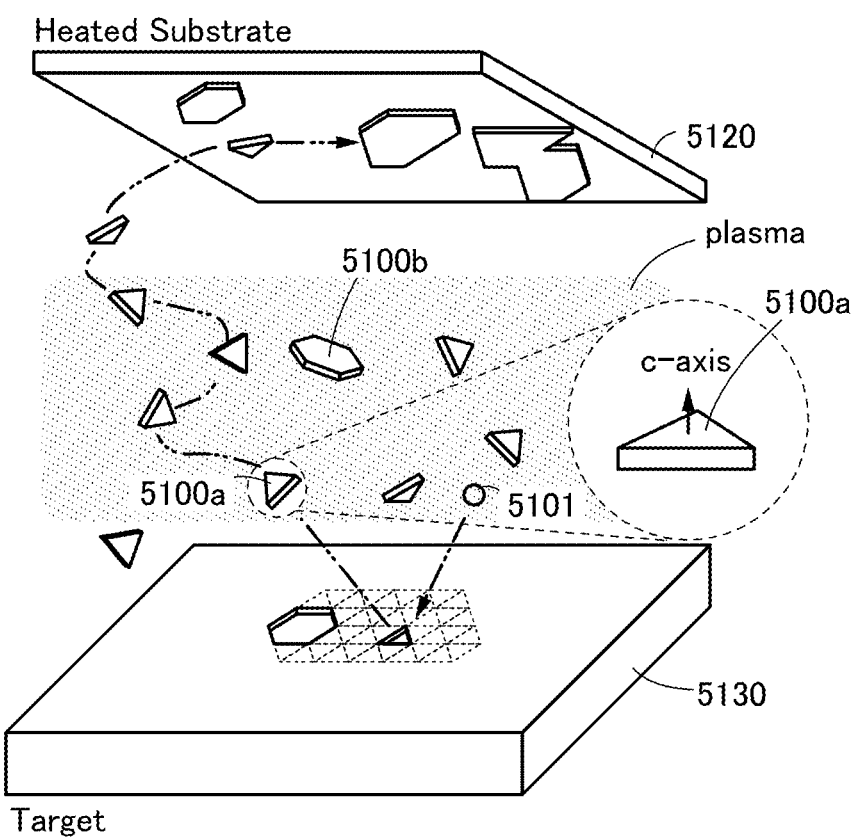
FIGS. 26A and 26B are schematic diagrams illustrating deposition models of a CAAC-OS and an nc-OS.

FIG. 26A is a schematic view of the inside of a deposition chamber where a CAAC-OS is deposited by a sputtering method.

A target 5130 is attached to a backing plate. A plurality of magnets is provided to face the target 5130 with the backing plate positioned therebetween. The plurality of magnets generates a magnetic field. A sputtering method in which the disposition rate is increased by utilizing a magnetic field of magnets is referred to as a magnetron sputtering method.

The substrate 5120 is placed to face the target 5130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5130, and plasma is observed. The magnetic field forms a high-density plasma region in the vicinity of the target 5130. In the high-density plasma region, the deposition gas is ionized, so that an ion 5101 is generated. Examples of the ion 5101 include an oxygen cation ($O^+$) and an argon cation ($Ar^+$).

Figure 27A:
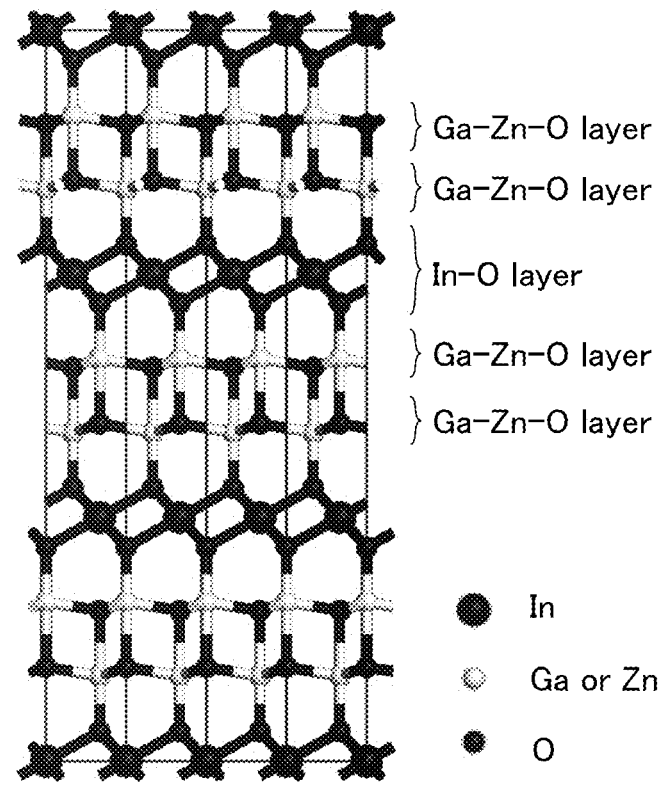
FIGS. 27A to 27C illustrate an InGaZnO$_4$ crystal and a pellet.

Here, the target 5130 has a polycrystalline structure which includes a plurality of crystal grains and in which a cleavage plane exists in at least one crystal grain. FIG. 27A shows a structure of an $InGaZnO_4$ crystal included in the target 5130 as an example. Note that FIG. 27A shows a structure of the case where the $InGaZnO_4$ crystal is observed from a direction parallel to the b-axis. FIG. 27A indicates that oxygen atoms in a Ga—Zn—O layer are positioned close to those in an adjacent Ga—Zn—O layer. The oxygen atoms have negative charge, whereby repulsive force is generated between the two Ga—Zn—O layers. As a result, the $InGaZnO_4$ crystal has a cleavage plane between the two adjacent Ga—Zn—O layers.

The ion 5101 generated in the high-density plasma region is accelerated toward the target 5130 side by an electric field, and then collides with the target 5130. At this time, a pellet 5100*a* and a pellet 5100*b* which are flat-plate-like (pellet-like) sputtered particles are separated and sputtered from the cleavage plane. Note that structures of the pellet 5100*a* and the pellet 5100*b* may be distorted by an impact of collision of the ion 5101.

The pellet 5100*a* is a flat-plate-like (pellet-like) sputtered particle having a triangle plane, e.g., regular triangle plane. The pellet 5100*b* is a flat-plate-like (pellet-like) sputtered particle having a hexagon plane, e.g., regular hexagon plane. Note that flat-plate-like (pellet-like) sputtered particles such as the pellet 5100*a* and the pellet 5100*b* are collectively called pellets 5100. The shape of a flat plane of the pellet 5100 is not limited to a triangle or a hexagon. For example, the flat plane may have a shape formed by combining two or more triangles. For example, a quadrangle (e.g., rhombus) may be formed by combining two triangles (e.g., regular triangles).

Figure 27B:
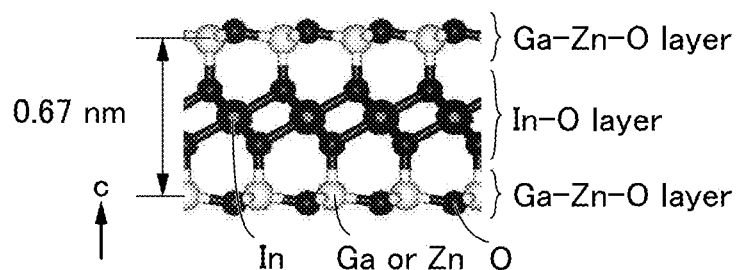
Figure 27C:
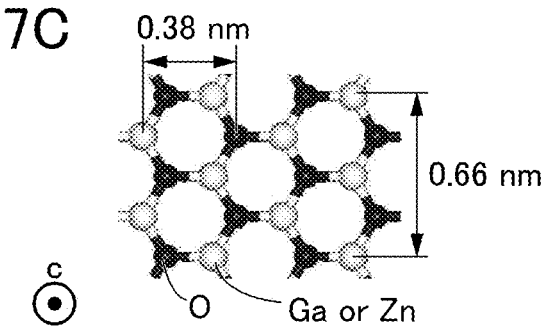

The thickness of the pellet 5100 is determined depending on the kind of deposition gas and the like. The thicknesses of the pellets 5100 are preferably uniform; the reason for this is described later. In addition, the sputtered particle preferably has a pellet shape with a small thickness as compared to a dice shape with a large thickness. For example, the thickness of the pellet 5100 is greater than or equal to 0.4 nm and less than or equal to 1 nm, preferably greater than or equal to 0.6 nm and less than or equal to 0.8 nm. In addition, for example, the width of the pellet 5100 is greater than or equal to 1 nm and less than or equal to 3 nm, preferably greater than or equal to 1.2 nm and less than or equal to 2.5 nm. The pellet 5100 corresponds to the initial nucleus in the description of (1) in FIG. 25. For example, when the ion 5101 collides with the target 5130 including an In—Ga—Zn oxide, the pellet 5100 that includes three layers of a Ga—Zn—O layer, an In—O layer, and a Ga—Zn—O layer as shown in FIG. 27B is separated. Note that FIG. 27C shows the structure of the separated pellet 5100 which is observed from a direction parallel to the c-axis. The pellet 5100 has a nanometer-sized sandwich structure including two Ga—Zn—O layers (pieces of bread) and an In—O layer (filling).

The pellet 5100 may receive a charge when passing through the plasma, so that side surfaces thereof are negatively or positively charged. In the pellet 5100, an oxygen atom positioned on its side surface may be negatively charged. When the side surfaces are charged with the same polarity, charges repel each other, and accordingly, the pellet 5100 can maintain a flat-plate (pellet) shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom, or a zinc atom is negatively charged. In addition, the pellet 5100 may grow by being bonded with an indium atom, a gallium atom, a zinc atom, an oxygen atom, or the like when passing through plasma. A difference in size between (2) and (1) in FIG. 25 corresponds to the amount of growth in plasma. Here, in the case where the temperature of the substrate 5120 is at around room temperature, the pellet 5100 on the substrate 5120 hardly grows; thus, an nc-OS is formed (see FIG. 26B). An nc-OS can be deposited when the substrate 5120 has a large size because the deposition of an nc-OS can be carried out at room temperature. Note that in order that the pellet 5100 grows in plasma, it is effective to increase deposition power in sputtering. High deposition power can stabilize the structure of the pellet 5100.

Figure 26B:
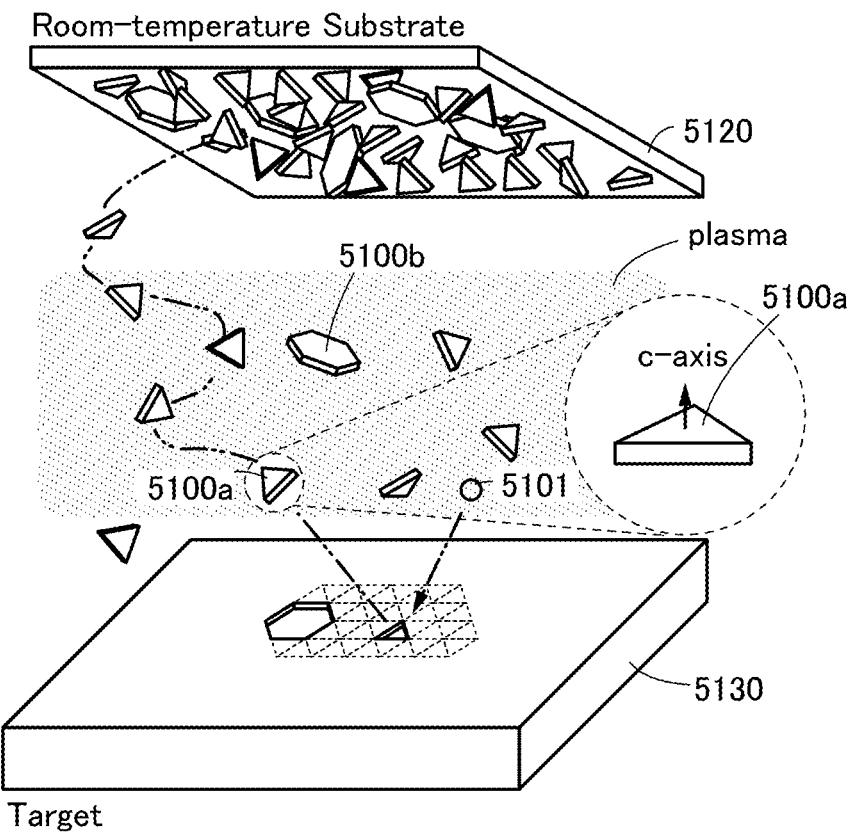

As shown in FIGS. 26A and 26B, the pellet 5100 flies like a kite in plasma and flutters up to the substrate 5120. Since the pellets 5100 are charged, when the pellet 5100 gets close to a region where another pellet 5100 has already been deposited, repulsion is generated. Here, above the substrate 5120, a magnetic field in a direction parallel to the top surface of the substrate 5120 (also referred to as a horizontal magnetic field) is generated. A potential difference is given between the substrate 5120 and the target 5130, and accordingly, a current flows from the substrate 5120 toward the target 5130. Thus, the pellet 5100 is given a force (Lorentz force) on the top surface of the substrate 5120 by an effect of the magnetic field and the current. This is explainable with Fleming's left-hand rule.

The mass of the pellet 5100 is larger than that of an atom. Therefore, to move the pellet 5100 over the top surface of the substrate 5120, it is important to apply some force to the pellet 5100 from the outside. One kind of the force may be force which is generated by the action of a magnetic field and a current. In order to apply a sufficient force to the pellet 5100 so that the pellet 5100 moves over a top surface of the substrate 5120, it is preferable to provide, on the top surface of the substrate 5120, a region where the magnetic field in a direction parallel to the top surface of the substrate 5120 is 10 G or higher, preferably 20 G or higher, further preferably 30 G or higher, and still further preferably 50 G or higher. Alternatively, it is preferable to provide, on the top surface of the substrate 5120, a region where the magnetic field in a direction parallel to the top surface of the substrate 5120 is 1.5 times or higher, preferably twice or higher, further preferably 3 times or higher, and still further preferably 5 times or higher as high as the magnetic field in a direction perpendicular to the top surface of the substrate 5120.

At this time, the magnets and the substrate 5120 are moved or rotated relatively, whereby the direction of the horizontal magnetic field on the top surface of the substrate 5120 continues to change. Therefore, the pellet 5100 can be moved in various directions on the top surface of the substrate 5120 by receiving forces in various directions.

Furthermore, as shown in FIG. 26A, when the substrate 5120 is heated, resistance between the pellet 5100 and the substrate 5120 due to friction or the like is low. As a result, the pellet 5100 glides above the top surface of the substrate 5120. The glide of the pellet 5100 is caused in a state where its flat plane faces the substrate 5120. Then, when the pellet 5100 reaches the side surface of another pellet 5100 that has been already deposited, the side surfaces of the pellets 5100 are bonded. At this time, the oxygen atom on the side surface of the pellet 5100 is released. With the released oxygen atoms, oxygen vacancies in a CAAC-OS might be filled; thus, the CAAC-OS has a low density of defect states. Note that the temperature of the top surface of the substrate 5120 is, for example, higher than or equal to 100° C. and lower than 500° C., higher than or equal to 150° C. and lower than 450° C., or higher than or equal to 170° C. and lower than 400° C. Hence, even when the substrate 5120 has a large size, it is possible to deposit a CAAC-OS.

Furthermore, the pellet 5100 is heated on the substrate 5120, whereby atoms are rearranged, and the structure distortion caused by the collision of the ion 5101 can be reduced. The pellet 5100 whose structure distortion is reduced is substantially single crystal. Even when the pellets 5100 are heated after being bonded, expansion and contraction of the pellet 5100 itself hardly occur, which is caused by turning the pellet 5100 into substantially single crystal. Thus, formation of defects such as a grain boundary due to expansion of a space between the pellets 5100 can be prevented, and accordingly, generation of crevasses can be prevented.

The CAAC-OS does not have a structure like a board of a single crystal oxide semiconductor but has arrangement with a group of pellets 5100 (nanocrystals) like stacked bricks or blocks. Furthermore, a grain boundary does not exist between the pellets 5100. Therefore, even when deformation such as shrink occurs in the CAAC-OS owing to heating during deposition, heating or bending after deposition, it is possible to relieve local stress or release distortion. Therefore, this structure is suitable for a flexible semiconductor device. Note that the nc-OS has arrangement in which pellets 5100 (nanocrystals) are randomly stacked.

When the target 5130 is sputtered with the ion 5101, in addition to the pellets 5100, zinc oxide or the like may be separated. The zinc oxide is lighter than the pellet 5100 and thus reaches the top surface of the substrate 5120 before the pellet 5100. As a result, the zinc oxide forms a zinc oxide layer 5102 with a thickness greater than or equal to 0.1 nm and less than or equal to 10 nm, greater than or equal to 0.2 nm and less than or equal to 5 nm, or greater than or equal to 0.5 nm and less than or equal to 2 nm. FIGS. 28A to 28D are cross-sectional schematic views.

Figure 28A:
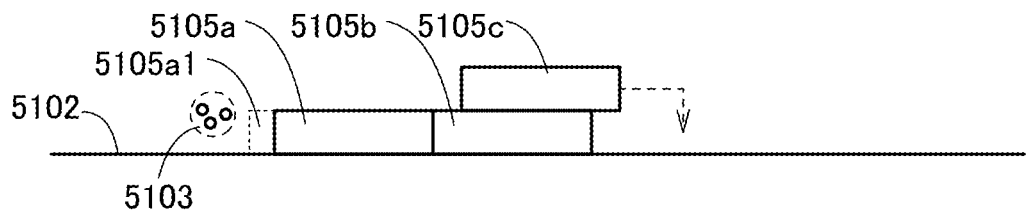
FIGS. 28A to 28D are schematic diagrams illustrating a deposition model of a CAAC-OS.

As illustrated in FIG. 28A, a pellet 5105*a* and a pellet 5105*b* are deposited over the zinc oxide layer 5102. Here, side surfaces of the pellet 5105*a* and the pellet 5105*b* are in contact with each other. In addition, a pellet 5105*c* is deposited over the pellet 5105*b*, and then glides over the pellet 5105*b*. Furthermore, a plurality of particles 5103 separated from the target together with the zinc oxide is crystallized by heat from the substrate 5120 to form a region 5105*a*1 on another side surface of the pellet 5105*a*. Note that the plurality of particles 5103 may contain oxygen, zinc, indium, gallium, or the like.

Figure 28B:
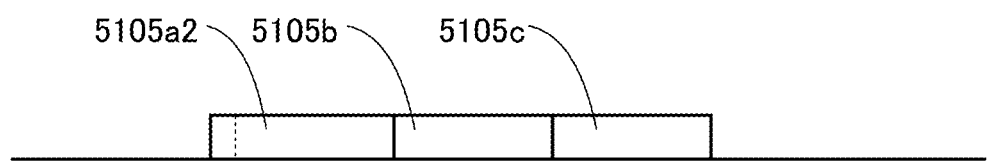

Then, as illustrated in FIG. 28B, the region 5105*a*1 grows to part of the pellet 5105*a* to form a pellet 5105*a*2. In addition, a side surface of the pellet 5105*c* is in contact with another side surface of the pellet 5105*b*.

Figure 28C:
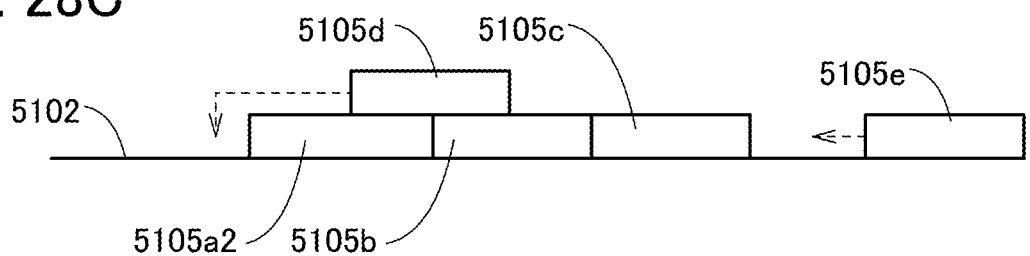

Next, as illustrated in FIG. 28C, a pellet 5105d is deposited over the pellet 5105a2 and the pellet 5105b, and then glides over the pellet 5105a2 and the pellet 5105b. Furthermore, a pellet 5105e glides toward another side surface of the pellet 5105c over the zinc oxide layer 5102.

Figure 28D:
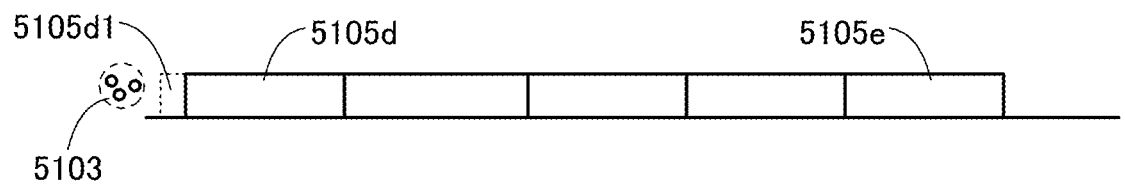

Then, as illustrated in FIG. 28D, the pellet 5105d is placed so that a side surface of the pellet 5105d is in contact with a side surface of the pellet 5105a2. Furthermore, a side surface of the pellet 5105e is in contact with another side surface of the pellet 5105c. A plurality of particles 5103 separated from the target 5130 together with the zinc oxide is crystallized by heat from the substrate 5120 to form a region 5105d1 on another side surface of the pellet 5105d.

As described above, deposited pellets are placed to be in contact with each other and then growth is caused at side surfaces of the pellets, whereby a CAAC-OS is formed over the substrate 5120. Therefore, each pellet of the CAAC-OS is larger than that of the nc-OS. A difference in size between (3) and (2) in FIG. 25 corresponds to the amount of growth after deposition.

When spaces between pellets are extremely small, the pellets may form a large pellet. The large pellet has a single crystal structure. For example, the size of the pellet may be greater than or equal to 10 nm and less than or equal to 200 nm, greater than or equal to 15 nm and less than or equal to 100 nm, or greater than or equal to 20 nm and less than or equal to 50 nm, when seen from the above. In this case, in an oxide semiconductor used for a minute transistor, a channel formation region might be fit inside the large pellet. Therefore, the region having a single crystal structure can be used as the channel formation region. Furthermore, when the size of the pellet is increased, the region having a single crystal structure can be used as the channel formation region, the source region, and the drain region of the transistor.

In this manner, when the channel formation region or the like of the transistor is formed in a region having a single crystal structure, the frequency characteristics of the transistor can be increased in some cases.

As shown in such a model, the pellets 5100 are considered to be deposited on the substrate 5120. Thus, a CAAC-OS can be deposited even when a formation surface does not have a crystal structure; therefore, a growth mechanism in this case is different from epitaxial growth. In addition, laser crystallization is not needed for formation of a CAAC-OS, and a uniform film can be formed even over a large-sized glass substrate or the like. For example, even when the top surface (formation surface) of the substrate 5120 has an amorphous structure (e.g., the top surface is formed of amorphous silicon oxide), a CAAC-OS can be formed.

In addition, it is found that in formation of the CAAC-OS, the pellets 5100 are arranged in accordance with the top surface shape of the substrate 5120 that is the formation surface even when the formation surface has unevenness. For example, in the case where the top surface of the substrate 5120 is flat at the atomic level, the pellets 5100 are arranged so that flat planes parallel to the a-b plane face downwards. In the case where the thicknesses of the pellets 5100 are uniform, a layer with a uniform thickness, flatness, and high crystallinity is formed. By stacking n layers (n is a natural number), the CAAC-OS can be obtained.

In the case where the top surface of the substrate 5120 has unevenness, a CAAC-OS in which n layers (n is a natural number) in each of which the pellets 5100 are arranged along the unevenness are stacked is formed. Since the substrate 5120 has unevenness, a gap is easily generated between the pellets 5100 in the CAAC-OS in some cases.

Note that, even in such a case, owing to intermolecular force, the pellets 5100 are arranged so that a gap between the pellets is as small as possible even on the unevenness surface. Therefore, even when the formation surface has unevenness, a CAAC-OS with high crystallinity can be obtained.

Since a CAAC-OS is deposited in accordance with such a model, the sputtered particle preferably has a pellet shape with a small thickness. Note that when the sputtered particles have a dice shape with a large thickness, planes facing the substrate 5120 vary; thus, the thicknesses and orientations of the crystals cannot be uniform in some cases.

According to the deposition model described above, a CAAC-OS with high crystallinity can be formed even on a formation surface with an amorphous structure.

EXAMPLE 1

As described above, a transistor whose channel contains an oxide semiconductor (hereinafter, such a transistor is referred to as an "OS transistor" in some cases) has an extremely low off-state current. The combination of an OS transistor and a Si transistor can provide a circuit having functions and capability that a circuit only including Si transistors does not have. In this example, a memory circuit including an OS transistor and a Si transistor was actually fabricated to confirm that an off-state current of a minute OS transistor can be represented by Formula (4) given by the above-mentioned stretched exponential function.

<<Prototyped Circuit>>
<Circuit Configuration>

Figure 30:
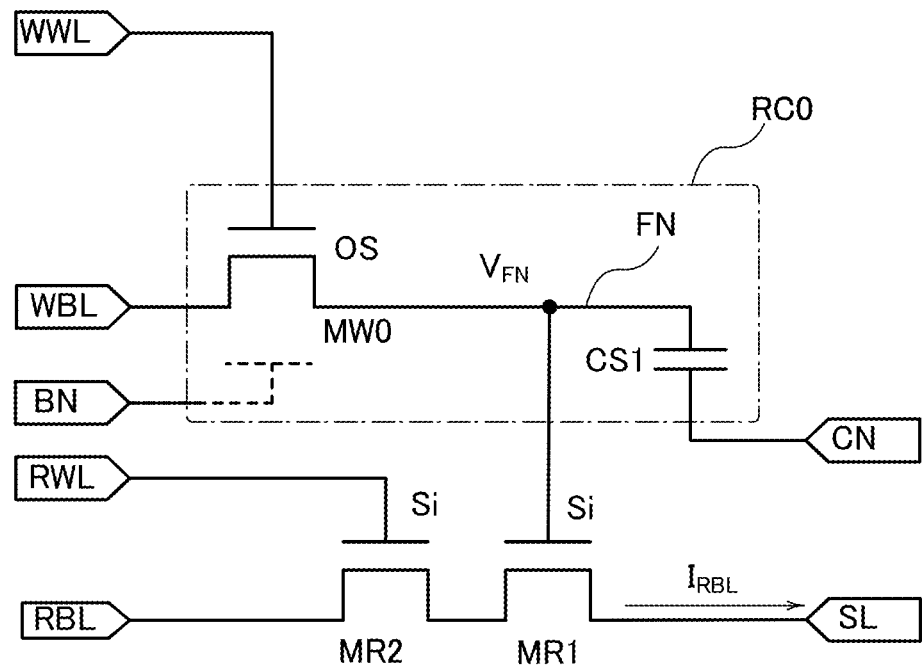
FIG. 30 is a circuit diagram of a prototyped circuit.

FIG. 30 is a circuit diagram of a prototyped circuit. A circuit MC10 illustrated in FIG. 30 was designed to be a memory cell of a random access memory.

The circuits illustrated in FIG. 30 and FIG. 3 have similar circuit configurations; thus, the same reference numerals are used for the same components. A transistor MW0, a transistor MR1, a transistor MR2, and a capacitor CS1 in FIG. 30 correspond to the transistor M0, the transistor M1, the transistor M2, and the capacitor CS in FIG. 3, respectively. In the circuit MC10 illustrated in FIG. 30, the transistor MW0 and the capacitor CS1 formed a holding circuit RC0. The transistor MW0 was an OS transistor, and the transistors MR1 and MR2 were n-channel Si transistors.

The designed channel lengths L and channel widths W of the transistors in the circuit MC10 were as follows: L/W of the transistor MW0 was 60/60 nm and L/W of each of the transistors MR1 and MR2 was 180/60 nm.

<Device Structure>

Figure 31:
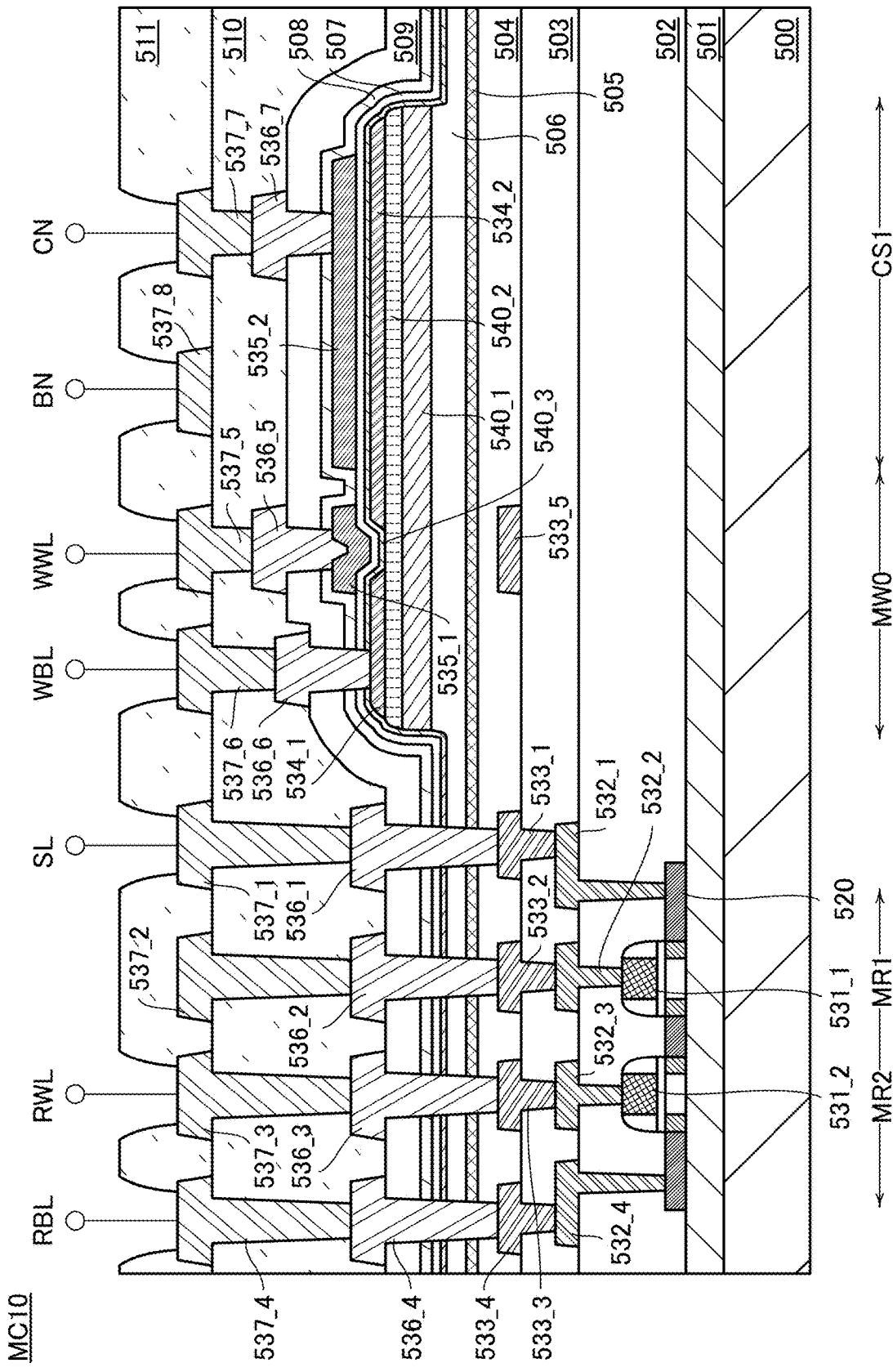
FIG. 31 is a cross-sectional view illustrating a device structure of a prototyped circuit.

FIG. 31 shows a device structure of the circuit MC10. FIG. 31 is a cross-sectional view of the circuit MC10 for easy understanding of the layered structure, the connection, and the like, and is not a cross-sectional view taken along a specific line.

The transistors MR1 and MR2 are planar transistors and are formed on an SOI semiconductor substrate. Reference numerals 500 and 501 designate a single crystal silicon wafer and a silicon oxide layer, respectively. Channel regions, source regions, and drain regions of the transistors MR1 and MR2 are in one single crystal silicon layer 520.

The transistor MW0 and the capacitor CS1 are stacked over the transistors MR1 and MR2. The prototyped circuit MC10 includes insulating layers 502 to 511 and seven wiring tiers. The transistors (MW0, MR1, and MR2) and the capacitor CS1 are electrically connected to each other as illustrated in FIG. 30 by conductive layers provided in first to seventh wiring tires.

Conductive layers 531_1 and 531_2 are formed in the first wiring tier. Conductive layers 532_1 to 532_4 are formed in the second wiring tier. Conductive layers 533_1 to 533_5 are formed in the third wiring tier. Conductive layers 534_1 and 534_2 are formed in the fourth wiring tier. Conductive layers 535_1 and 535_2 are formed in the fifth wiring tier. Conductive layers 536_1 to 536_7 are formed in the sixth wiring tier. Conductive layers 537_1 to 537_8 are formed in the seventh wiring tier. The conductive layers 537_1, 537_3, 537_4, 537_5, 537_6, 537_7, and 537_8 have portions that serve as terminals SL, RWL, RBL, WWL, WBL, CN, and BN, respectively.

The transistor MW0 has a structure similar to that of the transistor 600 illustrated in FIGS. 9A to 9D, and has an s-channel structure. A semiconductor of the transistor MW0 consists of three oxide semiconductor layers 540_1 to 540_3. The oxide semiconductor layers 540_1 to 540_3 each contain an In—Ga—Zn oxide deposited by a sputtering method. The atomic ratios (In:Ga:Zn) of sputtering targets are 1:3:4 for the oxide semiconductor layer 540_1, 1:1:1 for the oxide semiconductor layer 540_2, and 1:3:2 for the oxide semiconductor layer 540_3.

The capacitor CS1 is an MIM capacitor and is formed of the conductive layer 534_2, the oxide semiconductor layer 540_3, the insulating layer 507, and the conductive layer 535_2. The conductive layer 534_2 includes the node FN.

The conductive layers 534_1 and 534_2 are each formed of a stack including 10-nm-thick titanium nitride and 30-nm-thick tungsten. The conductive layers 535_1 and 535_2 are each formed using 30-nm-thick tungsten. The conductive layer 535_2 is connected to a conductive layer (not illustrated) in the sixth wiring tier. The conductive layer 537_2 is also connected to the conductive layer. With this wiring structure, the capacitor CS1 is electrically connected to a gate electrode of the transistor MR1.

The insulating layer 507 is formed using 10-nm-thick silicon oxynitride. The insulating layers 505 and 508 are each aluminum oxide deposited by a sputtering method to exhibit a blocking effect against oxygen, hydrogen, water, and the like. The thickness of the insulating layer 505 is 50 nm and the thickness of the insulating layer 508 is 50 nm.

The conductive layer 533_5 is provided so as to overlap with a channel of the transistor MW0, and the conductive layer 533_5 can serve as a back gate. In the prototyped chip, the insulating layers 504 and 505 are made so thick that the conductive layer 533_5 does not serve as a back gate electrode. The insulating layer 504 is formed using 600-nm-thick silicon oxide, and the insulating layer 505 is formed using 300-nm-thick silicon oxynitride. The conductive layer 533_5 is electrically connected to the conductive layer 537_8 by conductive layers (not illustrated) in the fifth and sixth wiring tiers.

<<Measurement of Off-state Current of Transistor MW0>>

An off-state current of the transistor MW0 was measured using the measurement method shown in FIG. 2. Here, the off-state current of the transistor MW0 at a temperature of 85° C. was measured.

<Step 1>

In the circuit MC10, a potential of the terminal RBL was changed while the transistors MW0 and MR2 were on to measure a current $I_{RBL}$. Since the potential $V_{FN}$ of the node FN was equal to the potential of the terminal RBL, data on the correspondence between the potential $V_{FN}$ and the current $I_{RBL}$ was acquired.

During the measurement, 3 V was applied to the terminal WWL, 1.1 V was applied to the terminal RBL, and 0 V (ground potential) was applied to the terminals SL, CN, and BN. In addition, potentials were applied to the terminal WBL in increments of 0.1 V from 0 V to 1 V.

<Steps 2 to 4: Retention Test of Circuit MC10>

During writing operation, 1.1 V was applied to the terminal WBL, 1.8 V was applied to the terminal RWL, 1.1 V was applied to the terminal RBL, and 0 V (ground potential) was applied to the terminals SL, CN, and BN. After that, 3 V was applied to the terminal WWL (Step 2). After 3 V was applied to the terminal WWL for a certain period, −1 V was applied to the terminal WWL to make a data retention state (Step 3). Then, the current $I_{RBL}$ of the circuit MC10 in the data retention state was measured (Step 4). In this manner, a graph showing a change in the current $I_{RBL}$ over data retention time (measuring time) was produced.

<Step 5: Results of Retention Test>

Figure 32:
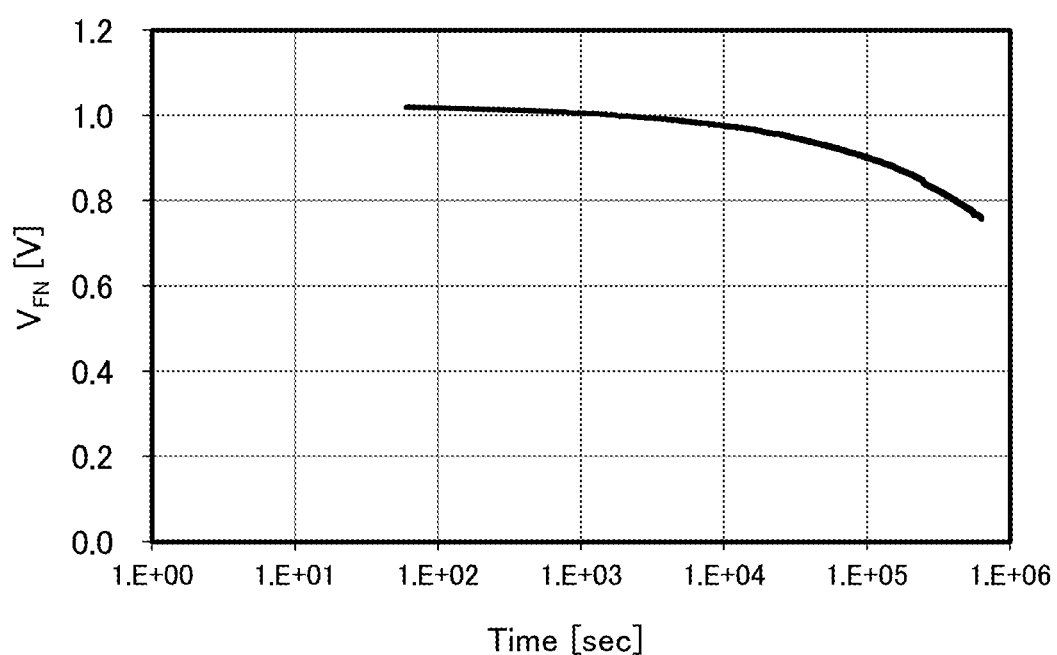
FIG. 32 is a graph showing a change in potential $V_{FN}$ of a retention node of a prototyped circuit over time.

With the use of the data on the correspondence between the current $I_{RBL}$ and the potential $V_{FN}$, which was acquired in Step 1, the current $I_{RBL}$ measured in Step 4 was converted into the potential $V_{FN}$. In this manner, a graph showing a change in the potential $V_{FN}$ over the data retention time (measuring time) was produced. FIG. 32 shows the graph. Note that here, the potential $V_{FN}$ converted from the measured current $I_{RBL}$ is used as a measured value.

FIG. 32 shows the results of a retention test of the circuit MC10 at a temperature of 85° C. The lateral axis of FIG. 32 is a logarithmic axis that represents the data retention time (measuring time). The longitudinal axis of FIG. 32 represents the potential $V_{FN}$ of the node FN.

In data retention time of 612,000 seconds (17 hours), the potential $V_{FN}$ dropped from 1.1 V to 0.75 V. It is assumed here that the drop in the potential $V_{FN}$ is only caused by an off-state current $I_{OFF}$ of the transistor MW0. Note that $I_{OFF}$ can be expressed by a charge amount $Q_S$ of the capacitor CS1 over time, and $I_{OFF}=dQ_{S1}/dt=C_{S1} \times dV_{FN}/dt$ is satisfied, where $C_{S1}$ represents the capacitance of the capacitor CS1. The value of $I_{OFF}$ calculated using this function is 3.519 zA ($3.519 \times 10^{-21}$ A).

<Step 6: Determination of Parameters of Stretched Exponential Function Describing $V_{FN}$>

Figure 33:
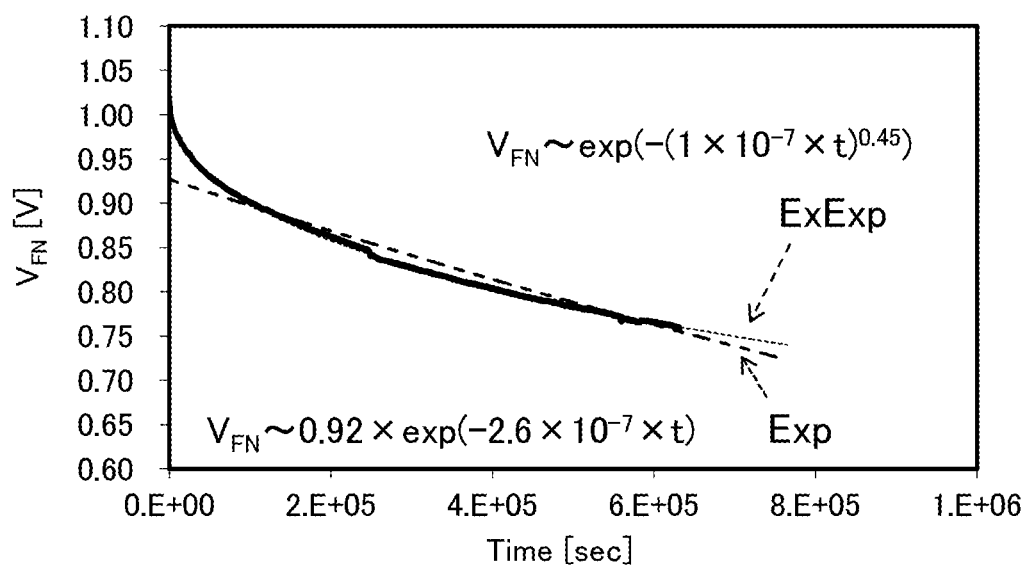
FIG. 33 is a graph showing a stretched exponential function and an exponential function each describing a potential $V_{FN}$.

To determine parameters of the stretched exponential function represented by Formula (1), the stretched exponential function represented by Formula (1) was fitted to the graph of the data retention test produced in Step 5. In addition, for comparison, an exponential function was fitted to the graph of FIG. 32. FIG. 33 shows the results. A solid line indicates the measured data shown in FIG. 32, and two dotted lines are obtained by fitting the stretched exponential function and the exponential function to the graph showing the measured data. The dotted line denoted by "ExExp" in the graph is obtained using the stretched exponential function, and the dotted line denoted by "Exp" in the graph is obtained using the exponential function. In FIG. 33, the lateral axis of FIG. 32 is converted into a linear axis. Parameters determined by fitting were as follows: $\tau=1 \times 10^7$, $\alpha=1$, and $\beta=0.45$ in the case of the stretched exponential function, and $\tau=2.6 \times 10^7$ and $\alpha=0.92$ in the case of the exponential function. This indicates that fitting to the measured data was performed more accurately using the stretched exponential function than using the exponential function.

<Step 7: Calculation of Stretched Exponential Function Describing $I_{OFF}$>

Figure 34:
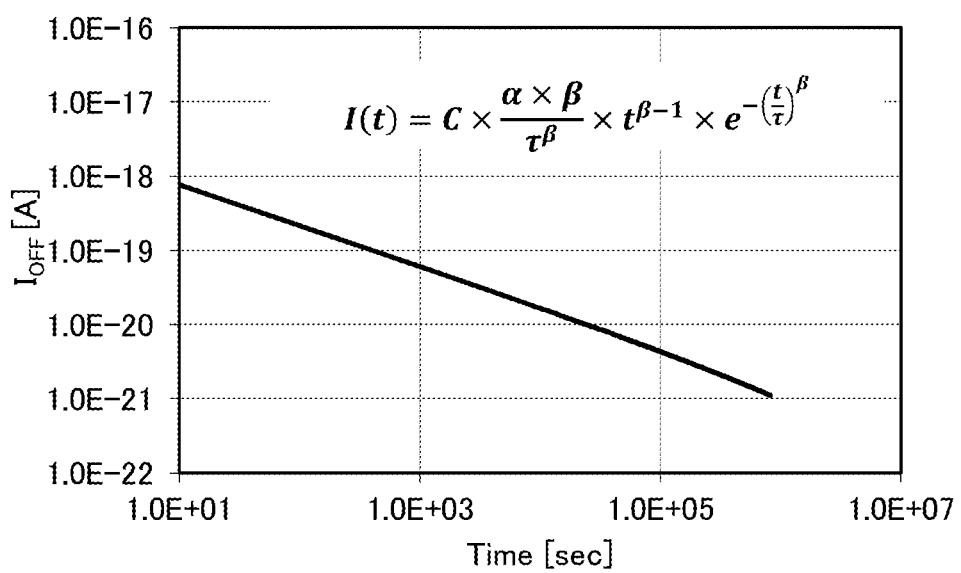
FIG. 34 is a graph showing a stretched exponential function describing an off-state current of a transistor.

As described in Embodiment 1, the off-state current $I_{OFF}$ can be calculated by substituting the parameters of the stretched exponential function determined by fitting of $V_{FN}$ into Formula (4). FIG. 34 shows the off-state current $I_{OFF}$ calculated using the stretched exponential function in FIG.

33. Parameters τ, α, and β are the same in FIG. 33 and FIG. 34. At data retention time of 612,000 seconds (17 hours), the off-state current $I_{OFF}$ is less than $1\times10^{-20}$ A, which is around 1 zA.

<<Examination of Retention Characteristics of Circuit MC10 Using Stretched Exponential Function>>

In the case where threshold voltage at the end of data retention lifetime is 0.4 V in FIG. 33, that is, in the case where the minimum $V_{FN}$ is 0.4 V, the data retention lifetime of the circuit MC10 calculated using the stretched exponential function is approximately 100 days.

Figure 35:
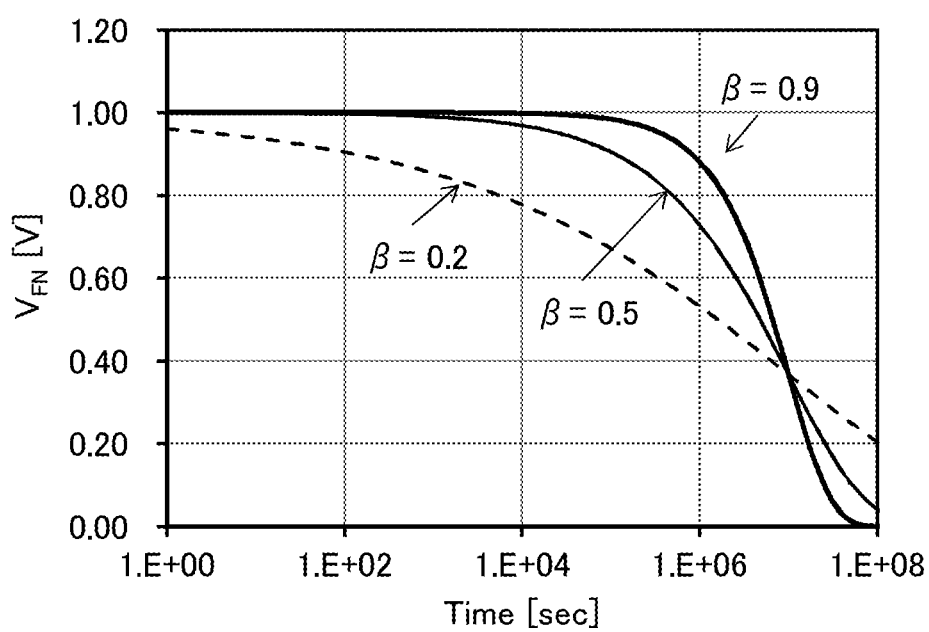
FIG. 35 is a graph showing parameter dependence of a stretched exponential function describing a potential $V_{FN}$.

FIG. 35 shows the dependence of $V_{FN}$ described by the stretched exponential function on the parameter β. The parameters τ and α in the stretched exponential functions in FIG. 35 are determined using the measured value in FIG. 33.

In the circuit MC10, the extension of the data retention lifetime depends on how much drop in $V_{FN}$ can be prevented. FIG. 35 shows that not only relaxation time τ of the off-state current of the transistor MW0 but also β, which represents the variation in the relaxation time τ, are parameters important for data retention lifetime. Note that $0 < \beta \leq 1$ is satisfied from the properties of β. FIG. 35 shows that, β is preferably as close to 1 as possible in order that the circuit MC10 can retain multilevel digital data or analog data with reduced errors. For example, β is preferably greater than or equal to 0.8 and less than or equal to 1, or greater than or equal to 0.9 and less than or equal to 1.

FIG. 34 shows that, in the case where the off-state current is the only factor of the drop in $V_{FN}$, the off-state current $I_{OFF}$ of the transistor MW0 becomes lower as the data retention time becomes longer.

Since $t \ll \tau$ is satisfied, $I_{OFF}$ can be represented by Formula (14), which is given by Formula (4).

[Formula 16]

$$I_{OFF}(t) = C_S \times \frac{\alpha \times \beta}{\tau^\beta} \times t^{\beta-1} \quad (14)$$

Figure 36:
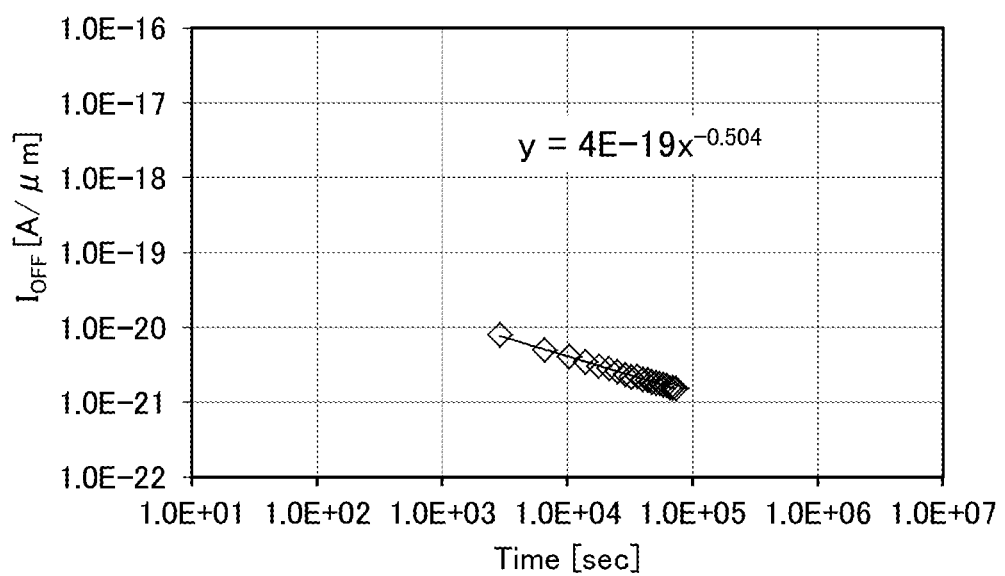
FIG. 36 is a graph showing measured values of an off-state current of a transistor and an approximate straight line.

Note that $C_S$, τ, α, and β in Formula (14) are constants; as a result, $I_{OFF}$ can be represented by the power function $y = A \cdot x^B$ (A and B are constants). FIG. 36 shows values of actually measured leakage currents of the OS transistor at a temperature of 125° C., and an approximate straight line determined by the least-squares method. The off-state currents shown in FIG. 36 are normalized by the channel width. The channel length L and the channel width W of the OS transistor were 0.8 μm and 10 cm, respectively.

To actually measure the off-state current of the OS transistor, the off-state current needs to be high enough to be measured by a measurement apparatus. An off-state current of a transistor whose channel width is as long as several centimeters, which is very long, can be actually measured. However, it is not realistic for a data retention circuit, such as the prototyped circuit MC10, to include such a transistor whose channel width is several centimeters to produce a high off-state current.

According to the above, this example indicates that the method shown in FIG. 2, with which an off-state current is measured using the stretched exponential function obtained from the measured values, is highly suitable for measurement of an off-state current of a minute transistor. The channel length of a transistor subjected to the measurement is preferably smaller than 70 nm, and may be smaller than 60 nm or smaller than 50 nm. Note that the channel length is longer than or equal to 5 nm, or longer than or equal to 10 nm.

The channel width of a transistor subjected to the measurement is preferably smaller than 70 nm, and may be smaller than 60 nm or smaller than 50 nm. Note that the channel width is longer than or equal to 5 nm, or longer than or equal to 10 nm.

This example also indicates that the measurement method shown in FIG. 2 can be used to estimate an off-state current of a transistor several months to several years ahead, which is longer than a period during which retention characteristics are measured in Step 4. This means that the characteristic evaluation method of one embodiment of the present invention can be used to estimate long-term charge retention characteristics. One embodiment of the present invention is very effective in reducing inspection time of a semiconductor device and improving the reliability of the semiconductor device.

EXAMPLE 2

Figure 37A:
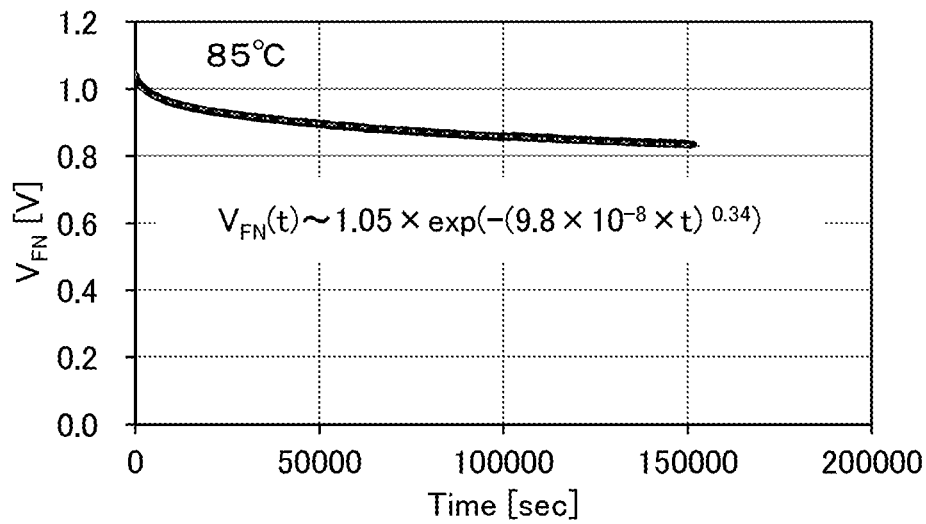
FIGS. 37A to 37C are graphs each showing temperature dependence of a stretched exponential function describing a potential $V_{FN}$.
Figure 37B:
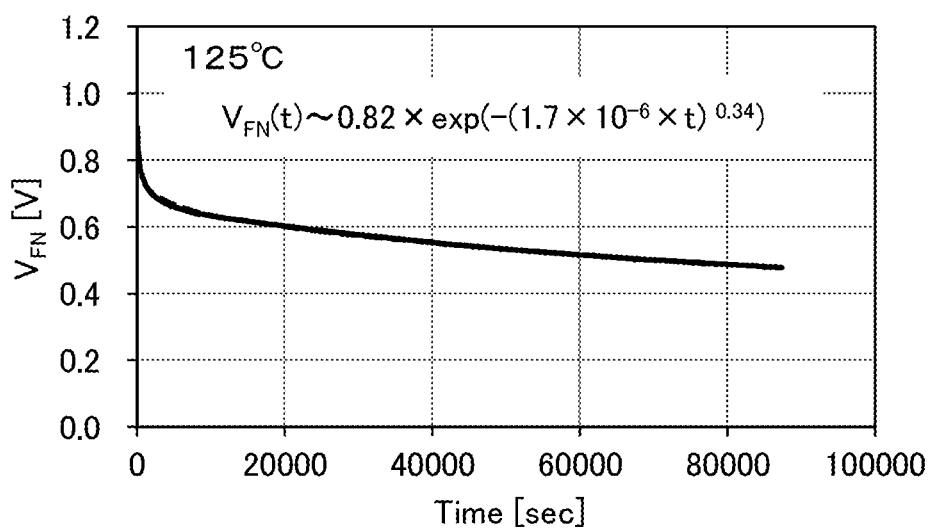
Figure 37C:
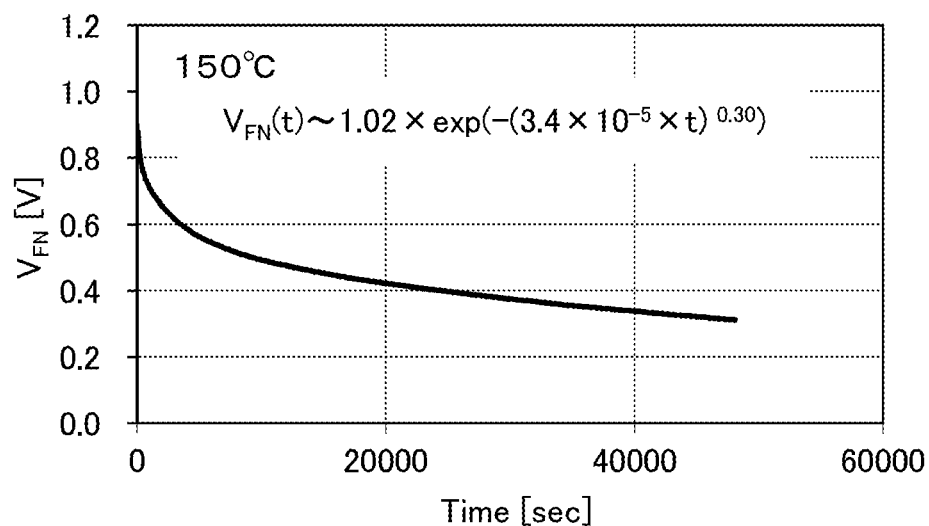
Figure 38A:
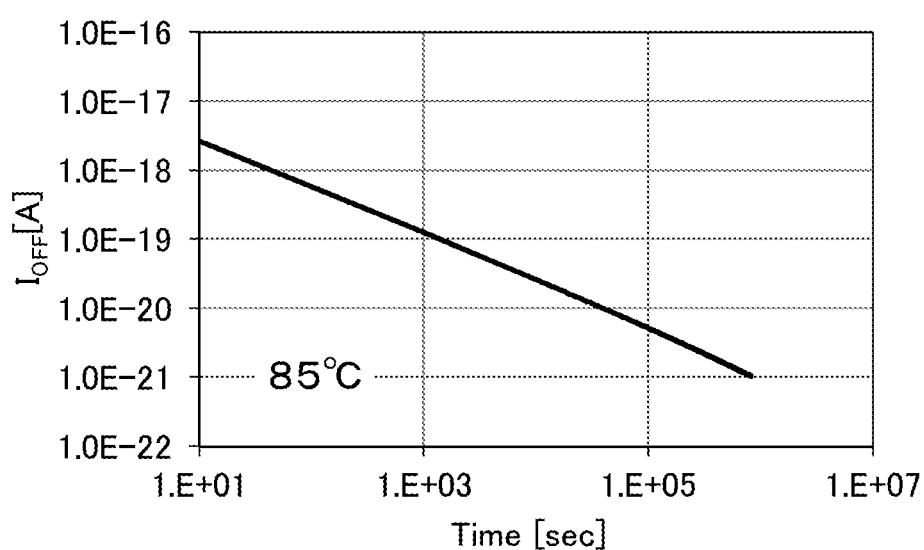
FIGS. 38A to 38C are graphs each showing temperature dependence of a stretched exponential function describing an off-state current.
Figure 38B:
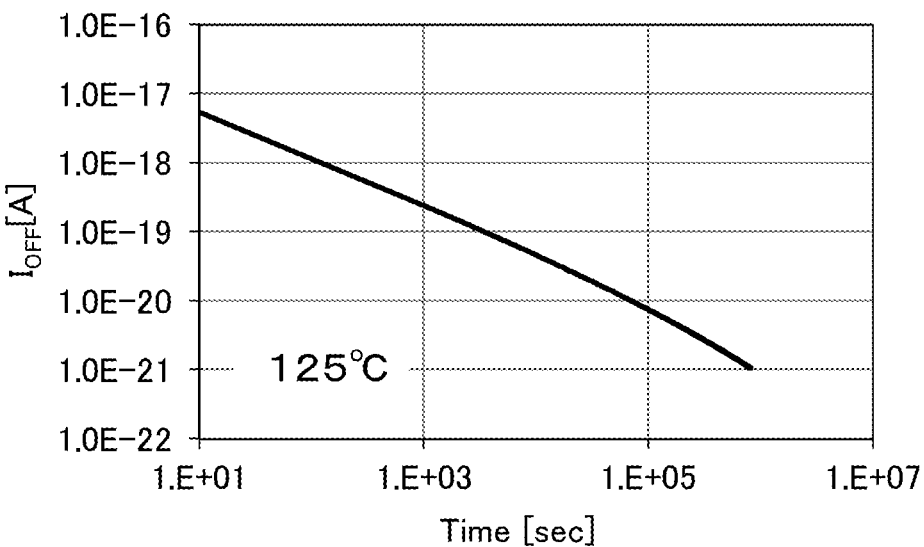
Figure 38C:
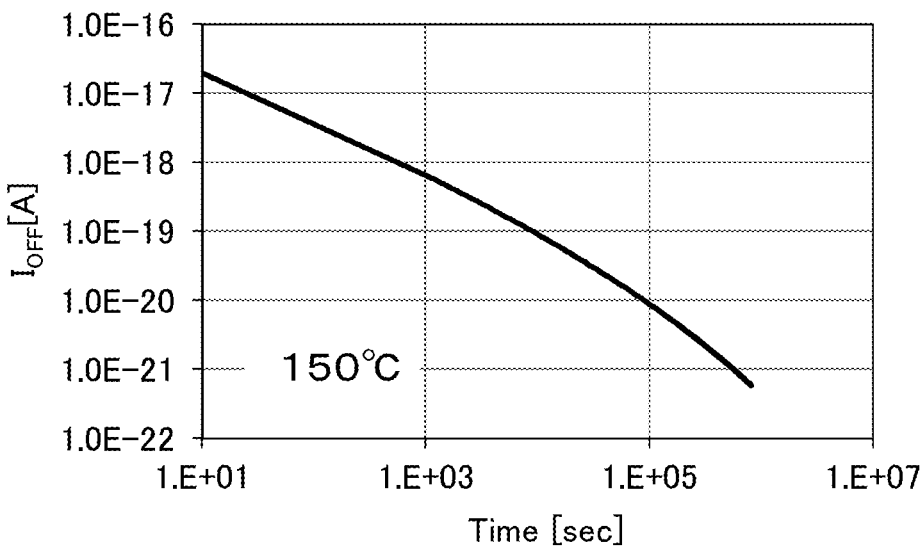

In this example, temperature dependence of the potential $V_{FN}$ of the retention node FN and the off-state current $I_{OFF}$ of the transistor MW0 in the circuit MC10 is described. Measured values of the potential $V_{FN}$ at 85° C., 125° C., and 150° C. were obtained by a measurement method similar to that in Example 1. The stretched exponential function describing the potential $V_{FN}$ was calculated from the measured values of the potential $V_{FN}$ at each temperature, and then, the off-state current $I_{OFF}$ was calculated. FIGS. 37A to 37C show the measured potentials $V_{FN}$ at 85° C., 125° C., and 150° C. and the stretched exponential functions. Note that the stretched exponential functions are indicated by dotted lines in FIGS. 37A to 37C; however, they are hardly seen because they overlap with lines indicating the measured values. FIGS. 38A to 38C show the off-state currents $I_{OFF}$ at 85° C., 125° C., and 150° C.

As shown in FIGS. 38A to 38C, the off-state current $I_{OFF}$ of the transistor MW0 at 85° C., 125° C., and 150° C. at measuring time of $1\times10^5$ s is less than $1\times10^{-20}$ A. Specifically, the off-state current $I_{OFF}$ at 85° C., 125° C., and 150° C. are $5.1\times10^{-21}$ A, $7.4\times10^{-21}$ A, and $8.7\times10^{-21}$ A, respectively.

Figure 39A:
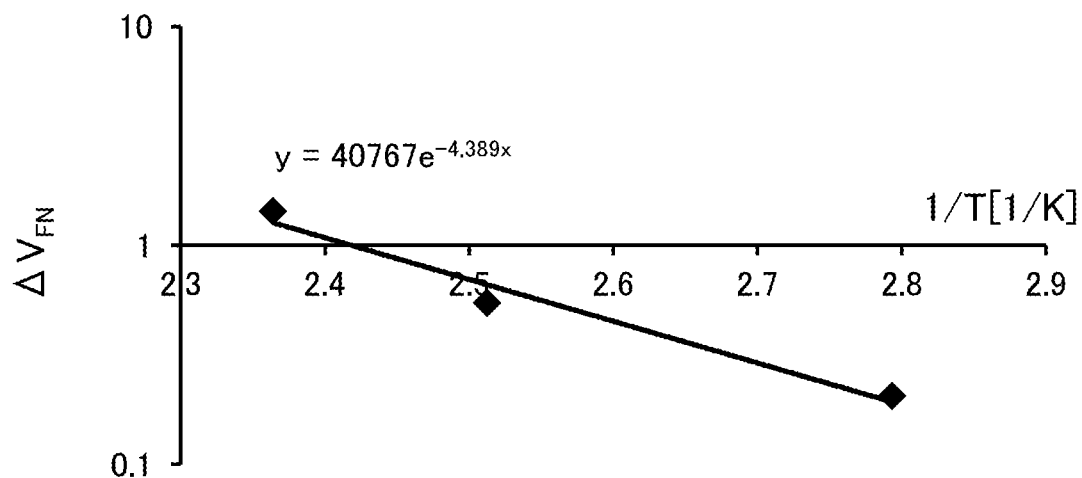
FIGS. 39A and 39B are graphs showing regression lines of the stretched exponential functions in FIGS. 37A to 37C and FIGS. 38A to 38C.

FIG. 39A shows a regression line obtained by plotting $\Delta V_{FN\,at}$ 85° C., 125° C., and 150° C. in FIGS. 37A to 37C. Note that $\Delta V_{FN}$ represents the absolute value of the difference between $V_{FN}$ in the initial state (the measuring time is 0 s) and $V_{FN}$ at measuring time of $1\times10^5$ s.

Figure 39B:
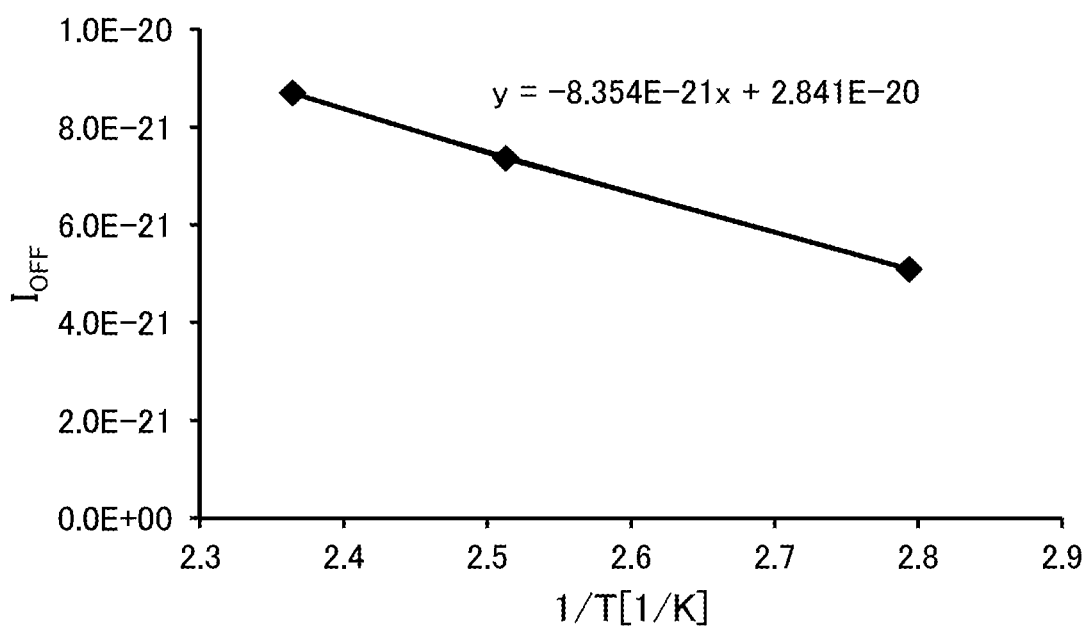

FIG. 39B shows a regression line obtained by plotting the off-state currents $I_{OFF}$ at 85° C., 125° C., and 150° C. (the measuring time is $1\times10^5$ s) in FIGS. 38A to 38C. The off-state current $I_{OFF}$ at a temperature lower than 85° C. can be estimated by extrapolation of the regression line in FIG. 39B. The off-state currents $I_{OFF}$ at 60° C. and 27° C. at measuring time of $1\times10^5$ s are $3.3\times10^{-21}$ A and $5.6\times10^{-22}$ A, respectively, for example.

This example indicates that the off-state current $I_{OFF}$ of the transistor MW0 described by the stretched exponential function is extremely low either at room temperature (27° C.) or at high temperatures, and the off-state current $I_{OFF}$ at measuring time of $1\times10^5$ s is less than $1\times10^{-20}$ A. This example also indicates that the off-state current $I_{OFF}$ at room temperature is less than $1\times10^{-21}$ A.

This application is based on Japanese Patent Application serial no. 2014-170756 filed with Japan Patent Office on Aug. 25, 2014 and Japanese Patent Application serial no.

2014-170757 filed with Japan Patent Office on Aug. 25, 2014, the entire contents of which are hereby incorporated by reference.

What is claimed is:

1. A semiconductor device comprising:
   a first transistor comprising:
      a first gate;
      a first gate insulating film over the first gate;
      a first oxide semiconductor layer over the first gate insulating film, the first oxide semiconductor layer including a channel formation region overlapping with the first gate, wherein a width of the channel formation region is smaller than 70 nm;
      a first conductive film and a second conductive film each over and in contact with a first region and a second region of a top surface of the first oxide semiconductor layer;
      a second oxide semiconductor layer over and in contact with a top surface and side surfaces of each of the first conductive film and the second conductive film, and a third region of the top surface and side surfaces of the first oxide semiconductor layer;
      a second gate insulating film over the second oxide semiconductor layer; and
      a second gate over the second gate insulating film, the second gate overlapping with the channel formation region,
   wherein a temporal change of off-state current of the first transistor is represented by Formula (a2):

$$I_{OFF}(t) = C_S \times \frac{\alpha \times \beta}{\tau^\beta} \times t^{\beta-1} \times e^{-\left(\frac{t}{\tau}\right)^\beta} \quad (a2)$$

wherein $I_{OFF}$ represents the off-state current, t represents time during which the first transistor is off, $\alpha$ and $\tau$ are constants, $\beta$ is a constant that satisfies $0<\beta\leq1$, and $C_S$ is a constant that represents load capacitance of a source or a drain of the first transistor.

2. The semiconductor device according to claim 1, wherein the off-state current at room temperature is less than $1\times10^{-20}$ A when t is $1\times10^5$ seconds.

3. The semiconductor device according to claim 1, wherein each of the first and second oxide semiconductor layers comprises indium, gallium, and zinc.

4. A semiconductor device comprising:
   a first transistor comprising:
      a first gate;
      a first gate insulating film over the first gate;
      a first oxide semiconductor layer over the first gate insulating film, the first oxide semiconductor layer including a channel formation region overlapping with the first gate, wherein a width of the channel formation region is smaller than 70 nm;
      a first conductive film and a second conductive film each over and in contact with a first region and second region of a top surface of the first oxide semiconductor layer;
      a second oxide semiconductor layer over and in contact with a top surface and side surfaces of each of the first conductive film and the second conductive film, and a third region of the top surface and side surfaces of the first oxide semiconductor layer;
      a second gate insulating film over the second oxide semiconductor layer, the first conductive film, and the second conductive film; and
      a second gate over the second gate insulating film, the second gate overlapping with the channel formation region; and
   a capacitor having a terminal electrically connected to one of the first conductive film and the second conductive film of the first transistor,
   wherein a temporal change of off-state current of the first transistor is represented by Formula (a2):

$$I_{OFF}(t) = C_S \times \frac{\alpha \times \beta}{\tau^\beta} \times t^{\beta-1} \times e^{-\left(\frac{t}{\tau}\right)^\beta} \quad (a2)$$

wherein $I_{OFF}$ represents the off-state current, t represents time during which the first transistor is off, $\alpha$ and $\tau$ are constants, $\beta$ is a constant that satisfies $0<\beta\leq1$, and $C_S$ is a constant that represents capacitance of the capacitor.

5. The semiconductor device according to claim 4, wherein the off-state current at room temperature is less than $1\times10^{-20}$ A when t is $1\times10^5$ seconds.

6. The semiconductor device according to claim 4, wherein each of the first and second oxide semiconductor layers comprises indium, gallium, and zinc.

7. The semiconductor device according to claim 1, wherein the first transistor is included in a characteristic evaluation circuit.

8. The semiconductor device according to claim 4, wherein the first transistor and the capacitor are included in a characteristic evaluation circuit.

9. The semiconductor device according to claim 1,
   wherein the first oxide semiconductor layer has a first layer and a second layer provided on the first layer,
   wherein each the first layer and the second layer comprises indium, gallium, and zinc, and
   wherein an atomic ratio of the first layer is different from an atomic ratio of the second layer.

10. The semiconductor device according to claim 1, wherein an end of the second gate insulating film is aligned with an end of the second oxide semiconductor layer.

11. The semiconductor device according to claim 4,
    wherein the first oxide semiconductor layer has a first layer and a second layer provided on the first layer,
    wherein each the first layer and the second layer comprises indium, gallium, and zinc, and
    wherein an atomic ratio of the first layer is different from an atomic ratio of the second layer.

12. The semiconductor device according to claim 4, wherein an end of the second gate insulating film is aligned with an end of the second oxide semiconductor layer.

13. The semiconductor device according to claim 4, further comprising a second transistor electrically connected to the first transistor and the capacitor.

* * * * *